United States Patent
Hosoda et al.

(10) Patent No.: US 11,417,621 B2
(45) Date of Patent: *Aug. 16, 2022

(54) MEMORY DIE WITH SOURCE SIDE OF THREE-DIMENSIONAL MEMORY ARRAY BONDED TO LOGIC DIE AND METHODS OF MAKING THE SAME

(71) Applicant: SANDISK TECHNOLOGIES LLC, Addison, TX (US)

(72) Inventors: Naohiro Hosoda, Yokkaichi (JP); Masanori Tsutsumi, Yokkaichi (JP); Sayako Nagamine, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/113,293

(22) Filed: Dec. 7, 2020

(65) Prior Publication Data
US 2022/0181283 A1  Jun. 9, 2022

(51) Int. Cl.
*H01L 25/065* (2006.01)
*H01L 25/18* (2006.01)
(Continued)

(52) U.S. Cl.
CPC .......... *H01L 24/08* (2013.01); *H01L 23/5226* (2013.01); *H01L 24/80* (2013.01);
(Continued)

(58) Field of Classification Search
CPC ..... H01L 24/08; H01L 23/5226; H01L 24/80; H01L 25/0657; H01L 25/50;
(Continued)

(56) References Cited

U.S. PATENT DOCUMENTS 9,530,790 B1   12/2016  Lu et al.
9,935,050 B2   4/2018   Dunga et al.
(Continued)

OTHER PUBLICATIONS

Lue, H.T. et al., "A 128Gb (MLC)/192Gb (TLC) single-gate vertical channel (SGVC) architecture 3D NAND using only 16 layers with robust read disturb, long-retention and excellent scaling capability," *2017 IEEE International Electron Devices Meeting (IEDM)*, San Francisco, CA, 2017, pp. 19.1.1-19.1.4, doi: 10.1109/IEDM.2017.8268419.

(Continued)

*Primary Examiner* — Thanh Y. Tran
(74) *Attorney, Agent, or Firm* — The Marbury Law Group PLLC

(57) ABSTRACT

A memory die includes an alternating stack of insulating layers and electrically conductive layers located between a drain-side dielectric layer and a source-side dielectric layer. Memory openings vertically extend through the alternating stack. Each of the memory openings has a greater lateral dimension an interface with the source-side dielectric layer than at an interface with the drain-side dielectric layer. Memory opening fill structures are located in the memory openings. Each of the memory opening fill structures includes a vertical semiconductor channel, a vertical stack of memory elements, and a drain region. A logic die may be bonded to a source-side dielectric layer side of the memory die.

15 Claims, 59 Drawing Sheets

(51) Int. Cl.
    *H01L 23/00*     (2006.01)
    *H01L 25/00*     (2006.01)
    *H01L 23/522*     (2006.01)
    *H01L 27/11582*     (2017.01)
    *H01L 27/11556*     (2017.01)

(52) U.S. Cl.
    CPC .......... *H01L 25/0657* (2013.01); *H01L 25/18* (2013.01); *H01L 25/50* (2013.01); *H01L 27/11556* (2013.01); *H01L 27/11582* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
    CPC ......... H01L 27/11556; H01L 27/11582; H01L 2224/08145; H01L 2224/80895; H01L 2224/80896; H01L 2924/1431; H01L 2924/14511
    See application file for complete search history.

(56) References Cited

U.S. PATENT DOCUMENTS

| | | | |
|---|---|---|---|
| 10,256,252 B1* | 4/2019 | Kanazawa | ........ H01L 21/02164 |
| 10,629,616 B1 | 4/2020 | Kai et al. | |
| 10,665,581 B1 | 5/2020 | Zhou et al. | |
| 10,685,979 B1 | 6/2020 | Lu et al. | |
| 10,734,400 B1 | 8/2020 | Fukuo et al. | |
| 2015/0364487 A1 | 12/2015 | Yun | |
| 2017/0294377 A1 | 10/2017 | Dunga et al. | |
| 2018/0138193 A1 | 5/2018 | Zhang et al. | |
| 2019/0057974 A1 | 2/2019 | Lu et al. | |
| 2019/0198515 A1* | 6/2019 | Hosoda | ............ H01L 21/26513 |
| 2020/0235120 A1 | 7/2020 | Kai et al. | |
| 2020/0312859 A1 | 10/2020 | Otsu et al. | |
| 2020/0312863 A1 | 10/2020 | Iwai et al. | |

OTHER PUBLICATIONS

U.S. Appl. No. 16/231,752, filed Dec. 24, 2018, SanDisk Technologies LLC.
U.S. Appl. No. 16/249,423, filed Jan. 16, 2019, SanDisk Technologies LLC.
U.S. Appl. No. 16/539,103, filed Aug. 13, 2019, SanDisk Technologies LLC.
U.S. Appl. No. 16/539,124, filed Aug. 13, 2019, SanDisk Technologies LLC.
U.S. Appl. No. 16/936,047, filed Jul. 22, 2020, SanDisk Technologies LLC.
Notification of Transmittal of the International Search Report and the Written Opinion of the International Searching Authority for International Patent Application No. PCT/US2021/036564, dated Oct. 8, 2021, 10 pages.
USPTO Office Communication, Notice of Allowance and Fee(s) Due for U.S. Appl. No. 17/113,254, dated Dec. 15, 2021, 14 pages.

* cited by examiner

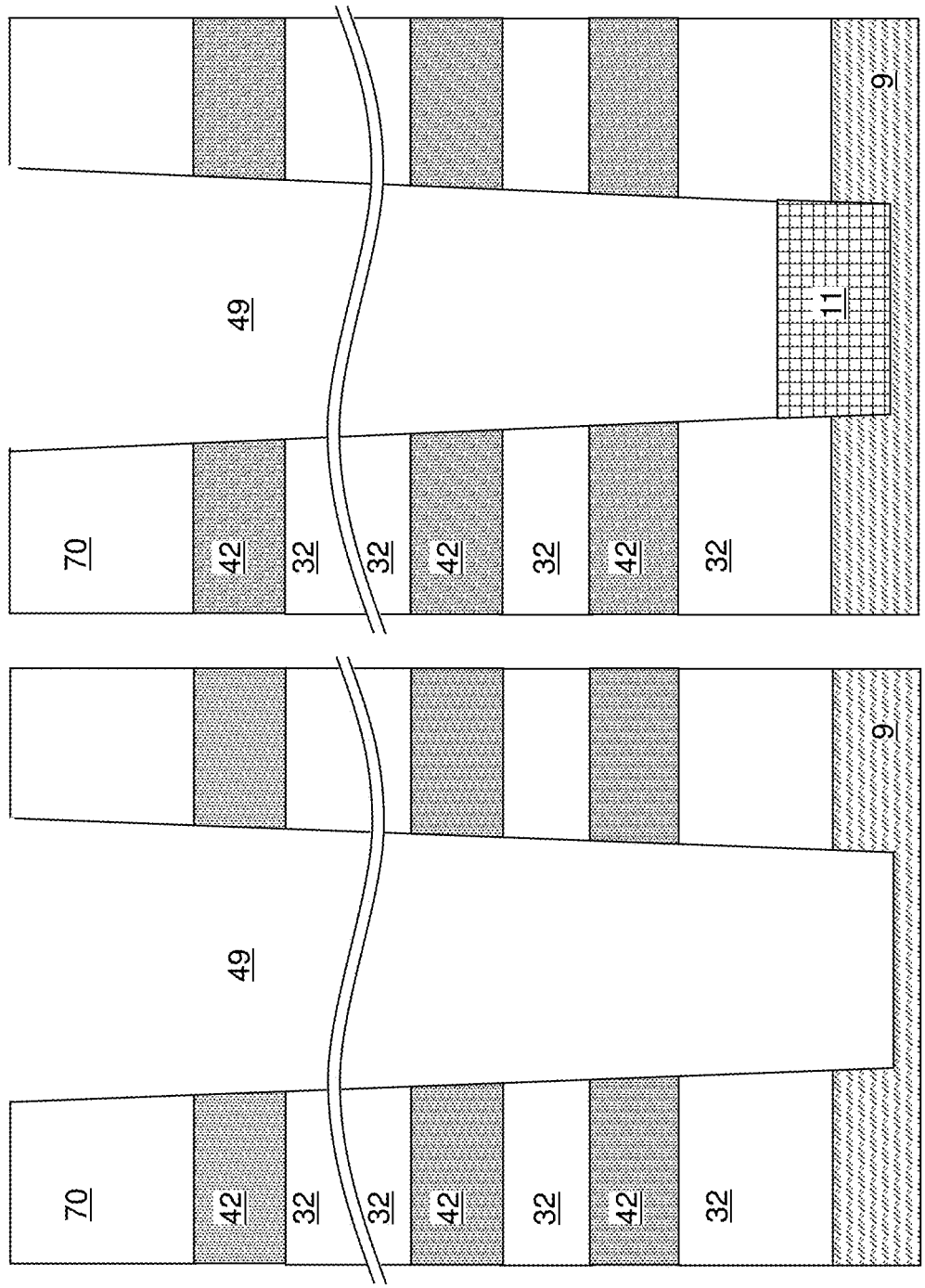

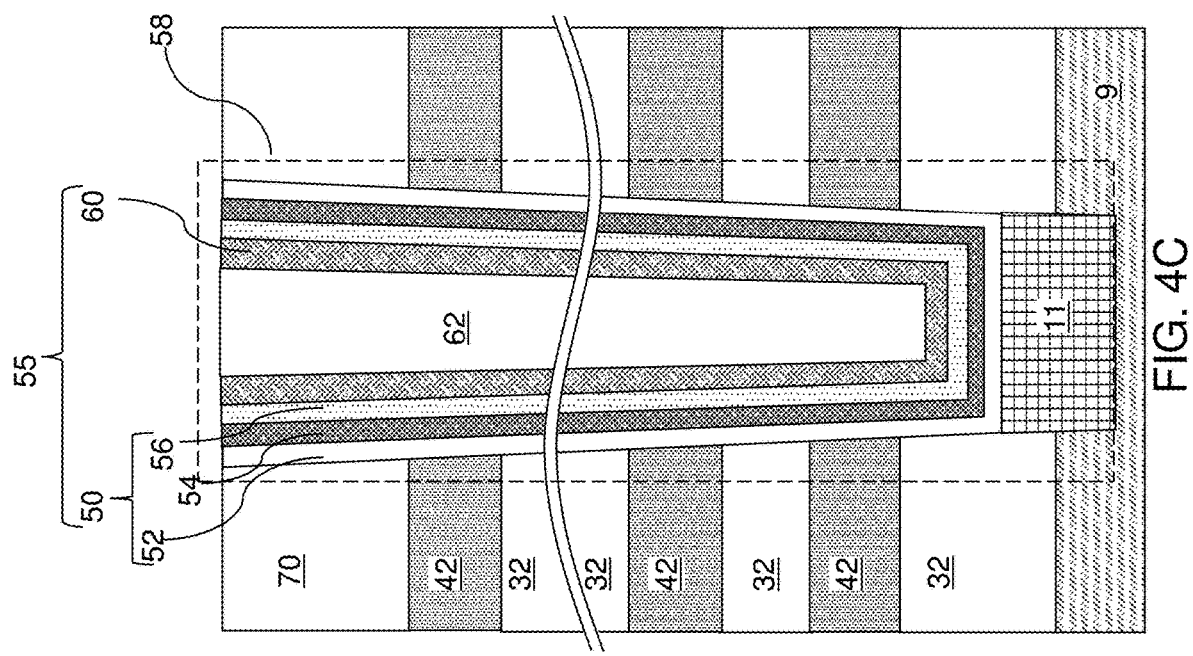

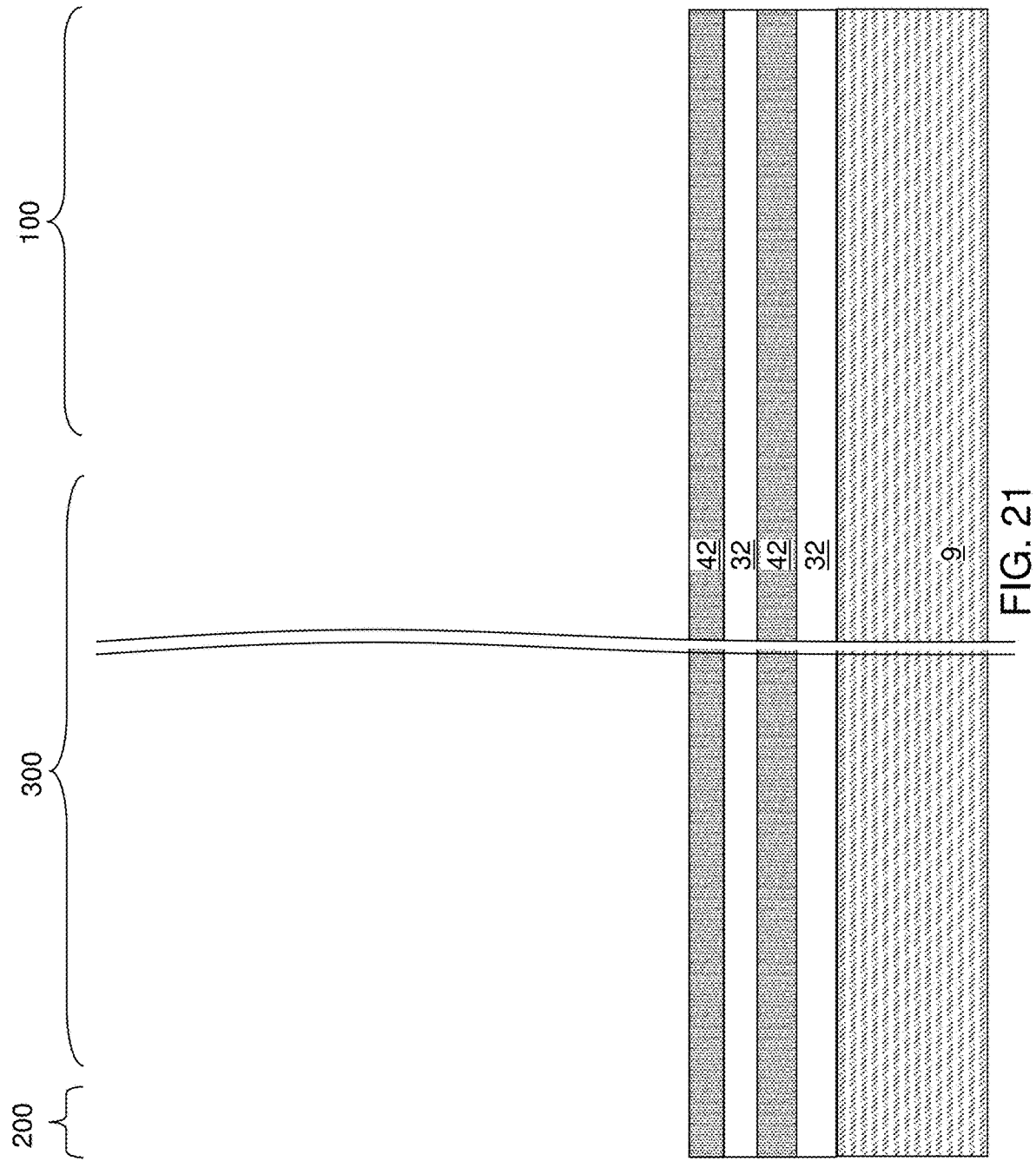

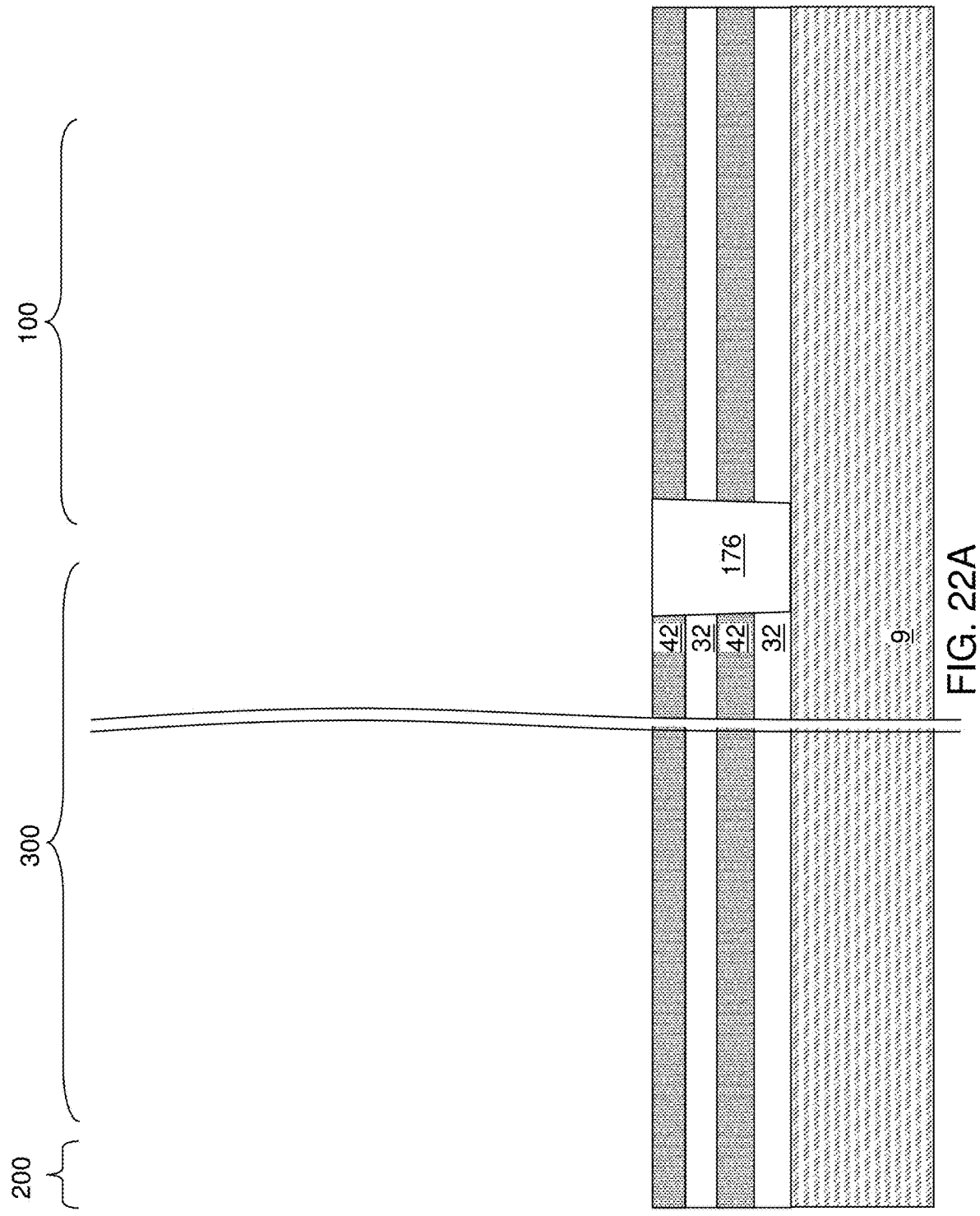

MEMORY DIE WITH SOURCE SIDE OF THREE-DIMENSIONAL MEMORY ARRAY BONDED TO LOGIC DIE AND METHODS OF MAKING THE SAME

FIELD

The present disclosure relates generally to the field of semiconductor devices, and particular to three-dimensional memory devices with source side bonded to logic die and methods of manufacturing the same.

BACKGROUND

A prior art three-dimensional NAND memory device includes a plurality of memory openings and a vertical semiconductor channel and a memory film in each memory opening. A vertical stack of word lines surrounds the memory openings.

SUMMARY

According to an aspect of the present disclosure, a three-dimensional memory device comprises a memory die. The memory die comprises an alternating stack of insulating layers and electrically conductive layers extending along a first horizontal direction and located between a drain-side dielectric layer and a source-side dielectric layer, memory openings vertically extending through the alternating stack, wherein each of the memory openings has a greater lateral dimension at an interface with the source-side dielectric layer than at an interface with the drain-side dielectric layer, memory opening fill structures located in the memory openings, wherein each of the memory opening fill structures comprises a vertical semiconductor channel, a vertical stack of memory elements located at levels of the electrically conductive layers, and a drain region contacting an end portion of the vertical semiconductor channel, and drain-select-level isolation structures laterally extending along the first horizontal direction, vertically extending through at least one electrically conductive layer of the electrically conductive layers, and contacting the drain-side dielectric layer.

According to an aspect of the present disclosure, a method of forming a semiconductor structure comprises forming an alternating stack of insulating layers and sacrificial material layers over a substrate, forming memory openings through the alternating stack, forming memory opening fill structures in the memory openings, wherein each of the memory opening fill structures comprises a memory film and a vertical semiconductor channel, replacing the sacrificial material layers with electrically conductive layers, forming a source layer contacting first end surfaces of the vertical semiconductor channels over the alternating stack, physically exposing second end surfaces of the vertical semiconductor channels by removing the substrate, wherein the second end surfaces are vertically recessed toward the source layer relative to a physically exposed surface of one of the insulating layers, and forming drain regions on the second end surfaces of the vertical semiconductor channels.

According to yet another aspect of the present disclosure, a three-dimensional memory device comprising a memory die is provided. The memory die comprises: an alternating stack of insulating layers and electrically conductive layers located between a drain-side dielectric layer and a source-side dielectric layer, wherein the electrically conductive layers comprise at least one drain side select gate electrode, at least one source side select gate electrode, and word lines located between the at least one drain side select gate electrode and the at least one source side select gate electrode; backside trench fill structures vertically extending through the word lines, laterally extending along a first horizontal direction, and laterally spaced apart along a second horizontal direction; backside dielectric rails vertically extending through the at least one drain side select gate electrode and contacting, and overlying or underlying, a respective one of the backside trench fill structures; memory openings vertically extending through the alternating stack between neighboring pairs of the backside trench fill structures and between neighboring pairs of the backside dielectric rails; and memory opening fill structures located in the memory openings, wherein each of the memory opening fill structures comprises a vertical semiconductor channel and a vertical stack of memory elements located at levels of the word-line-level electrically conductive layers.

According to still another aspect of the present disclosure, a method of forming a semiconductor structure is provided. The method comprises: forming a first layer stack including at least one first insulating layer and at least one first sacrificial material layer over a substrate; forming backside dielectric rails vertically extending through the at least one first insulating layer and the at least one sacrificial material layer; forming a second layer stack including second insulating layers and second sacrificial material layers over the first layer stack; forming memory openings through the second layer stack and the first layer stack; forming memory opening fill structures in the memory openings, wherein each of the memory opening fill structures comprises a memory film and a vertical semiconductor channel; replacing the second sacrificial material layers with word lines and at least one source side select gate electrode; removing the substrate selective to the first layer stack; and replacing the at least one first sacrificial material layer with at least one drain side select gate electrode.

BRIEF DESCRIPTION OF THE DRAWINGS

FIGS. 4A-4C are sequential vertical cross-sectional views of a memory opening during a memory opening fill structure according to the first embodiment of the present disclosure.

FIG. 21 is a schematic vertical cross-sectional view of a second exemplary structure after formation of a first layer stack including at least one first insulating layer and at least one second sacrificial material layer according to a second embodiment of the present disclosure.

FIG. 22A is a schematic vertical cross-sectional view of a second exemplary structure after formation of backside dielectric rails according to a second embodiment of the present disclosure.

DETAILED DESCRIPTION

Figure 1:
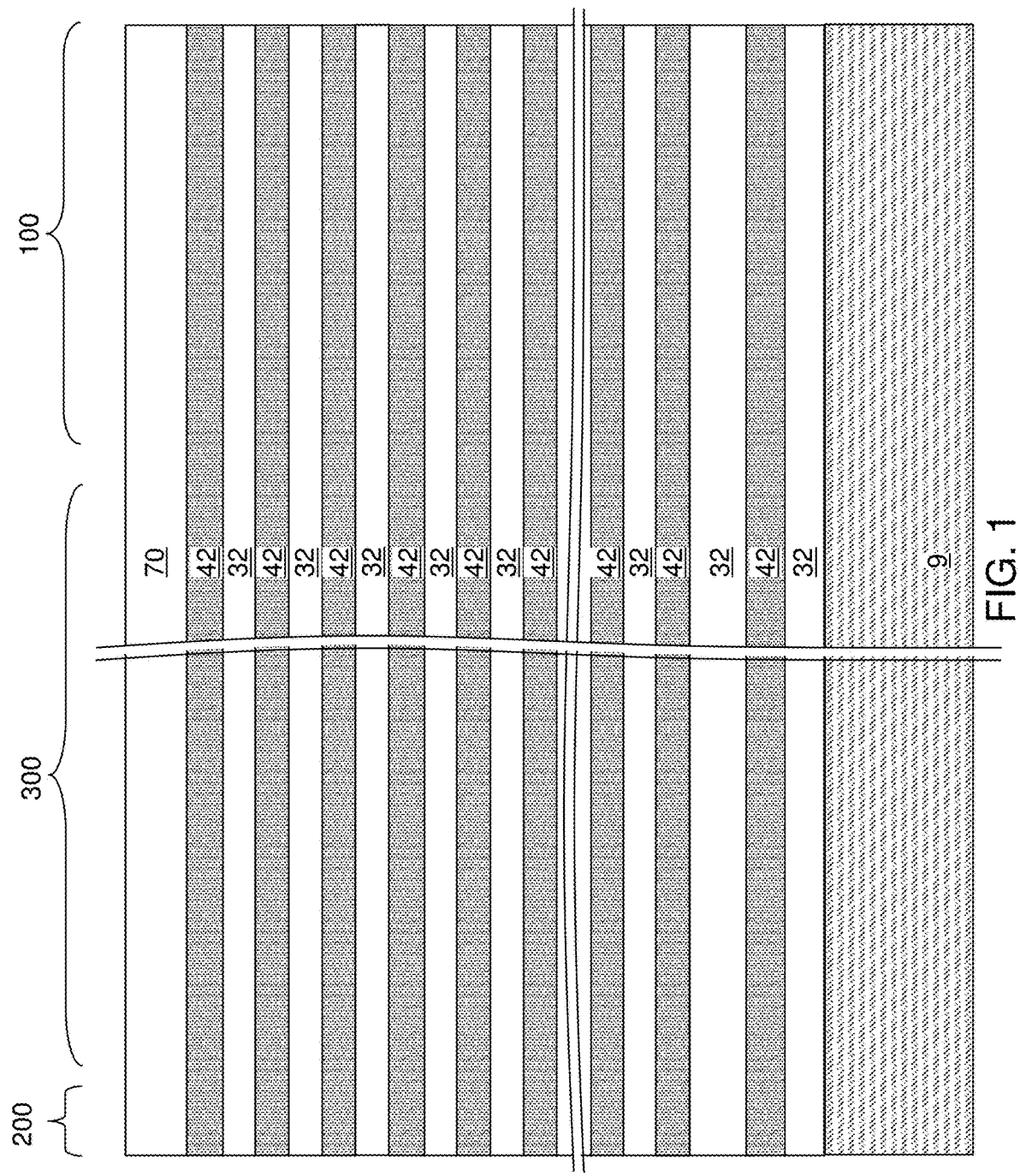
FIG. 1 is a schematic vertical cross-sectional view of a first exemplary structure after formation of insulating layers and sacrificial material layers according to a first embodiment of the present disclosure.

Embodiments of the present disclosure are directed to three-dimensional memory devices with source side bonded to logic die and methods of manufacturing the same, the various aspects of which are described below. The inverted configuration of embodiments of the memory devices provides a reduced memory opening size and reduced pitch between device elements, which provides a higher device density. The embodiments of the disclosure can be employed to form various structures including a multilevel memory structure, non-limiting examples of which include semiconductor devices such as three-dimensional memory devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from $1.0$ S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) is formed over the top surface of the substrate semiconductor layer 9. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIGS. 2A and 2B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate semiconductor layer 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3A:
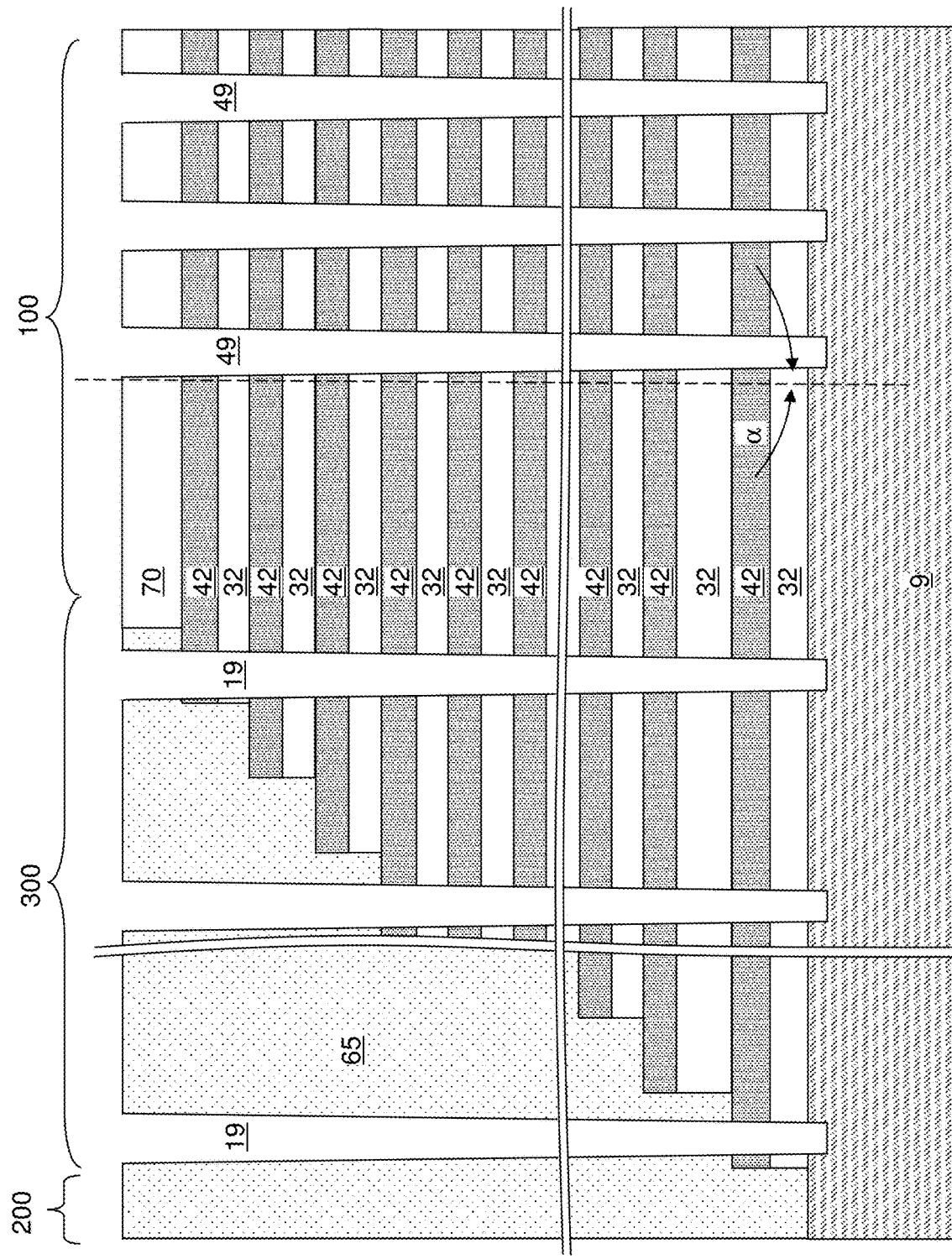
FIG. 3A is a schematic vertical cross-sectional view of the first exemplary structure after formation of memory openings according to the first embodiment of the present disclosure.
Figure 3B:
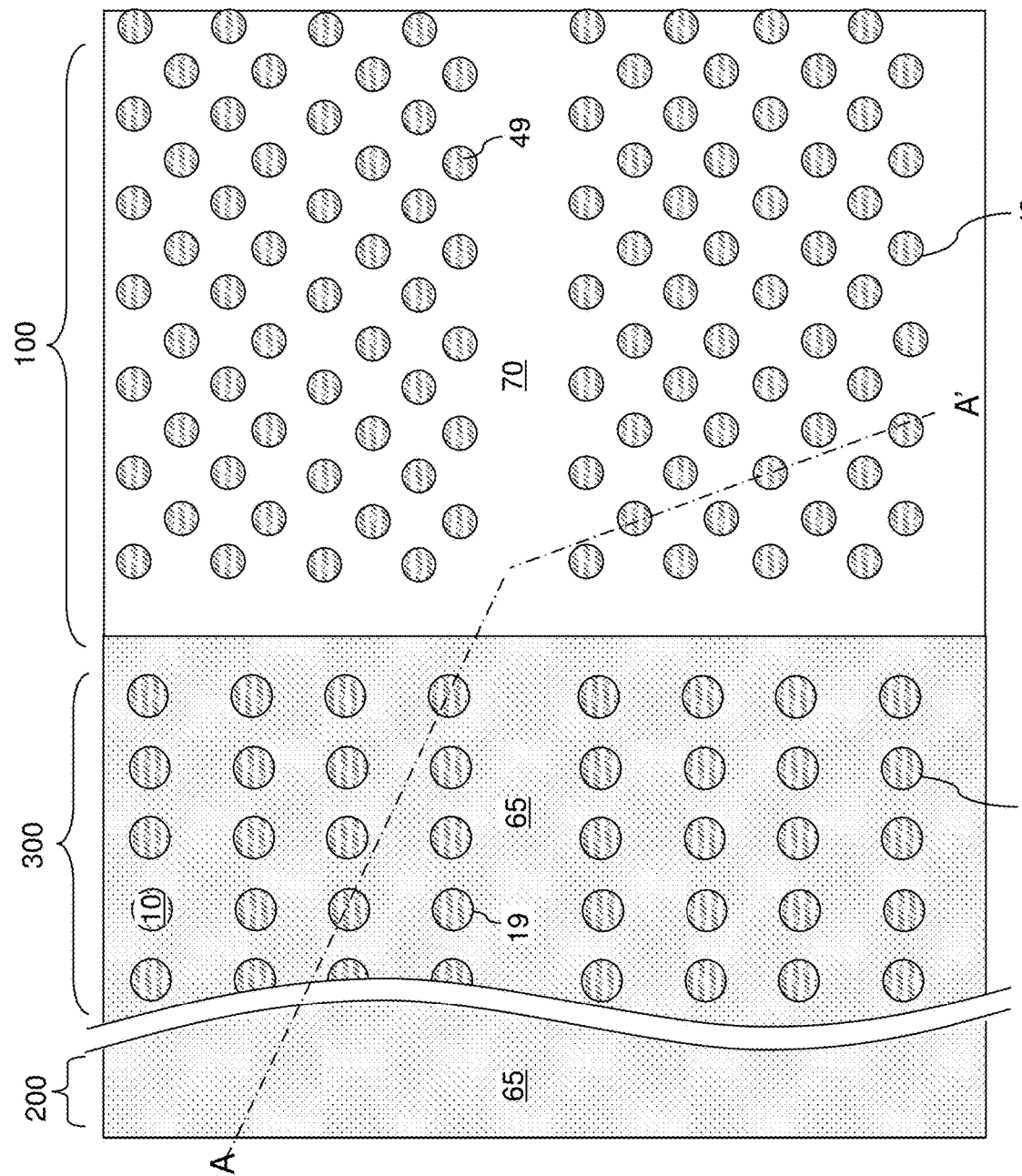
FIG. 3B is a top-down view of the first exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the substrate semiconductor layer 9. In one embodiment, an overetch into the substrate semiconductor layer 9 may be optionally performed after the top surface of the substrate semiconductor layer 9 is physically exposed at a bottom of each memory opening 49 and each support opening 19. The overetch may be performed prior to, or after, removal of the lithographic material stack. In other words, the recessed surfaces of the substrate semiconductor layer 9 may be vertically offset from the un-recessed top surfaces of the substrate semiconductor layer 9 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the substrate semiconductor layer 9.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

According to an aspect of the present disclosure, each of the memory openings 49 vertically extends through each layer within the alternating stack (32, 42) with a non-zero taper angle. Each of the memory openings 49 can have a greater lateral dimension along a first horizontal direction (e.g., word line direction) hd1 that is perpendicular to the interfaces between the stepped dielectric material portion 65 and the alternating stack (32, 42) at a top portion of the memory opening 49 (i.e., a portion that is laterally surrounded by the insulating cap layer 70) than at a bottom of the memory opening 49 (i.e., a portion that is laterally surrounded by the substrate semiconductor layer 9). Each of the memory openings 49 can also have a greater lateral dimension along a second horizontal direction (e.g., bit line direction) hd2 that is parallel to the interfaces between the stepped dielectric material portion 65 and the alternating stack (32, 42) at a top portion of the memory opening 49 (i.e., a portion that is laterally surrounded by the insulating cap layer 70) than at a bottom of the memory opening 49 (i.e., a portion that is laterally surrounded by the substrate semiconductor layer 9). Each of the memory openings 49 can have a greater lateral dimension In one embodiment, each of the memory openings 49 can have a circular or oval horizontal cross-sectional shape that increases in area with a vertical distance from the substrate semiconductor layer 9. If each of the memory openings 49 has a circular cross-sectional shape, then the lateral dimension comprises its diameter in all horizontal directions, and each of the memory openings 49 has a greater diameter at its top portion than at its bottom portion. The taper angle α of sidewalls of the memory openings 49 and the support openings 19 can be in a range from 1 degree to 20 degrees, such as form 5 degrees to 15 degrees, although lesser and greater taper angles may also be employed.

FIGS. 4A-4C are sequential vertical cross-sectional views of a memory opening 49 shown in FIG. 4A during formation of a memory opening fill structure according to the first embodiment of the present disclosure. The same structural changes can occur within each support opening 19.

Referring to FIG. 4B, a sacrificial pillar structure 11 can be formed at the bottom portion of each memory opening 49 and each support openings 19, for example, by a selective semiconductor deposition process, which may employ a selective epitaxy process or a selective polycrystalline semiconductor deposition process. Each sacrificial pillar structure 11 comprises a single crystalline semiconductor material in epitaxial alignment with the single crystalline semiconductor material of the substrate semiconductor layer 9, or a polycrystalline semiconductor material. In one embodiment, a periphery of the top surface of each sacrificial pillar structure 11 can contact a sidewall of an insulating layer 32. Generally, a sacrificial pillar structure 11 can be formed at a bottom portion of each of the memory openings 49.

Referring to FIG. 4C, a stack of layers including a blocking dielectric layer 52, a charge storage layer 54, a tunneling dielectric layer 56, a semiconductor channel layer, and a dielectric fill material layer can be sequentially deposited in each of the memory openings 49 and the support openings 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the tunneling dielectric layer 56, the charge storage layer 54, and the blocking dielectric layer 52 constitutes a memory film 50.

The semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer can be in a range from 5 nm to 40 nm, although lesser and greater thicknesses can also be employed. The semiconductor channel layer can be deposited as a polycrystalline semiconductor material layer, or may be deposited as an amorphous semiconductor material layer and may be subsequently converted into a polycrystalline semiconductor material layer by performing an anneal process. The semiconductor material may have a doping of a first conductivity type, which may be p-type or n-type.

The dielectric fill material layer includes a dielectric fill material such as undoped silicate glass or a doped silicate glass. The dielectric fill material layer can be deposited by a conformal deposition process such as a chemical vapor deposition process. The thickness of the dielectric fill material layer can be selected such that unfilled volumes of the memory openings 49 and the support openings 19 are filled with the material of the dielectric fill material layer.

A planarization process such as a chemical mechanical planarization process can be performed to remove portions of the various deposited material layers from above the horizontal plane including the top surface of the insulating cap layer 70. Each remaining portion of the dielectric fill material layer comprises a dielectric core 62. Each remaining portion of the semiconductor channel layer comprises a vertical semiconductor channel 60. The tunneling dielectric layer 56, the charge storage layer 54, and the blocking dielectric layer 52 are divided into multiple tunneling dielectric layers 56, multiple charge storage layers 54, and multiple blocking dielectric layers 52 that are formed within a respective memory opening 49 or within a respective support openings 19. Each contiguous combination of a blocking dielectric layer 52, a charge storage layer 54, and a tunneling dielectric layer 56 comprises a memory film 50. Each contiguous combination of a memory film 50 and a vertical semiconductor channel 60 comprises a memory stack structure 55. The combination of all material portions (e.g., memory film 50, vertical semiconductor channel 60 and the dielectric core 62) that are formed in a memory opening 49 constitutes a memory opening fill structure 58, and the combination of all material portions that are formed in a support opening 19 constitutes a support pillar structure. Generally, each memory stack structure 55 includes a vertical stack of memory elements. In one embodiment, each vertical stack of memory elements comprises portions of a charge storage layer 54 that are located at levels of the sacrificial material layers 42.

Figure 5:
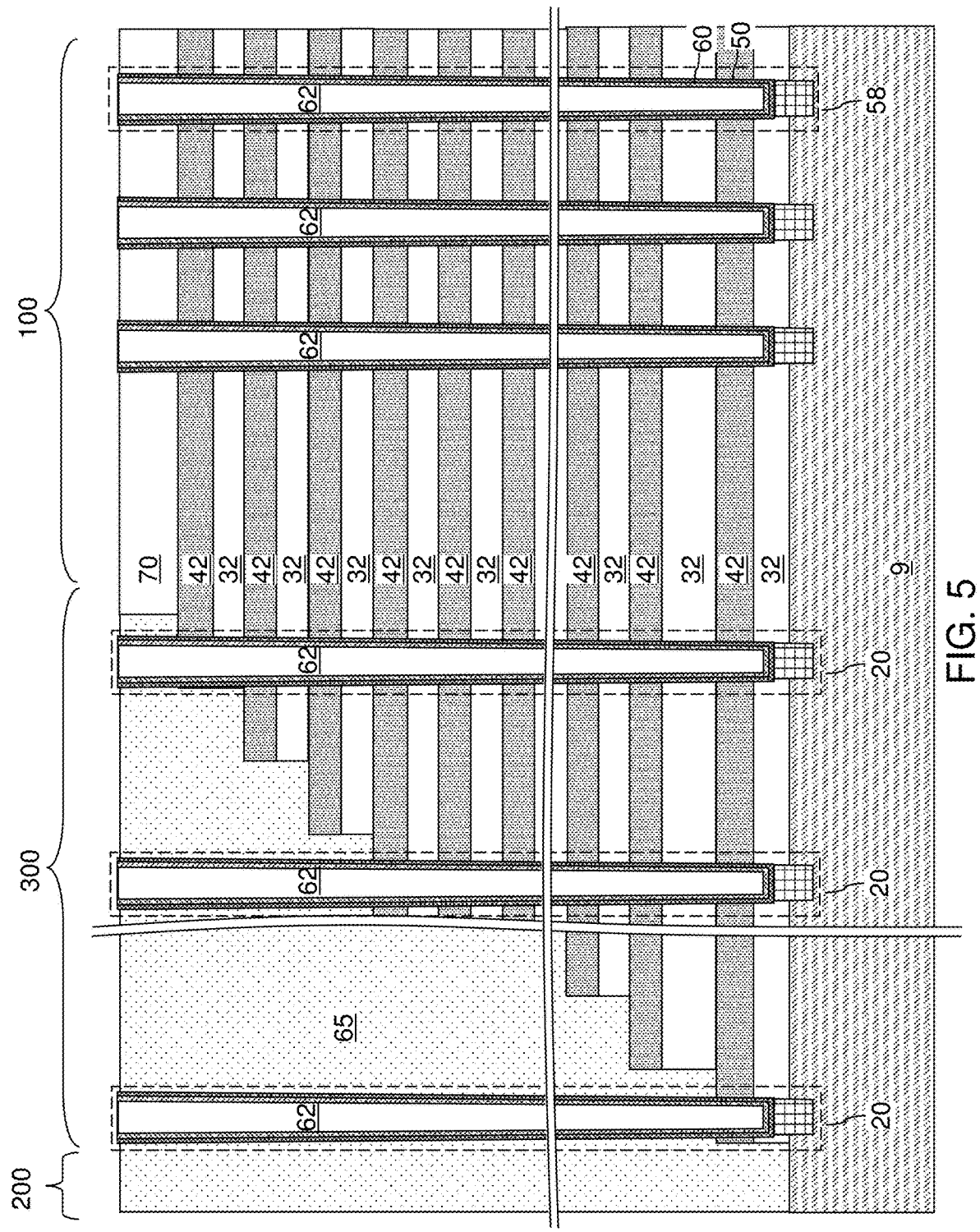
FIG. 5 is a schematic vertical cross-sectional view of the first exemplary structure after formation of memory opening fill structures according to the first embodiment of the present disclosure.

Referring to FIG. 5, the first exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening 19.

Each memory stack structure 55 includes a vertical semiconductor channel 60 and a memory film 50. The memory film 50 may comprise a tunneling dielectric layer 56 laterally surrounding the vertical semiconductor channel 60, a vertical stack of charge storage regions (e.g., comprising portions of the charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 6A:
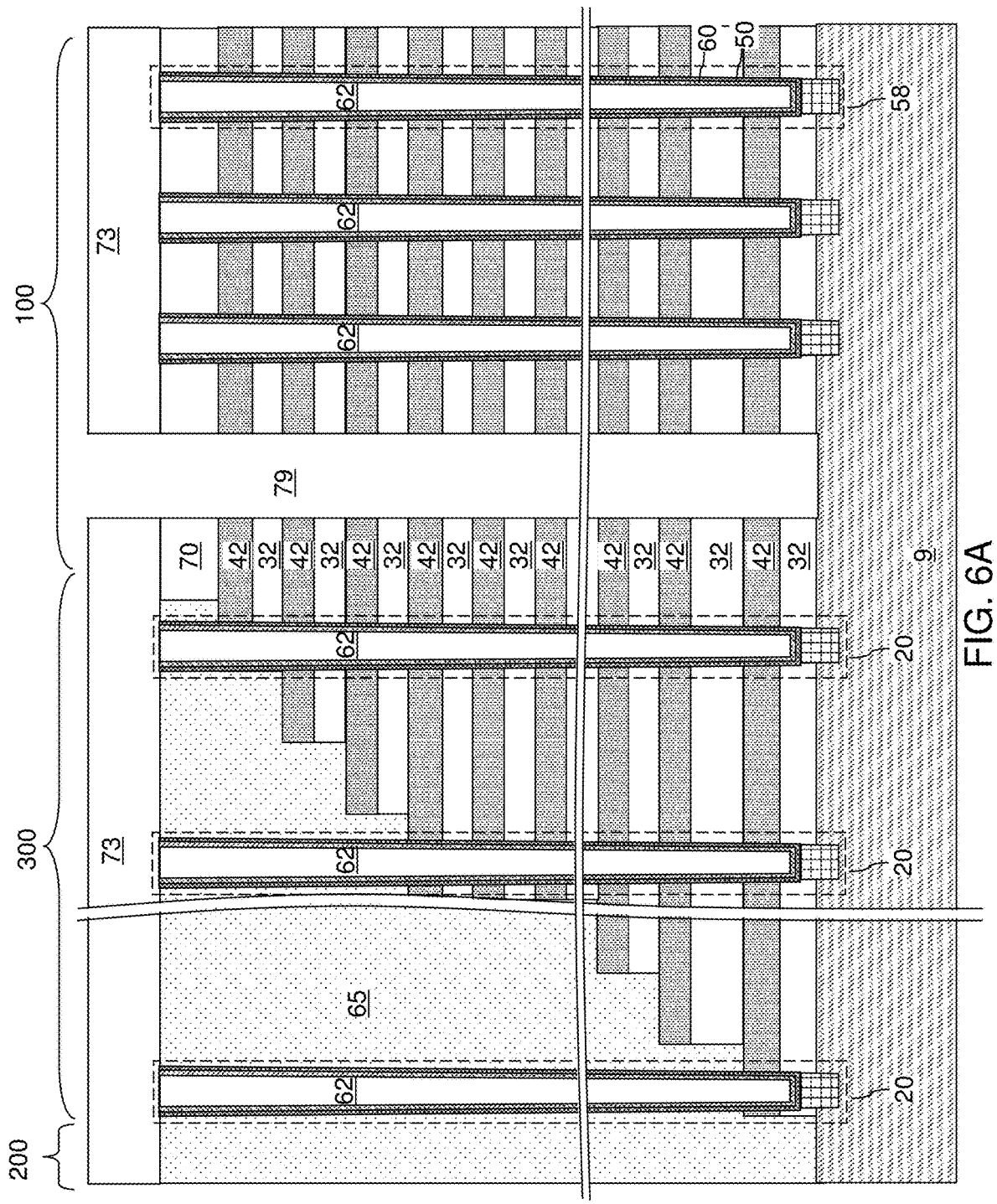
FIG. 6A is a schematic vertical cross-sectional view of the first exemplary structure after formation of backside trenches according to the first embodiment of the present disclosure.
Figure 6B:
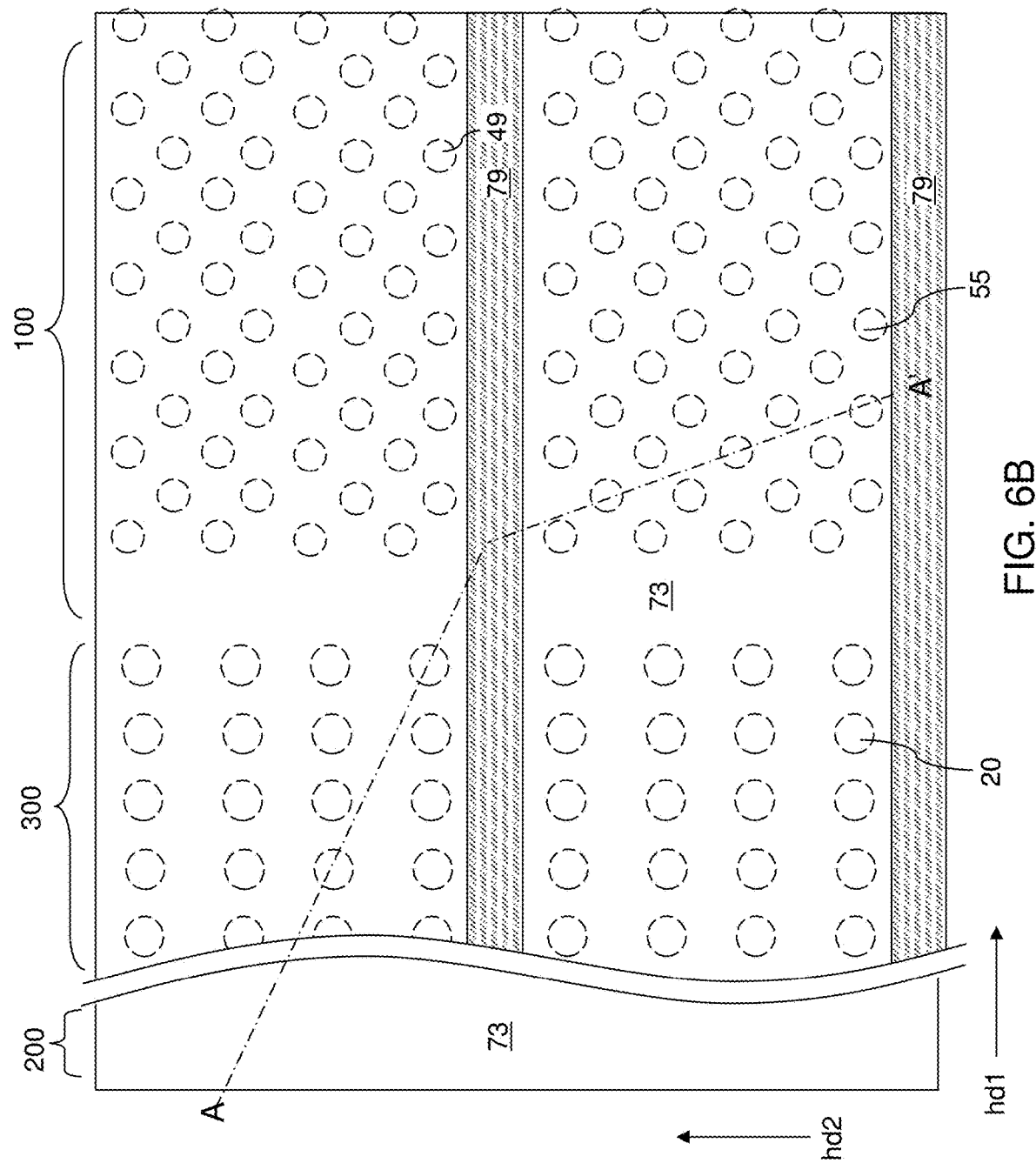
FIG. 6B is a top-down view of the first exemplary structure of FIG. 6A.

Referring to FIGS. 6A and 6B, a sacrificial capping dielectric layer 73 can be formed over the alternating stack (32, 42) of insulating layer 32 and sacrificial material layers 42, and over the memory stack structures 55 and the support pillar structures 20. The sacrificial capping dielectric layer 73 includes a dielectric material that is different from the dielectric material of the sacrificial material layers 42. For example, the sacrificial capping dielectric layer 73 can include silicon oxide. The sacrificial capping dielectric layer 73 can have a thickness in a range from 50 nm to 500 nm, although lesser and greater thicknesses can also be employed.

A photoresist layer (not shown) can be applied over the sacrificial capping dielectric layer 73, and is lithographically patterned to form openings in areas between clusters of memory stack structures 55. The pattern in the photoresist layer can be transferred through the sacrificial capping dielectric layer 73, the alternating stack (32, 42) and/or the stepped dielectric material portion 65 employing an anisotropic etch to form backside trenches 79, which vertically extend from the top surface of the sacrificial capping dielectric layer 73 at least to the top surface of the substrate semiconductor layer 9, and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1.

Figure 7:
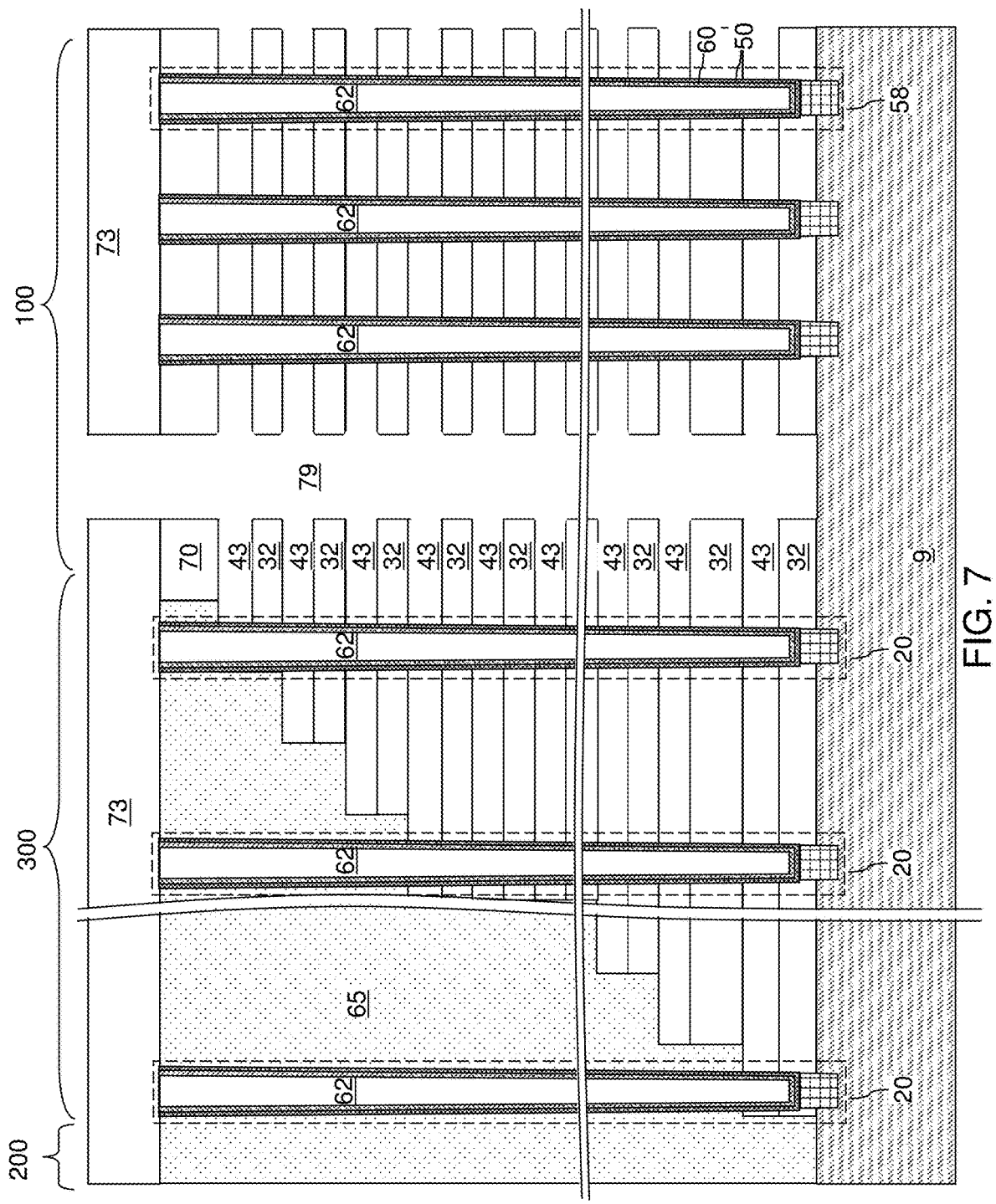
FIG. 7 is a schematic vertical cross-sectional view of the first exemplary structure after formation of backside recesses according to the first embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the substrate semiconductor layer 9, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor layer 9. In this case, each backside recess 43 can define a space for receiving a respective word line of the array of monolithic three-dimensional NAND strings.

Each of the plurality of backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each backside recess 43 can have a uniform height throughout.

Figure 8:
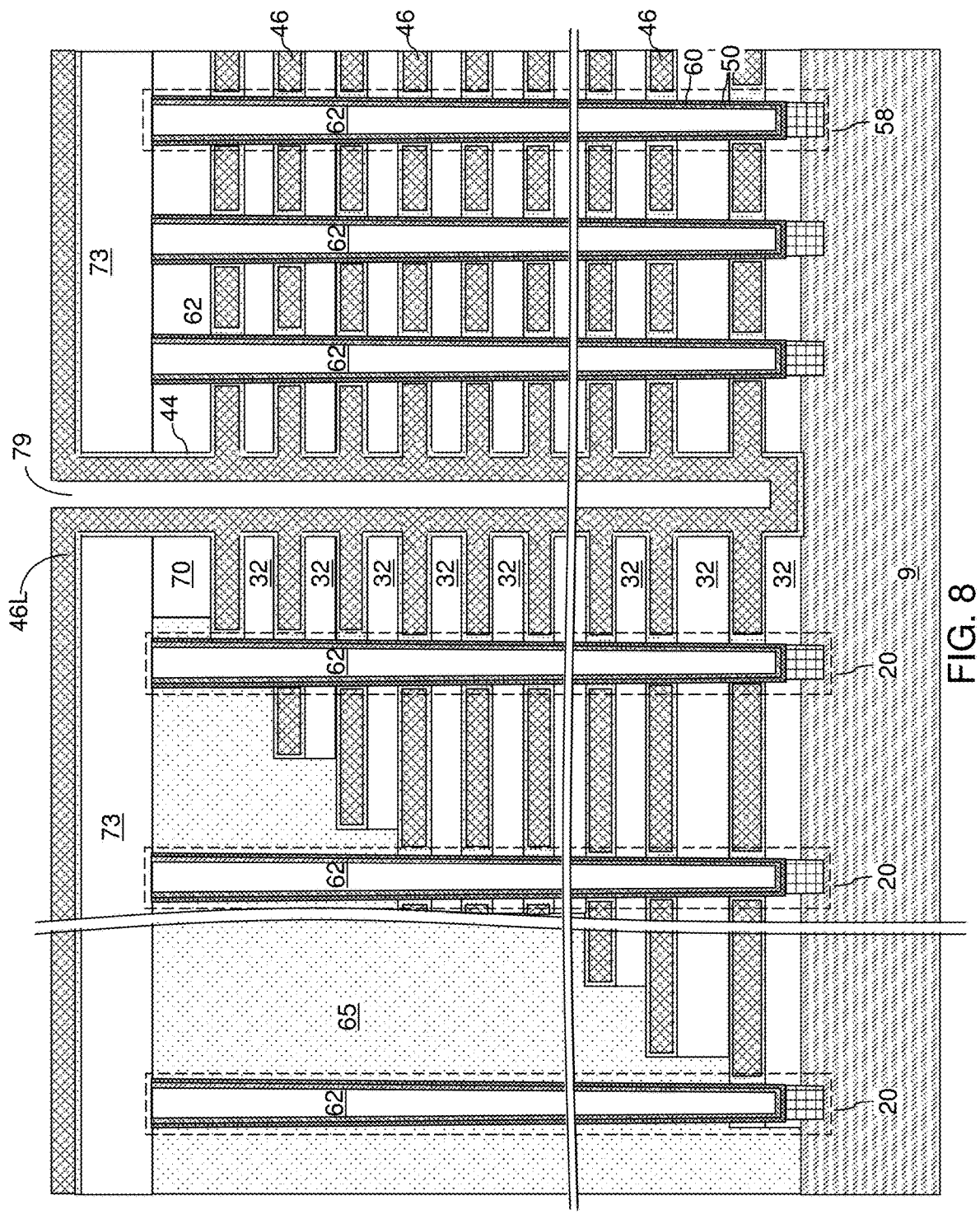
FIG. 8 is a schematic vertical cross-sectional view of the first exemplary structure after formation of electrically conductive layers according to the first embodiment of the present disclosure.

Referring to FIG. 8, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, and the portions of the sidewall surfaces of the memory stack structures 55 that are physically exposed to the backside recesses 43.

At least one electrically conductive material can be deposited in remaining volumes of the backside recesses 43. For example, the at least one conductive material may include a combination of a metallic barrier layer and a metallic fill material. The metallic barrier layer can be deposited in the backside recesses 43 directly on the physically exposed surfaces of the memory films 50. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside trench 79, and over the top surface of the topmost insulating layers 32 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive layers 46 (i.e., electrically conductive layers having layer shapes) can be formed in the plurality of backside recesses 43, and a continuous metallic material layer 46L can be formed on the sidewalls of each backside trench 79 and over the topmost insulating layers 32. Each electrically conductive layer 46 includes a portion of the metallic barrier layer and a metallic fill material portion that are located between a vertically neighboring pair of dielectric material layers such as a pair of insulating layers 32. A backside cavity 79 can be present within each backside trench 79.

Figure 9A:
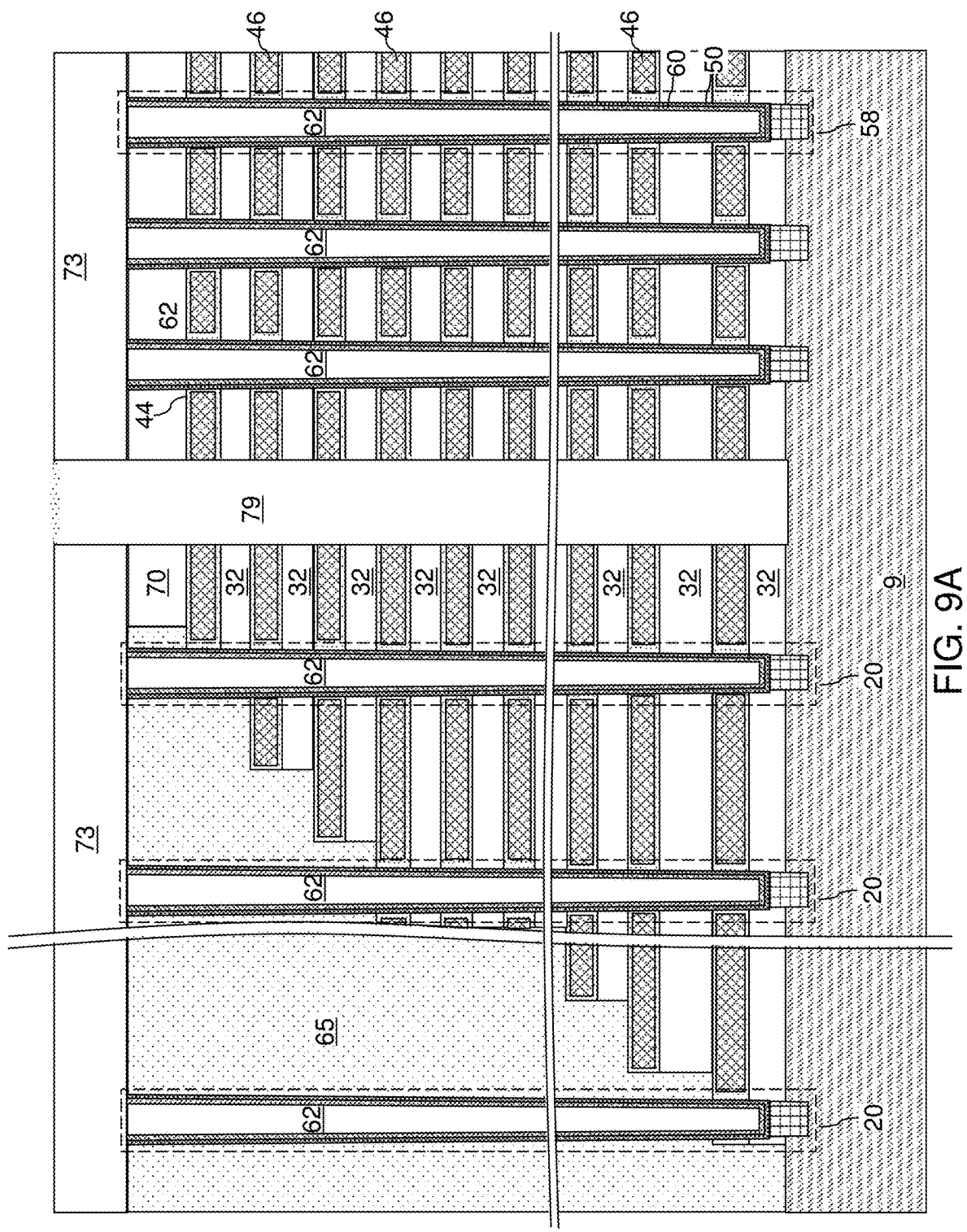
FIG. 9A is a schematic vertical cross-sectional view of the first exemplary structure after removal of a continuous metallic material layer according to the first embodiment of the present disclosure.
Figure 9B:
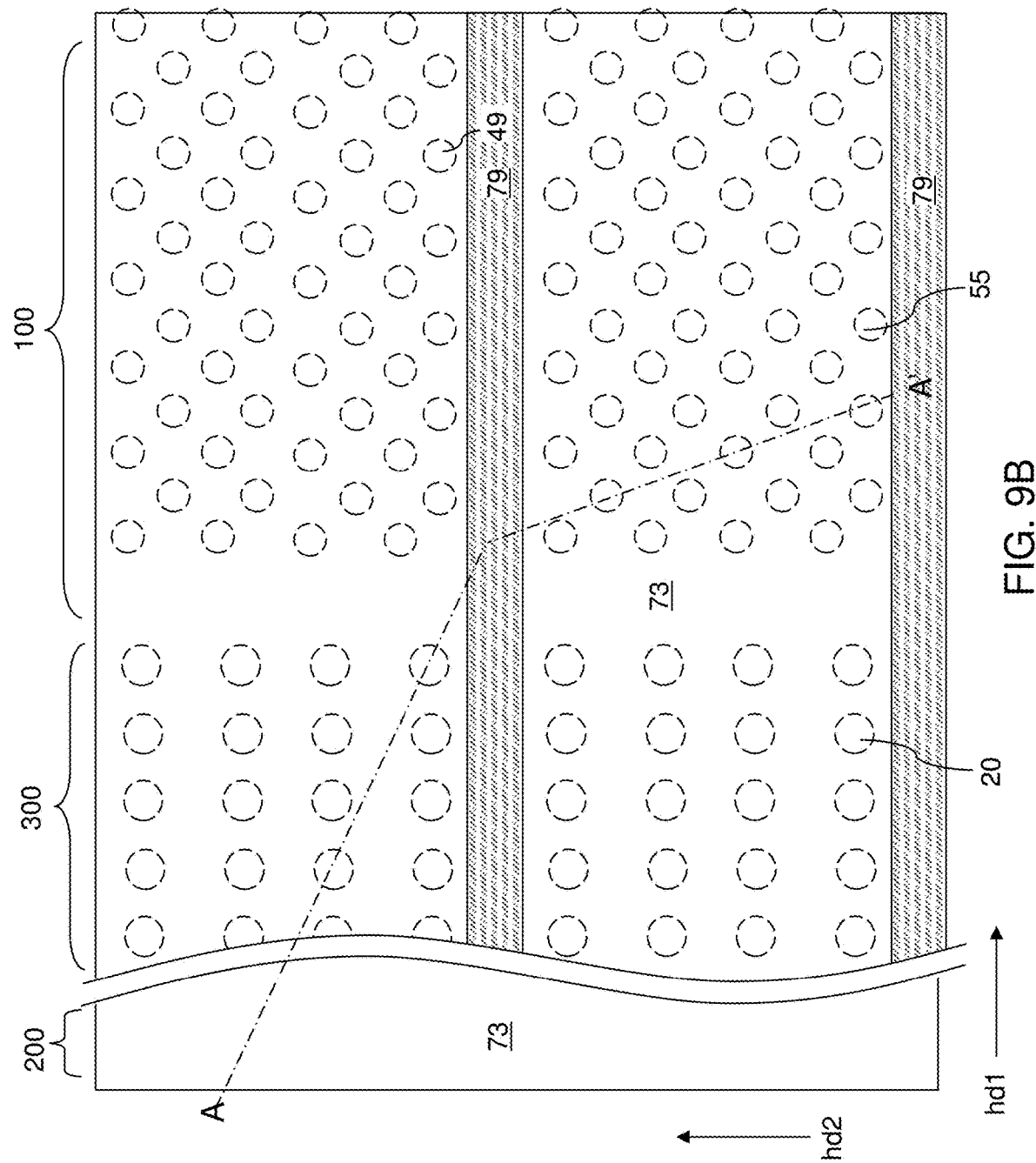
FIG. 9B is a top-down view of the first exemplary structure of FIG. 9A.

Referring to FIGS. 9A and 9B, the continuous metallic material layer 46L is etched back from the sidewalls of each backside trenches 79 and from above the sacrificial capping dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices.

Figure 10:
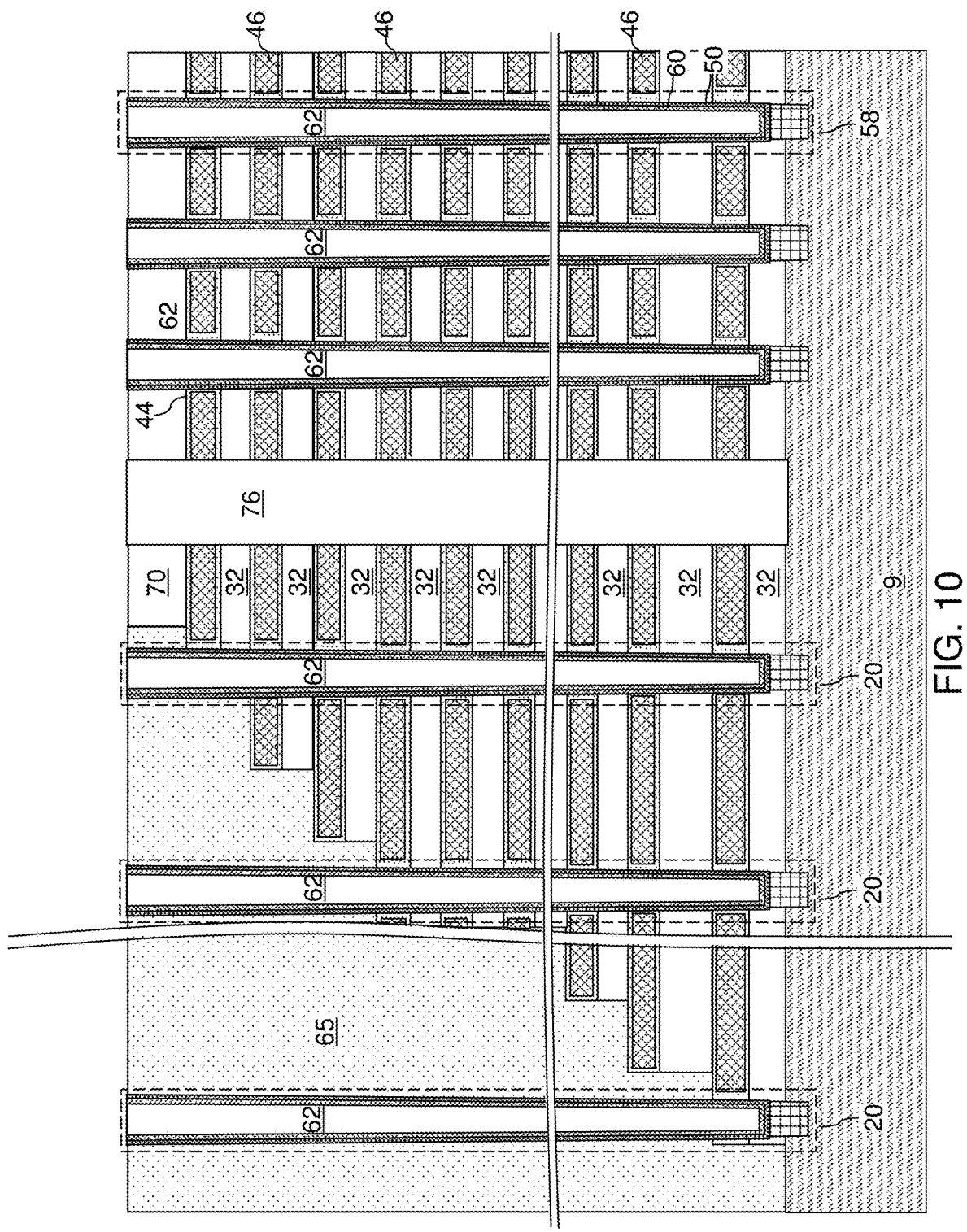
FIG. 10 is a schematic vertical cross-sectional view of the first exemplary structure after formation of backside trench fill structures according to the first embodiment of the present disclosure.

Referring to FIG. 10, a dielectric fill material such as silicon oxide can be deposited in the backside trenches 79 by a conformal deposition process. Excess portions of the dielectric fill material and the sacrificial capping dielectric layer 73 can be removed from above the horizontal plane that includes a top surface of the insulating cap layer 70. Each remaining portion of the dielectric fill material filling the backside trenches 79 constitutes a backside trench fill structure 76. In one embodiment, a pair of backside trenches 79 can vertically extend through an alternating stack of insulating layers 32 and electrically conductive layers 46, and can laterally extend along the first horizontal direction hd1 and can be laterally spaced apart along the second horizontal direction hd2. Backside trench fill structures 76 can be located in the backside trenches 79. Memory openings 49 and memory opening fill structures 58 can be located between the pair of backside trenches 79.

Figure 11A:
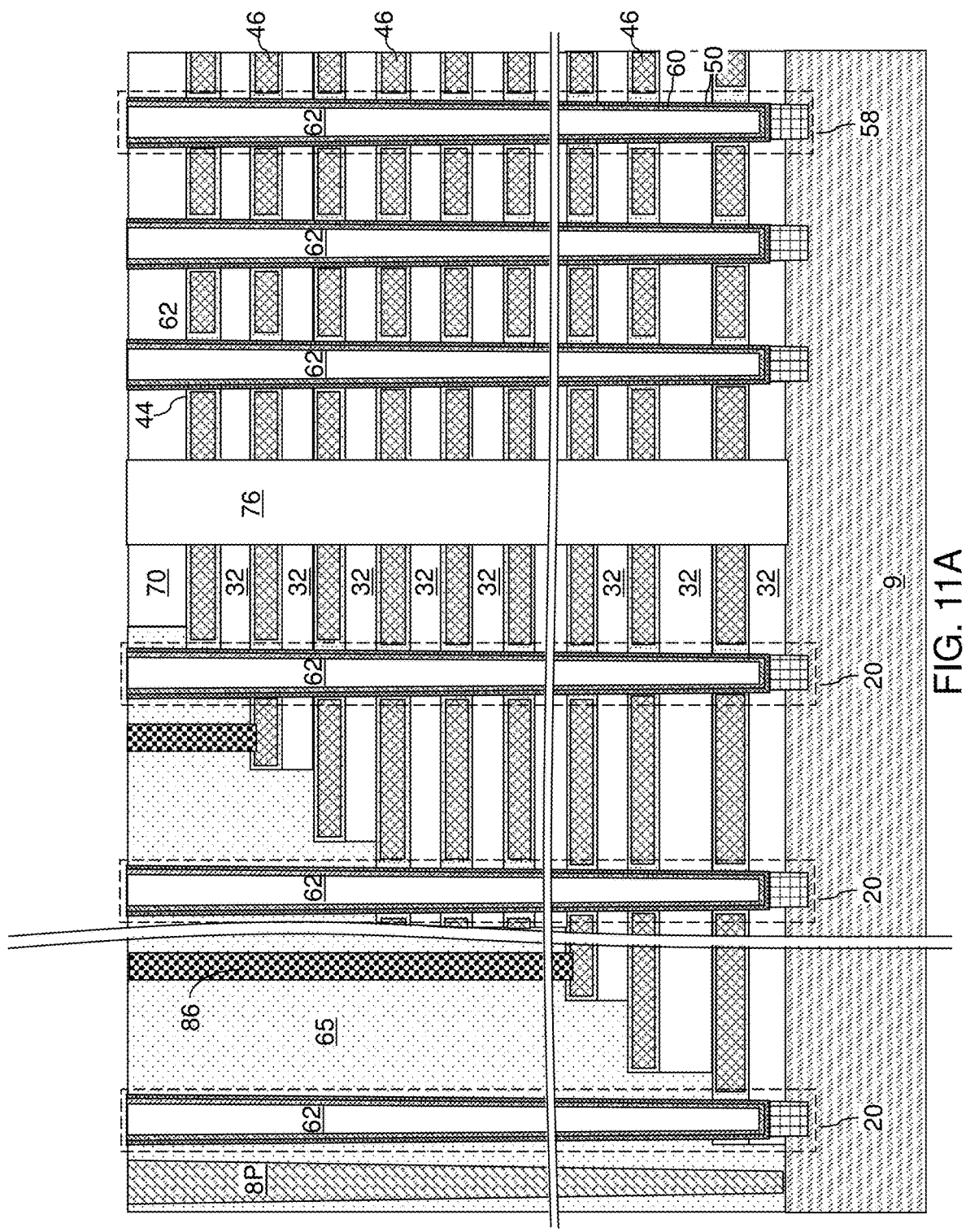
FIG. 11A is a schematic vertical cross-sectional view of the first exemplary structure after formation of layer contact via structures according to the first embodiment of the present disclosure.
Figure 11B:
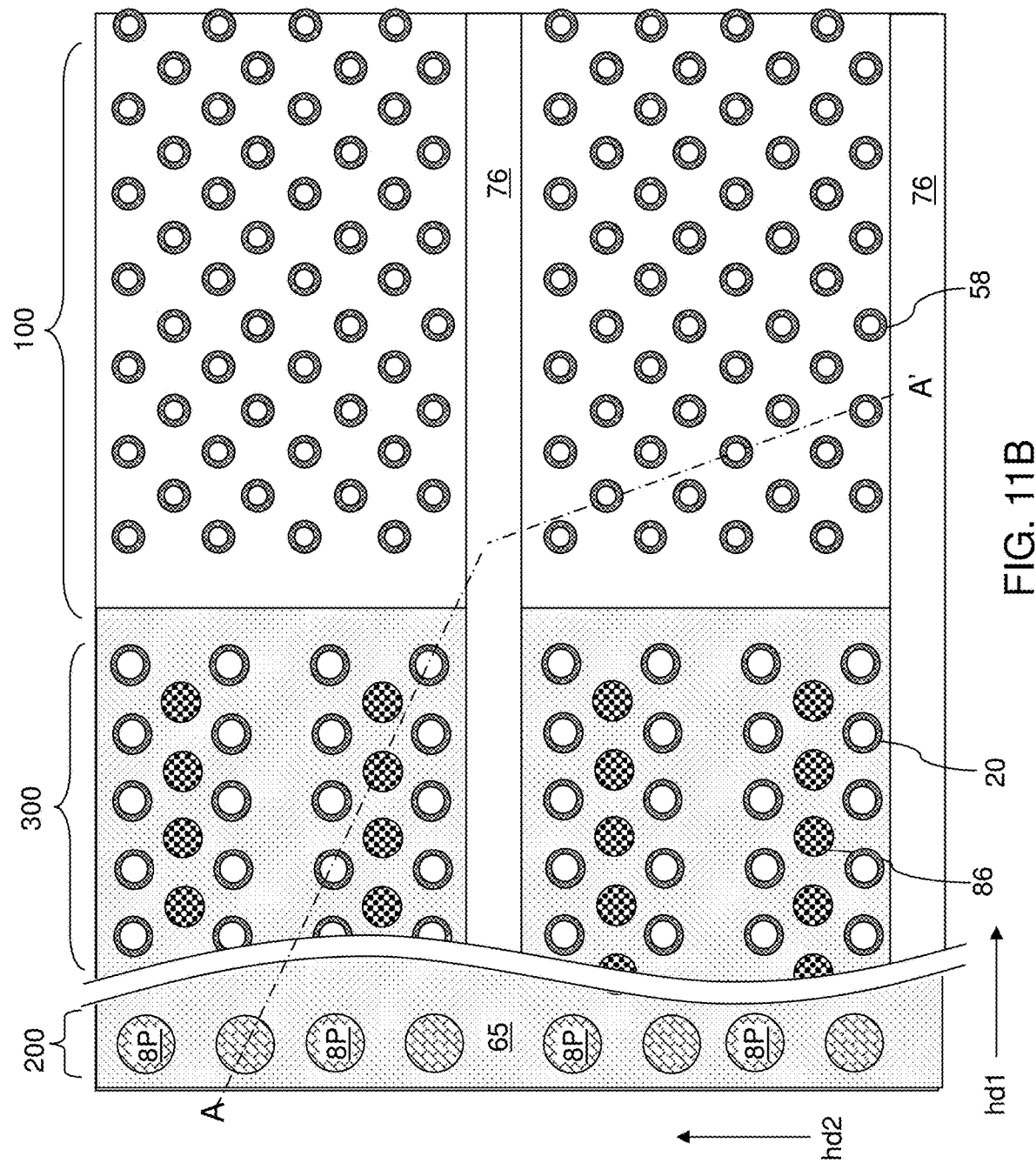
FIG. 11B is a top-down view of the first exemplary structure of FIG. 11A.

Referring to FIGS. 11A and 11B, layer contact via structures 86 can be formed on the electrically conductive layers 46 through the stepped dielectric material portion 65. A two-dimensional array of layer contact via structures 86 can be formed on a top surface of a respective one of the electrically conductive layers 46 in the contact region 300. Generally, the electrically conductive layers 46 can have lateral extents that decreases with a vertical distance from the substrate semiconductor layer 9 in the contact region 300. The stepped dielectric material portion 65 contacts stepped surfaces of the alternating stack (32, 46) in the contact region 300.

Additional contact via structures can optionally be formed through portions of the stepped dielectric material portion 65 that are laterally offset from the alternating stack (32, 46). The additional contact via structures can include through-memory-level connection via structures 8P that extend from a topmost surface of the stepped dielectric material portion 65 to a bottommost surface of the stepped dielectric material portion 65.

Figure 12:
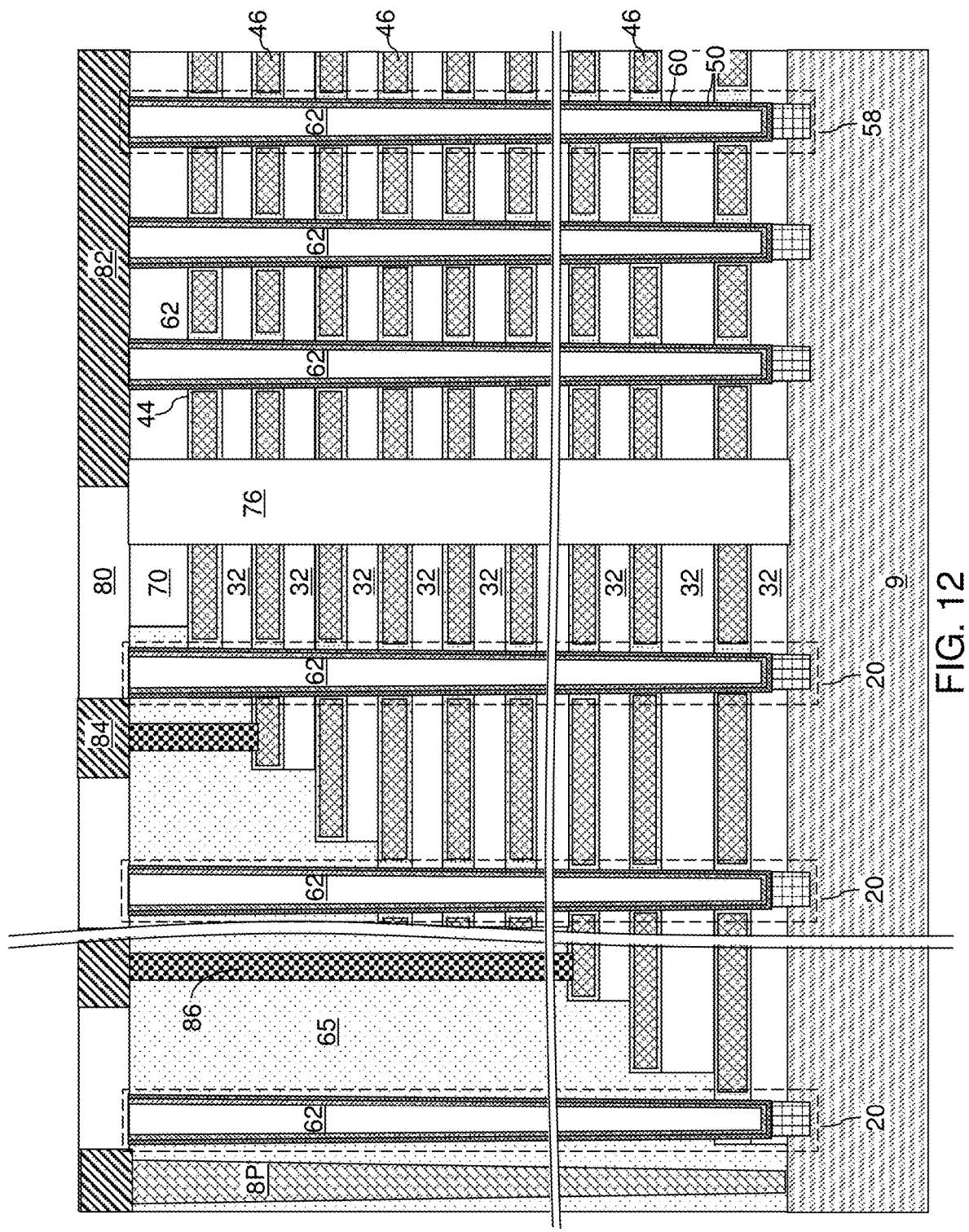
FIG. 12 is a schematic vertical cross-sectional view of the first exemplary structure after formation of a source layer, source-level interconnect structures, and a source-side dielectric layer according to the first embodiment of the present disclosure.

Referring to FIG. 12, a source-side dielectric layer 80 can be formed above the insulating cap layer 70. The source-side dielectric layer 80 includes a dielectric material such as silicon oxide. The thickness of the source-side dielectric layer 80 can be in a range from 100 nm to 500 nm, although lesser and greater thicknesses can also be employed.

A photoresist layer (not shown) can be applied over the source-side dielectric layer 80, and can be lithographically patterned to form at least one continuous opening in the memory array region 100. Additional openings can be formed in the photoresist layer over the layer contact via structures 86. An anisotropic etch process can be performed to transfer the pattern of the openings in the photoresist layer though the source-level dielectric layer 80. At least one conductive material, such as a heavily doped semiconductor material and/or a metallic material can be deposited in the cavities in the source-level dielectric layer 80 to form various source-level conductive structures (82, 84). The various source-level conductive structures (82, 84) can include at least one source layer 82 and source-level metal interconnect structures 84.

Each source layer 82 can contact first end surfaces of a set of vertical semiconductor channels 60. In one embodiment, the set of vertical semiconductor channels 60 may be located between a neighboring pair of backside trenches 79. Alternatively, a source layer 82 may continuously extend over multiple backside trench fill structures 76 and may contact multiple sets of vertical semiconductor channels 60 located between different neighboring pairs of backside trenches 79. In one embodiment, a single source layer 82 may contact each vertical semiconductor channel 60 within a plane of a memory die. Alternatively, multiple discrete source layers 82 may be embedded within the source-side dielectric layer 80.

Figure 13:
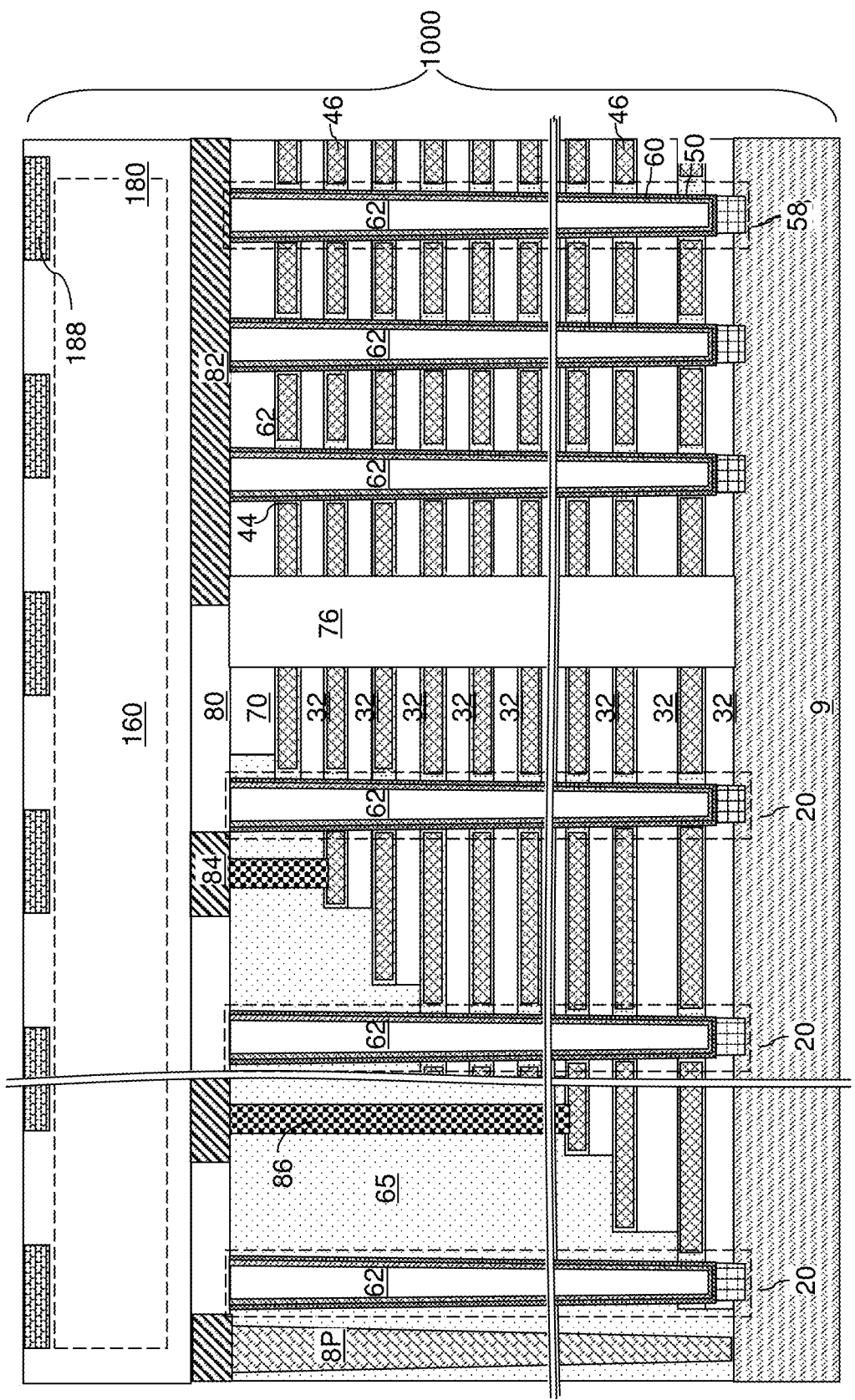
FIG. 13 is a schematic vertical cross-sectional view of the first exemplary structure after formation of memory-side metal interconnect structures and memory-side bonding pads embedded in memory-side dielectric material layers according to the first embodiment of the present disclosure.

Referring to FIG. 13, additional metal interconnect structures embedded in dielectric material layers can be formed above the source-side dielectric layer 80. The additional metal interconnect structures are herein referred to as memory-side metal interconnect structures 180, and may include metal lines and metal via structures. The additional dielectric material layers are herein referred to as memory-side dielectric material layers 160, and may include line-level dielectric material layers and via-level dielectric material layers. Memory-side bonding pads 188 can be formed at the topmost level of the dielectric material layers 160. A memory die 1000 can be provided, which is a first semiconductor die to be employed to form a bonded structure.

Figure 14:
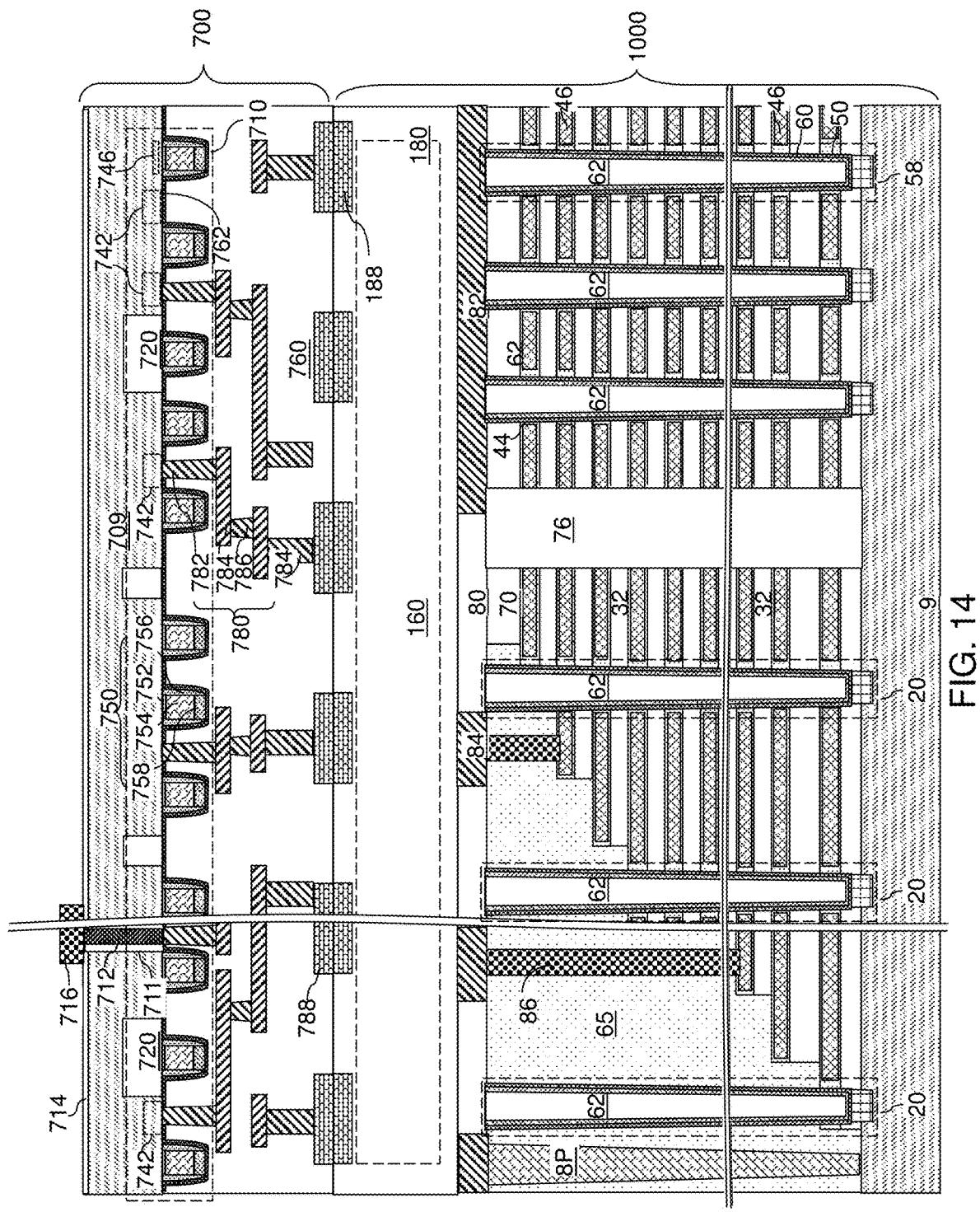
FIG. 14 is a schematic vertical cross-sectional view of the first exemplary structure after attaching a logic die to a memory die according to the first embodiment of the present disclosure.

Referring to FIG. 14, a second semiconductor die can be provided, which can be a logic die 700 including various semiconductor devices 710. The semiconductor devices 710 include a peripheral (e.g., driver) circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory opening fill structures 58 in the memory die 1000, a power supply/distribution circuitry that provides power to the memory die 1000, a data buffer and/or latch, and/or any other semiconductor circuitry that can be used to operate the array of elements in the memory die 1000. The logic die 700 can include a logic-die substrate, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench dielectric isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side bonding pads 788.

The logic die 700 can include a backside insulating layer 714 located on the backside surface of the logic-die substrate 708. Laterally-insulated through-substrate via structures (711, 712) can be formed through the logic-die substrate 708 to provide electrical contact to various input nodes and output nodes of the periphery circuitry. Each laterally-insulated through-substrate via structure (711, 712) includes a through-substrate conductive via structure 712 and a tubular insulating liner 711 that laterally surrounds the through-substrate conductive via structure 712. Backside bonding pads 716 can be formed on surface portions of the laterally-insulated through-substrate via structures (711, 712). Generally, a semiconductor logic die 700 is provided, which includes semiconductor devices 710 located on a semiconductor substrate (such as the substrate semiconductor layer 709). The logic-side bonding pads 788 overlie, and are electrically connected to, the semiconductor devices 710, and laterally-insulated through-substrate via structures (711, 712) can extend through the semiconductor substrate.

The memory die 1000 and the logic die 700 are positioned such that the logic-side bonding pads 788 of the logic die 700 face the memory-side bonding pads 188 of the memory die 1000. In one embodiment, the memory die 1000 and the logic die 700 can designed such that the pattern of the logic-side bonding pads 788 of the logic die 700 is the mirror pattern of the pattern of the memory-side bonding pads 178 of the memory die 1000. The memory die 1000 and the logic die 700 can be attached to each other, i.e., can be bonded to each other, by metal-to-metal bonding, dielectric-to-dielectric bonding or hybrid bonding. Alternatively, an array of solder material portions may be used to bond the memory die 1000 and the logic die 700 through the array of solder material portions (such as solder balls).

Subsequently, the backside of the substrate semiconductor layer 709 of the logic die 700 can be thinned, for example, by grinding, polishing, an anisotropic etch process, or an isotropic etch process. A backside surface of each through-substrate conductive via structure 712 can be physically exposed upon thinning the substrate semiconductor layer 709 of the logic die 700. The thickness of the substrate semiconductor layer 709 of the logic die 700 may be in a range from 5 microns to 30 microns, although lesser and greater thicknesses may also be employed. A backside insulating layer 714 can be formed on the backside of the substrate semiconductor layer 709 of the logic die 700. Logic-side external bonding pads 716 can be formed on the laterally-insulated through-substrate via structures (711, 712).

Figure 15:
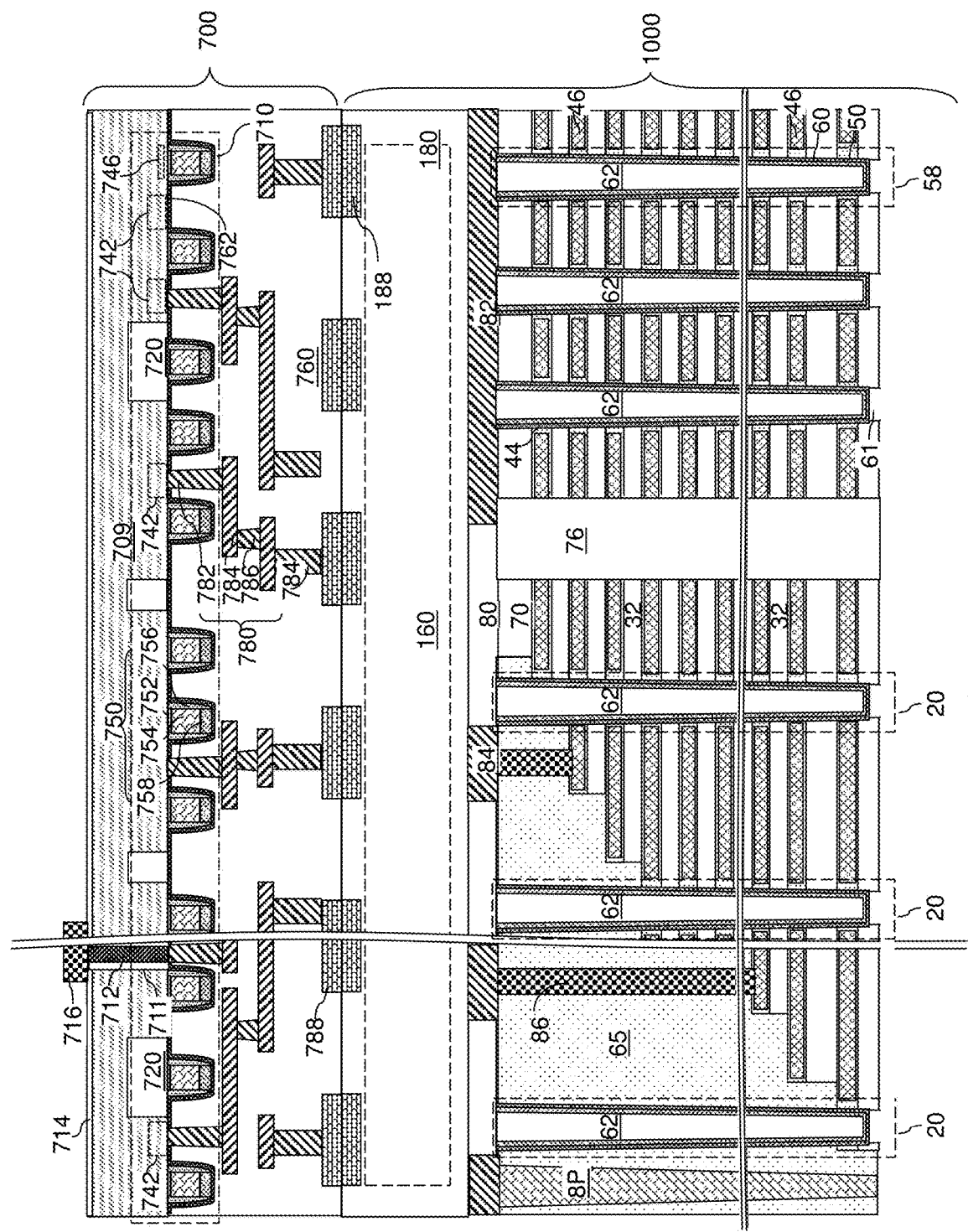
FIG. 15 is a schematic vertical cross-sectional view of the first exemplary structure after removal of a substrate according to the first embodiment of the present disclosure.

Referring to FIG. 15, the substrate semiconductor layer 9 of the memory die 1000 can be removed selective to the materials of the insulating layers 32 and the memory films 50. For example, a backside portion of the substrate semiconductor layer 9 of the memory die 1000 can be removed by grinding, polishing, an anisotropic etch process, and/or an isotropic etch process. Subsequently, a top portion of the substrate semiconductor layer 9 can be removed by an etch process (which may be an isotropic etch process or an anisotropic etch process) that etches the semiconductor material of the substrate semiconductor layer 9 selective to the materials of the insulating layers 32 and the memory films 50. In an illustrative example, a wet etch process employing potassium hydroxide may be employed to remove the substrate semiconductor layer 9.

The sacrificial pillar structures 11 can be removed selective to the memory films 50. In one embodiment, a wet etch process that etches the semiconductor material of the sacrificial pillar structures 11 selective to the material(s) of the memory films 50 can be performed to remove the sacrificial pillar structures 11. In one embodiment, the substrate semiconductor layer 9 and the sacrificial pillar structures 11 can be removed employing a same etch process. In another embodiment, the substrate semiconductor layer 9 and the sacrificial pillar structures 11 can be removed sequentially employing different etch processes.

Figure 16:
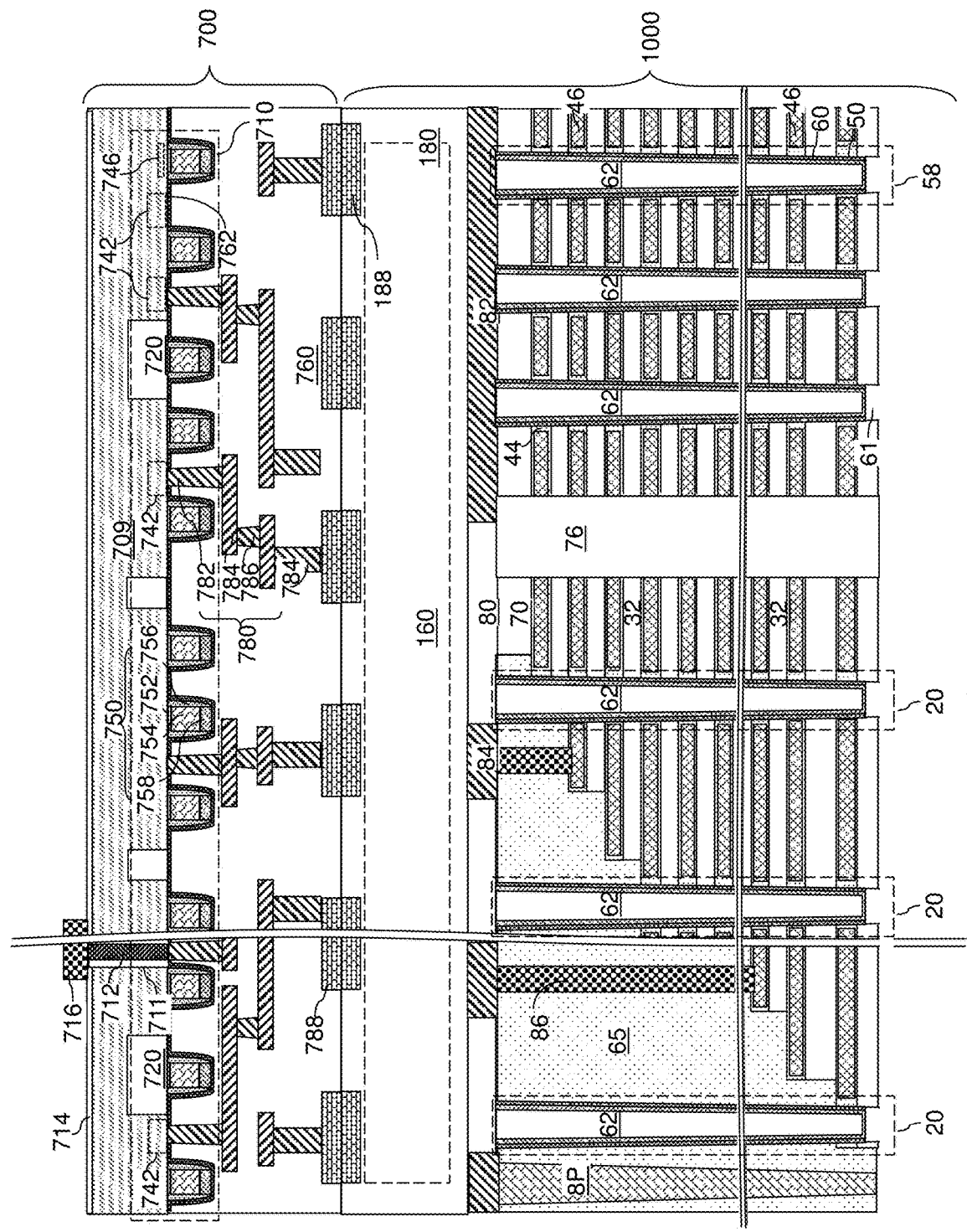
FIG. 16 is a schematic vertical cross-sectional view of the first exemplary structure after removal of sacrificial pillar structures according to the first embodiment of the present disclosure.

Referring to FIG. 16, a set of isotropic etch processes can be performed to sequentially remove physically exposed portions of the memory films 50. Bottom portions of the blocking dielectric layers 52, the charge storage layers 54, and the tunneling dielectric layers 56 can be removed by the set of isotropic etch process. Second end surfaces of the vertical semiconductor channels 60 are physically exposed. The second end surfaces of the vertical semiconductor channels 60 are vertically recessed toward the source layer 82 relative to a physically exposed surface of an insulating layer 32, which is the most distal insulating layer 32 within the alternating stack of insulating layers 32 and electrically conductive layers 46 from the source layer 82. Recess regions 61 are formed adjacent to each exposed, second end surfaces of the vertical semiconductor channels 60.

Figure 17:
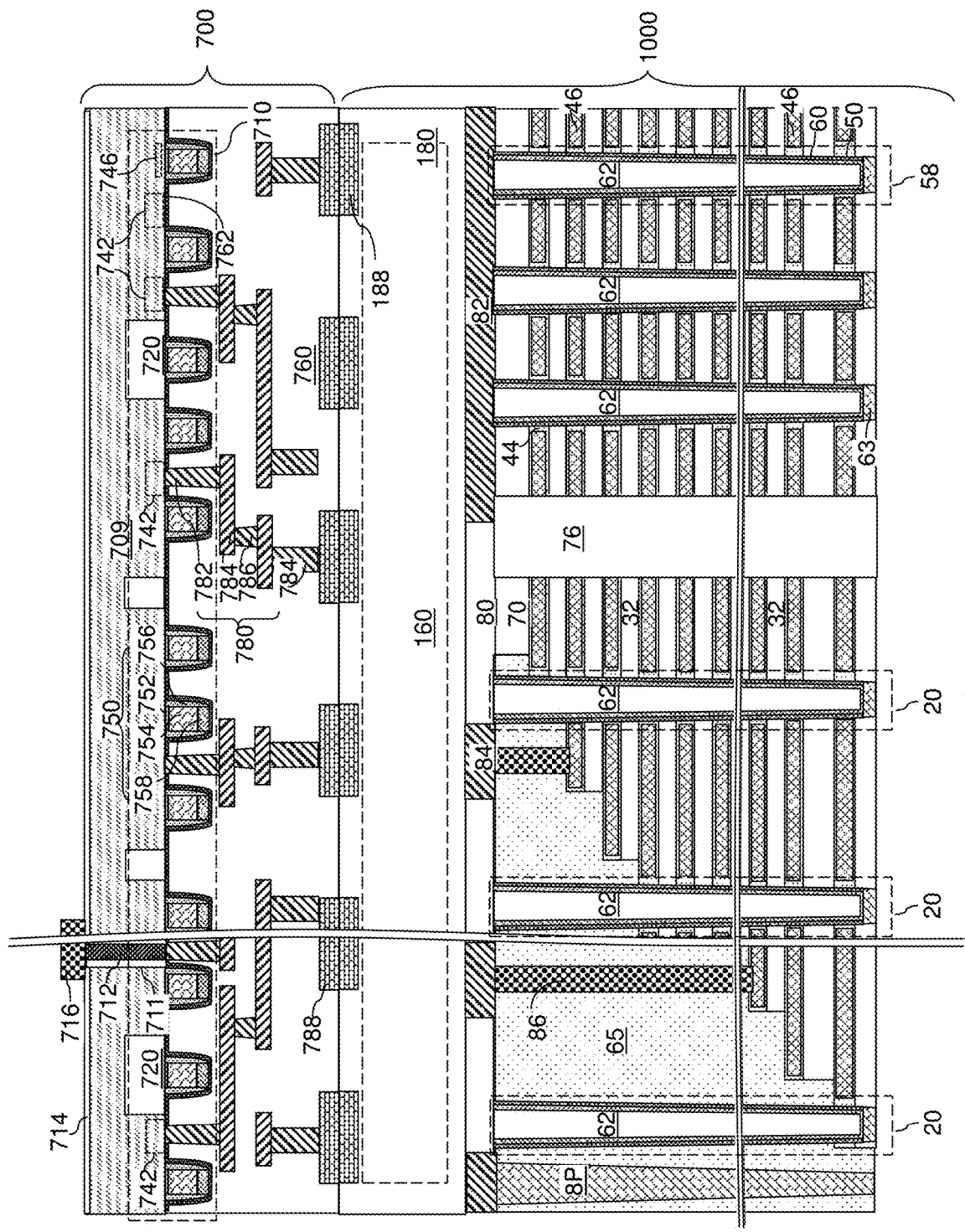
FIG. 17 is a schematic vertical cross-sectional view of the first exemplary structure after formation of drain regions according to the first embodiment of the present disclosure.

Referring to FIG. 17, a doped semiconductor material having a doping of a second conductivity type can be deposited in the recess regions 61 formed by removal of the sacrificial pillar structures 11. The second conductivity type is the opposite of the first conductivity type. For example, if the first conductivity type is p-type, the second conductivity type is n-type, and vice versa. The doped semiconductor material can be, for example, doped polysilicon. The dopant concentration in the doped semiconductor material can be in a range from $5.0\times10^{18}/cm^3$ to $2.0\times10^{21}/cm^3$, although lesser and greater dopant concentrations can also be employed. Portions of the doped semiconductor material located outside the recess regions can be removed by a planarization process such as a chemical mechanical planarization process. Each remaining portion of the doped semiconductor material comprises a drain region 63. Each memory opening fill structure 58 can comprise a vertical semiconductor channel 60, a memory film 50, a dielectric core 62, and a drain region 63. Each drain region 63 can contact a horizontal end surface of a respective one of the vertical semiconductor channels 60 and contacts an annular end surface of a respective one of the memory films 50.

Figure 18:
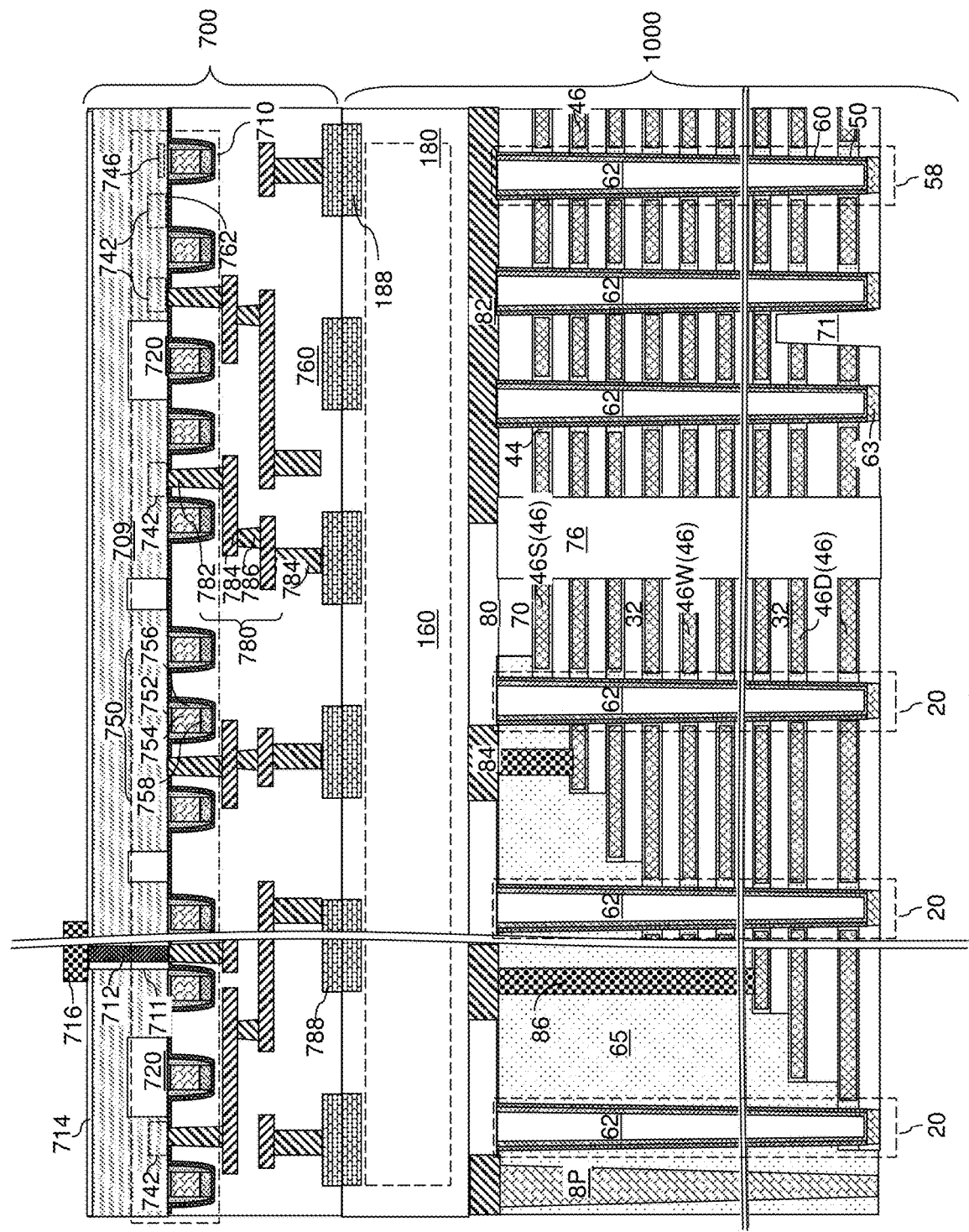
FIG. 18 is a schematic vertical cross-sectional view of the first exemplary structure after formation of drain-select-level isolation trenches according to the first embodiment of the present disclosure.

Referring to FIG. 18, drain-select-level isolation trenches 71 can be formed through a subset of the electrically conductive layers (i.e., drain side select gate electrode layers) 46 that are distal from the source layer 82. The remaining electrically conductive layers 46 comprise source side select gate electrode(s) 46S and word lines 46W located between the drain side select gate electrode layers and the source side select gate electrodes 46S. The drain-select-level isolation trenches 71 can laterally extend along the first horizontal direction hd1, and can vertically extend through the drain side select gate electrode layers. A drain side select gate electrode layers located between a neighboring set of backside trench fill structures 76 can be divided into a plurality of drain side select gate electrodes 46D by the drain-select-level isolation trenches 71. The drain-selectlevel isolation trenches 71 can be formed between a neighboring pair of rows of memory opening fill structures 58.

According to an aspect of the present disclosure, the drain-select-level isolation trenches 71 do not cut into the memory opening fill structures 58 because the taper angle of the sidewalls of the memory openings 49 and the memory opening fill structures 58 that fill the memory openings 49 makes them narrower at the level of the drain-select-level isolation trenches 71. In other words, the drain-select-level isolation trenches 71 are located between the narrower lower portions of the memory openings 49 and the memory opening fill structures 58 instead of between the wider upper portions of the memory openings 49 and the memory opening fill structures 58, as in some prior art devices. The narrower lower portions of the memory openings 49 and the memory opening fill structures 58 are further spaced apart from each other than the wider upper portions of the memory openings 49 and the memory opening fill structures 58. Therefore, there is more space to form the drain-select-level isolation trenches 71 between the lower portions of the memory openings 49 and the memory opening fill structures 58. Furthermore, the pitch between the drain-select-level isolation trenches 71 and the memory opening fill structures 58 may be reduced since there is less concern for incline or toppling of the alternating stacks located between adjacent backside trenches 79. Therefore, the pitch between adjacent backside trenches 79 and the critical diameter of the memory openings 49 at the level of the drain-select-level isolation trenches 71 may also be reduced to further increase device density.

Generally, at least one electrically conductive layer 46 can be divided into a respective plurality of drain side select gate electrodes 46D that are laterally spaced apart by the drain-select-level isolation trenches 71. Each drain side select gate electrode 46D can be independently electrically biased to select, or unselect, a respective group of memory opening fill structures 58 that is laterally surrounded by a same drain side select gate electrode 46D. A subset of the electrically conductive layers 46 that are not divided by the drain-select-level isolation trenches 71 comprise word lines 46W and source side select gate electrodes 46S.

Figure 19A:
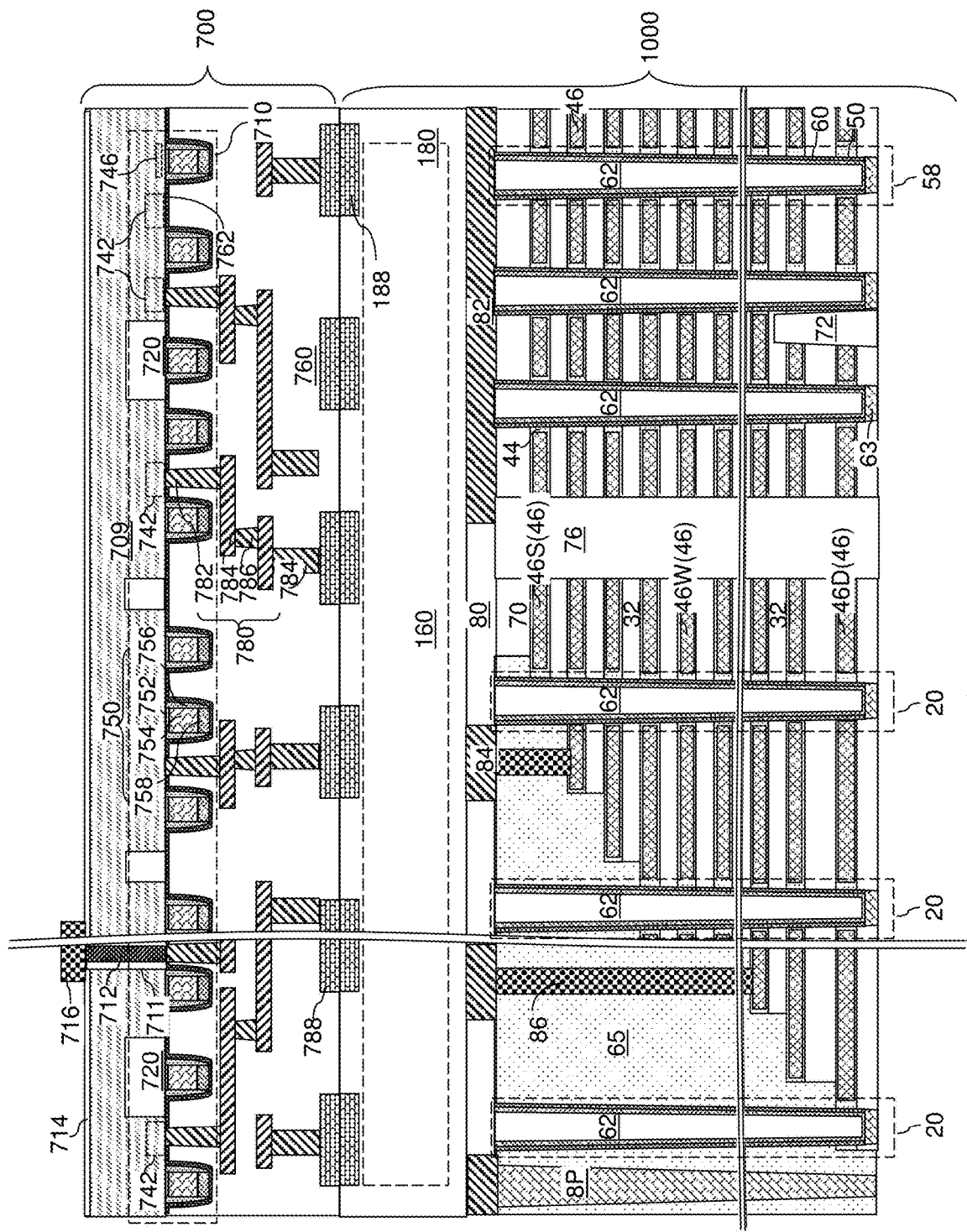
FIG. 19A is a schematic vertical cross-sectional view of the first exemplary structure after formation of drain-select-level isolation structures according to the first embodiment of the present disclosure.
Figure 19B:
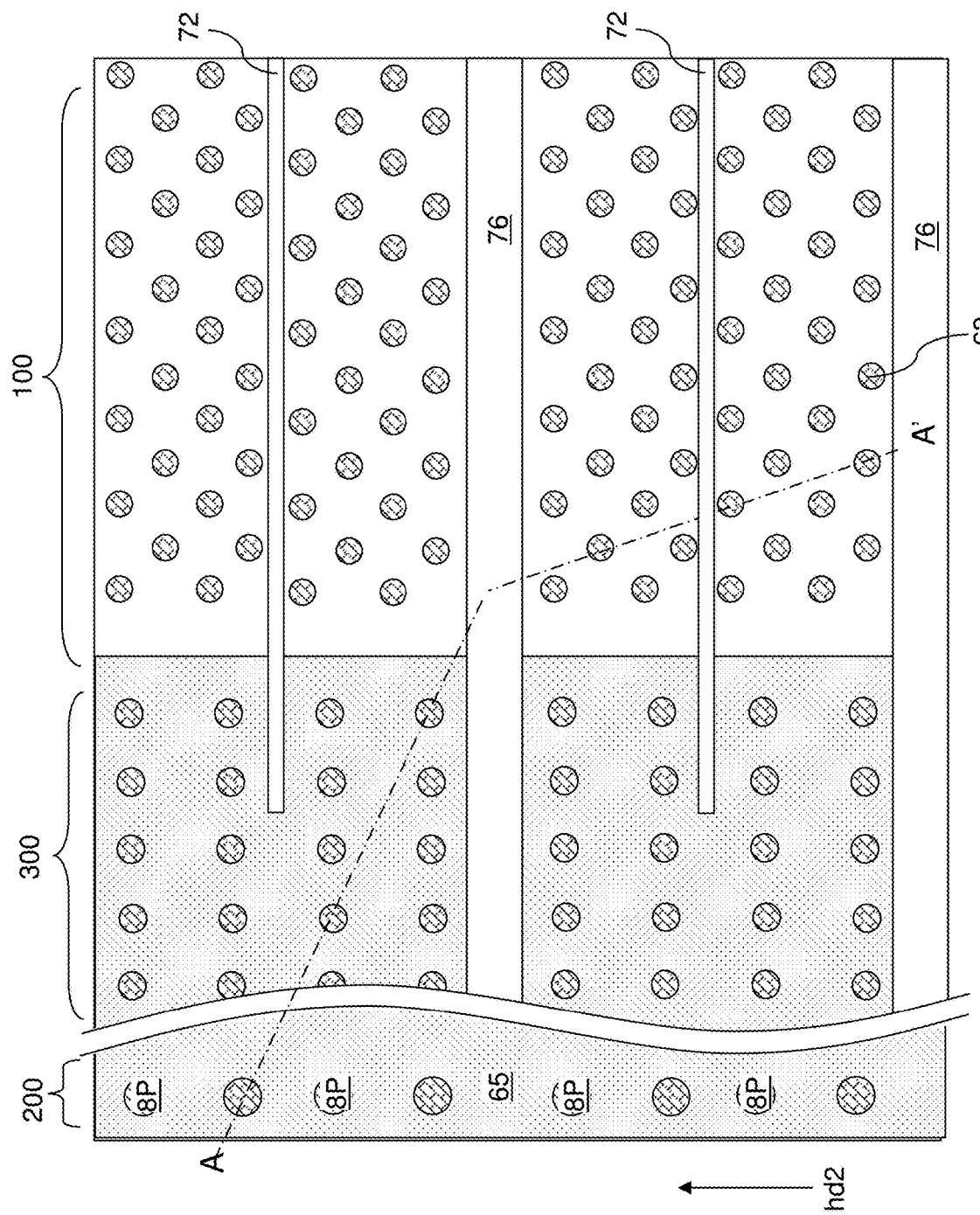
FIG. 19B is a top-down view of the first exemplary structure of FIG. 19A.

Referring to FIGS. 19A and 19B, a dielectric fill material such as silicon oxide can be deposited in the drain-select-level isolation trenches. 71 to form drain-select-level isolation structures 72. Excess portions of the dielectric fill material can be removed from outside the drain-select-level isolation trenches 71. The drain-select-level isolation structures 72 laterally extend along the first horizontal direction hd1, and vertically extend through at least one drain side select gate electrode 46D of the electrically conductive layers 46. In one embodiment, each of the drain-select-level isolation structures 72 can have a respective tapered vertical cross-sectional profile in which a width at a physically exposed horizontal surface has a greater width than a width at a horizontal interface with one of the insulating layers 32.

Figure 20A:
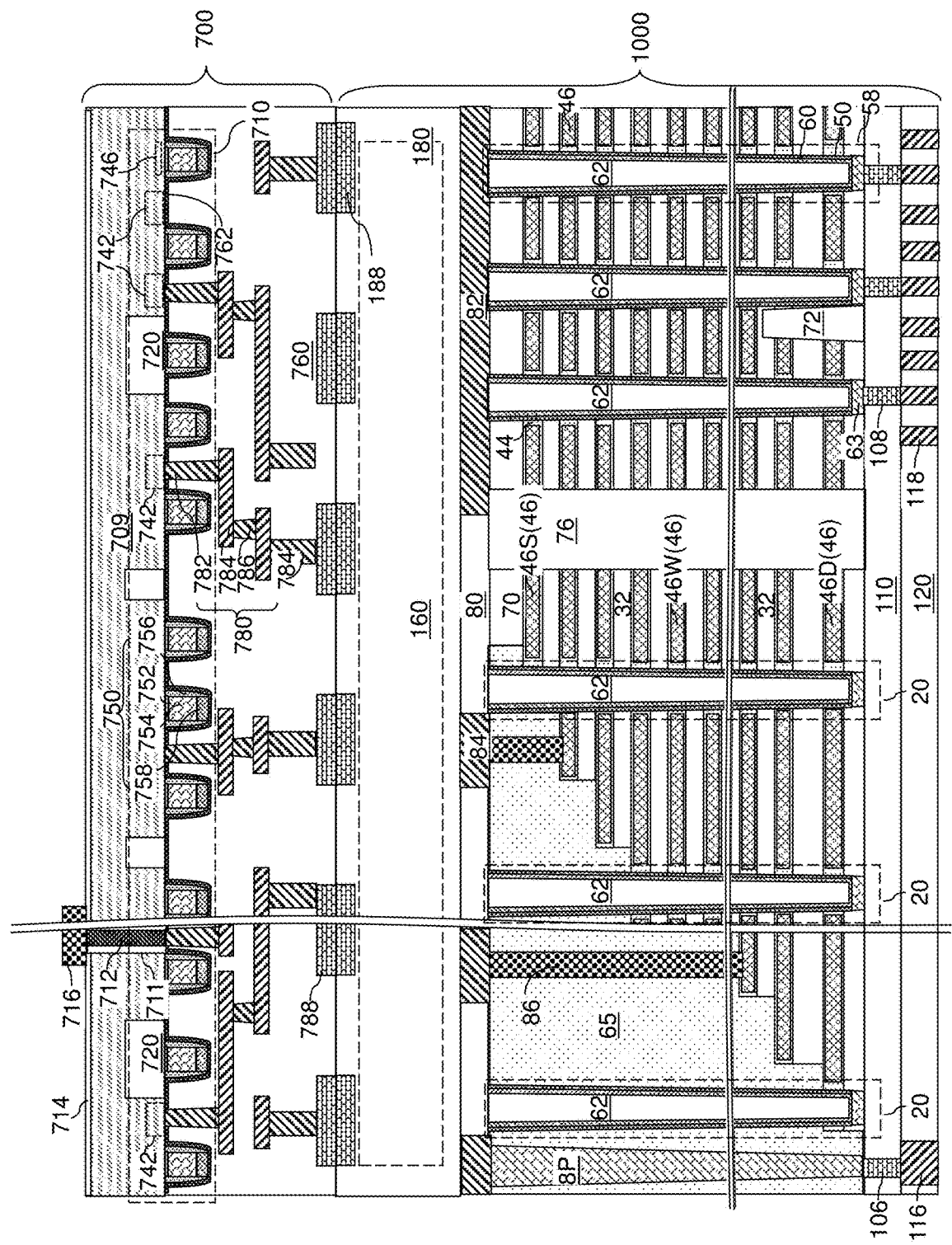
FIG. 20A is a schematic vertical cross-sectional view of the first exemplary structure after formation of bit-lines and backside metal interconnect structures according to the first embodiment of the present disclosure.
Figure 20B:
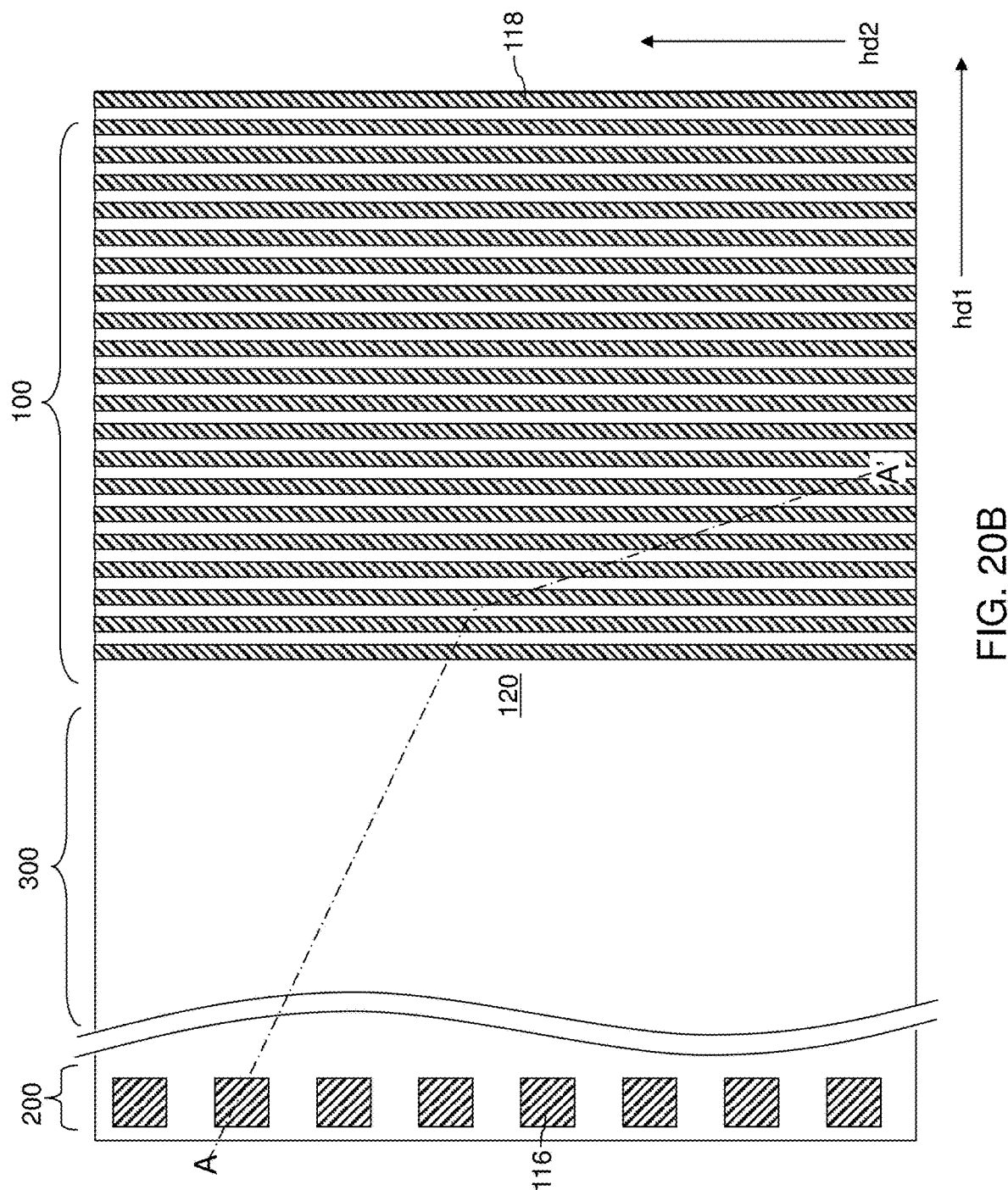
FIG. 20B is a bottom-up view of the first exemplary structure of FIG. 20A.

Referring to FIGS. 20A and 20B, a drain-side dielectric layer 110 can be formed by depositing a dielectric material on physically exposed surfaces of an insulating layer 32 and drain-select-level isolation structures 72. Backside via structures (108, 106) can be formed through the drain-side dielectric layer 110. The backside via structures (108, 106) can include drain contact via structures 108 contacting a respective one of the drain regions 63, and backside interconnection via structures 106 contacting a respective one of the through-memory-level connection via structures 8P.

A bit-line-level dielectric layer 120 can be formed by depositing a dielectric material on the drain-side dielectric layer 110. Bit-line-level metal interconnect structures (108, 106) can be formed through the bit-line-level dielectric layer 120. The bit-line-level metal interconnect structures (118, 116) can include bit lines 118 contacting a respective one of the drain contact via structures 108, and backside metal lines contacting a respective one of the backside interconnection via structures 106.

Each of the bit lines 118 can be electrically connected to a respective subset of the drain regions 63. The drain contact via structures 108 are embedded in the drain-side dielectric layer 110, and contact a respective one of the drain regions 63. The bit lines 118 are embedded in the bit-line-level dielectric layer 120, laterally extend along the second horizontal direction (e.g., bit line direction) hd2 that is perpendicular to the first horizontal direction hd1, and are electrically connected to a respective subset of the drain contact via structures 108.

According to the first embodiment, a three-dimensional memory device comprises a memory die 1000. The memory die 1000 comprises an alternating stack of insulating layers 32 and electrically conductive layers 46 extending along a first horizontal direction hd1 and located between a drain-side dielectric layer 110 and a source-side dielectric layer 80, memory openings 49 vertically extending through the alternating stack, wherein each of the memory openings has a greater lateral dimension at an interface with the source-side dielectric layer 80 than at an interface with the drain-side dielectric layer 110, memory opening fill structures 58 located in the memory openings 49, wherein each of the memory opening fill structures 58 comprises a vertical semiconductor channel 60, a vertical stack of memory elements located in the memory film 50 at levels of the electrically conductive layers 46, and a drain region 63 contacting an end portion of the vertical semiconductor channel 60, and drain-select-level isolation structures 72 laterally extending along the first horizontal direction hd1, vertically extending through at least one electrically conductive layer 46D of the electrically conductive layers 46, and contacting the drain-side dielectric layer 110.

In one aspect of the first embodiment, the memory die 1000 further comprises a source layer 82 contacting another end portion of each of the vertical semiconductor channels 60 and embedded within the source-side dielectric layer 80. In one aspect of the first embodiment, the memory die further comprises a pair of backside trenches 79 vertically extending through the alternating stack and laterally extending along the first horizontal direction hd1, and backside trench fill structures 76 located in the backside trenches 79, wherein the memory openings 49 and the source layer 82 are located between the pair of backside trenches 79.

In one aspect of the first embodiment, the source layer 82 comprises a polycrystalline semiconductor layer (e.g., a heavily doped polysilicon layer) and/or a metallic layer (e.g., metal, metal nitride and/or metal silicide layer). In one aspect of the first embodiment, the memory die 1000 further comprises drain contact via structures 108 embedded in the drain-side dielectric layer 110 and contacting a respective one of the drain regions 63, and bit lines 118 embedded in a bit-line-level dielectric layer 120, laterally extending along a second horizontal direction hd2 that is perpendicular to the first horizontal direction hd1, and electrically connected to a respective subset of the drain contact via structures 108. In one aspect of the first embodiment, each of the drain-select-level isolation structures 72 has a respective tapered vertical cross-sectional profile in which a width at an interface with the drain-side dielectric layer 110 has a greater width than a width at a horizontal interface with one of the insulating layers 32.

In one aspect of the first embodiment, a logic die 700 including a peripheral circuit is bonded to the source-side dielectric layer 80 side of the memory die 1000. In one aspect of the first embodiment, the memory die 1000 further comprises at least one memory-side dielectric material layer 160 embedding memory-side metal interconnect structures 180 and located on the source-side dielectric layer 80. In one aspect of the first embodiment, memory-side bonding pads 188 are embedded in the memory-side dielectric material layer 160, and logic-side bonding pads 788 are embedded in at least one logic-side dielectric material layer 760 and are bonded to the memory-side bonding pads 188 by metal-to-metal bonding.

In one aspect of the first embodiment, the electrically conductive layers 46 comprise drain side select gate electrodes 46D, source side select gate electrodes 46S, and word lines 46W located between the drain side select gate electrodes and the source side select gate electrodes, and the drain-select-level isolation structures 72 vertically extend through the at least one electrically conductive layer which comprises the drain side select gate electrode 46D.

In one aspect of the first embodiment, each of the memory opening fill structures 58 comprises a memory film 50 including a layer stack that comprises a tunneling dielectric layer 56 and a charge storage layer 54, and each of the vertical stacks of memory elements comprises portions of a respective one of the charge storage layers 54 that are located at levels of the electrically conductive layers 46. In one aspect of the first embodiment, each of the drain regions 63 contacts a horizontal end surface of a respective one of the vertical semiconductor channels 60 and contacts an annular end surface of a respective one of the memory films 50.

In one aspect of the first embodiment, the memory die 1000 further comprises a contact region 300 in which the electrically conductive layers 46 have lateral extents that decreases with a vertical distance from a horizontal plane including the interfaces between the memory openings 49 and the drain-side dielectric layer 110, a stepped dielectric material portion 65 contacts stepped surfaces of the alternating stack in the contact region 300, and layer contact via structures 86 vertically extend through the stepped dielectric material portion 65 and contact a respective one of the electrically conductive layers 46.

Referring to FIG. 21, a second exemplary structure according to a second embodiment of the present disclosure includes a substrate semiconductor layer 9, and a first layer stack including at least one first insulating layer 32 and at least one first sacrificial material layer 42. Each first insulating layer 32 can have the same material composition and the same thickness as an insulating layer 32 described above. Each first sacrificial material layer 42 can have the same material composition and the same thickness as a sacrificial material layer 42. The at least one first sacrificial material layer 42 may include a single sacrificial material layer 42, or a plurality of sacrificial material layers 42. The total number of the first sacrificial material layer(s) 42 may be in a range from 1 to 8, such as from 2 to 4.

Figure 22B:
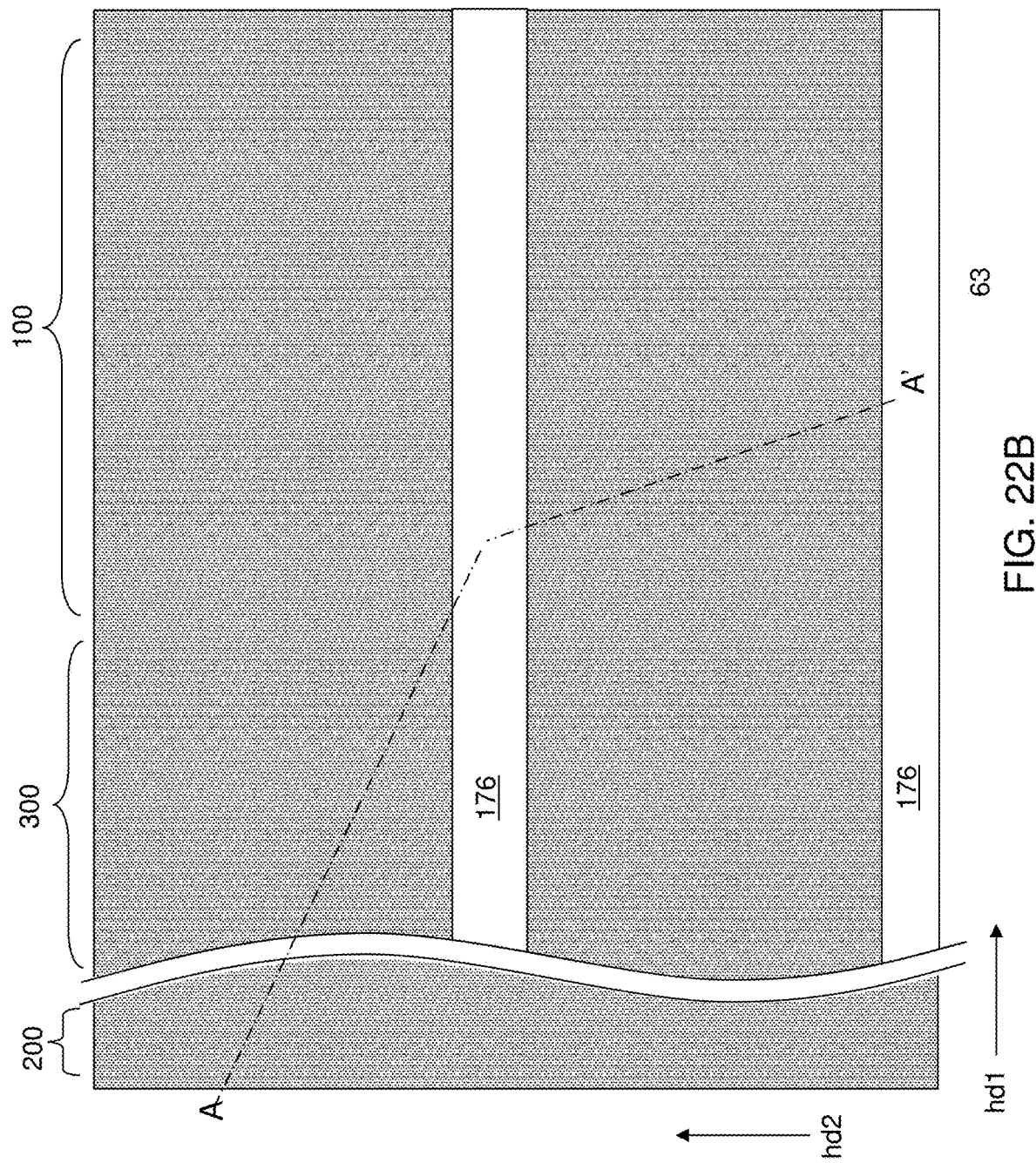
FIG. 22B is a top-down view of the second exemplary structure of FIG. 22A.

Referring to FIGS. 22A and 22B, backside dielectric rails 176 can be formed through the first layer stack of the first insulating layers 32 and the first sacrificial material layers 42. The pattern of the backside dielectric rails 176 can be the same as the pattern of the backside trenches 79 described above. The backside dielectric rails 176 can be formed by forming trenches extending through the first layer stack (32, 42), and by filling the trenches with a dielectric material. The backside dielectric rails 176 includes a dielectric material that is different from the material of the at least one first sacrificial material layer 42. In one embodiment, the backside dielectric rails 176 can include silicon oxide. The backside dielectric rails 176 can vertically extend through the at least one first insulating layer 32 and the at least one sacrificial material layer 42. The width of the backside dielectric rails 176 along the second horizontal direction hd2 can be greater than the width of each backside trench 79 to be subsequently formed.

In one embodiment, each of the backside dielectric rails 176 has a respective trapezoidal vertical cross-sectional profile within a vertical plane that is perpendicular to the first horizontal direction hd1. In one embodiment, each of the backside dielectric rails 176 has a lesser width within an horizontal plane including an interface with the substrate semiconductor layer 9 than within a horizontal plane including a topmost surface of the first layer stack (32, 42).

Figure 23A:
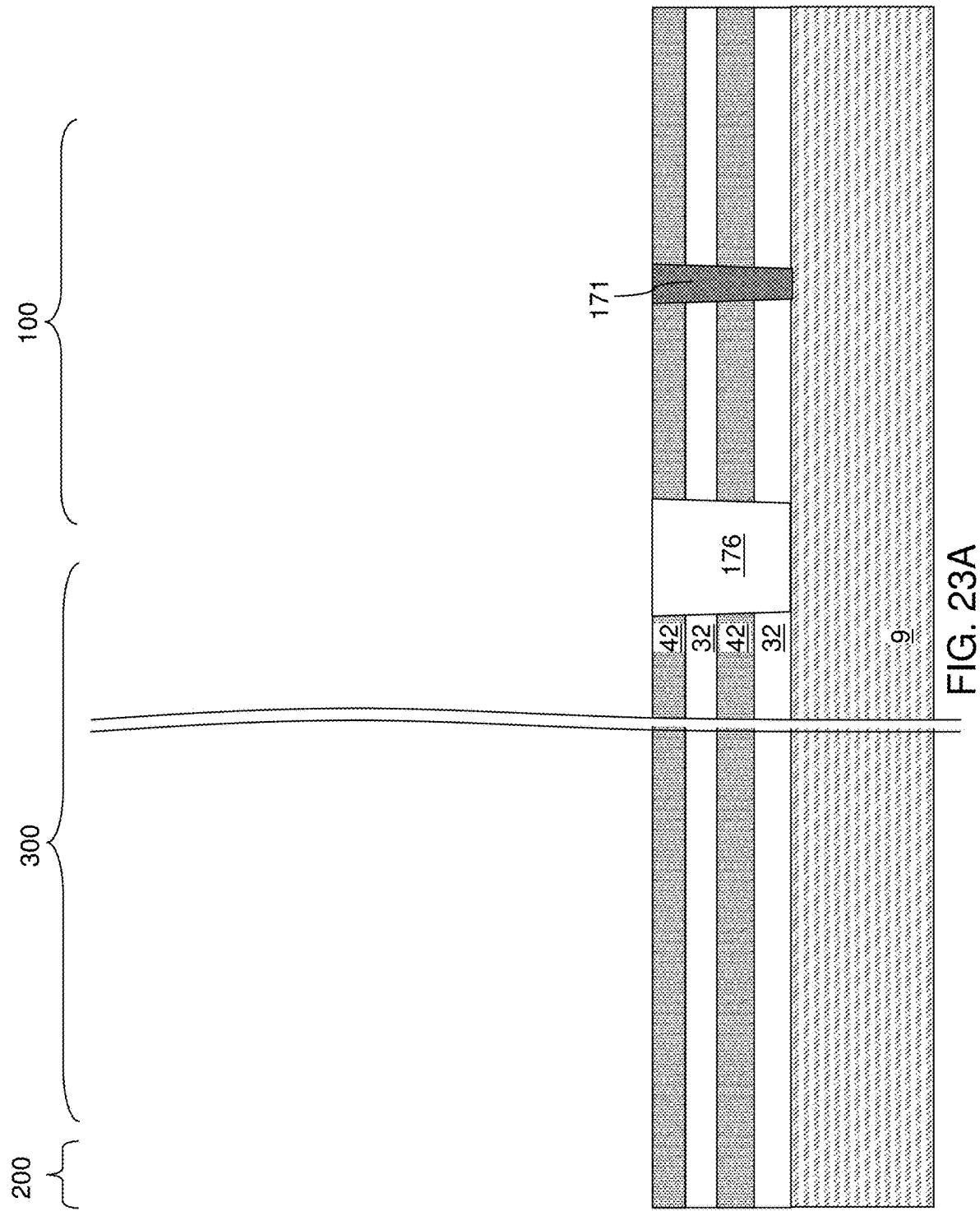
FIG. 23A is a schematic vertical cross-sectional view of a second exemplary structure after formation of drain-select-level sacrificial rail structures according to a second embodiment of the present disclosure.
Figure 23B:
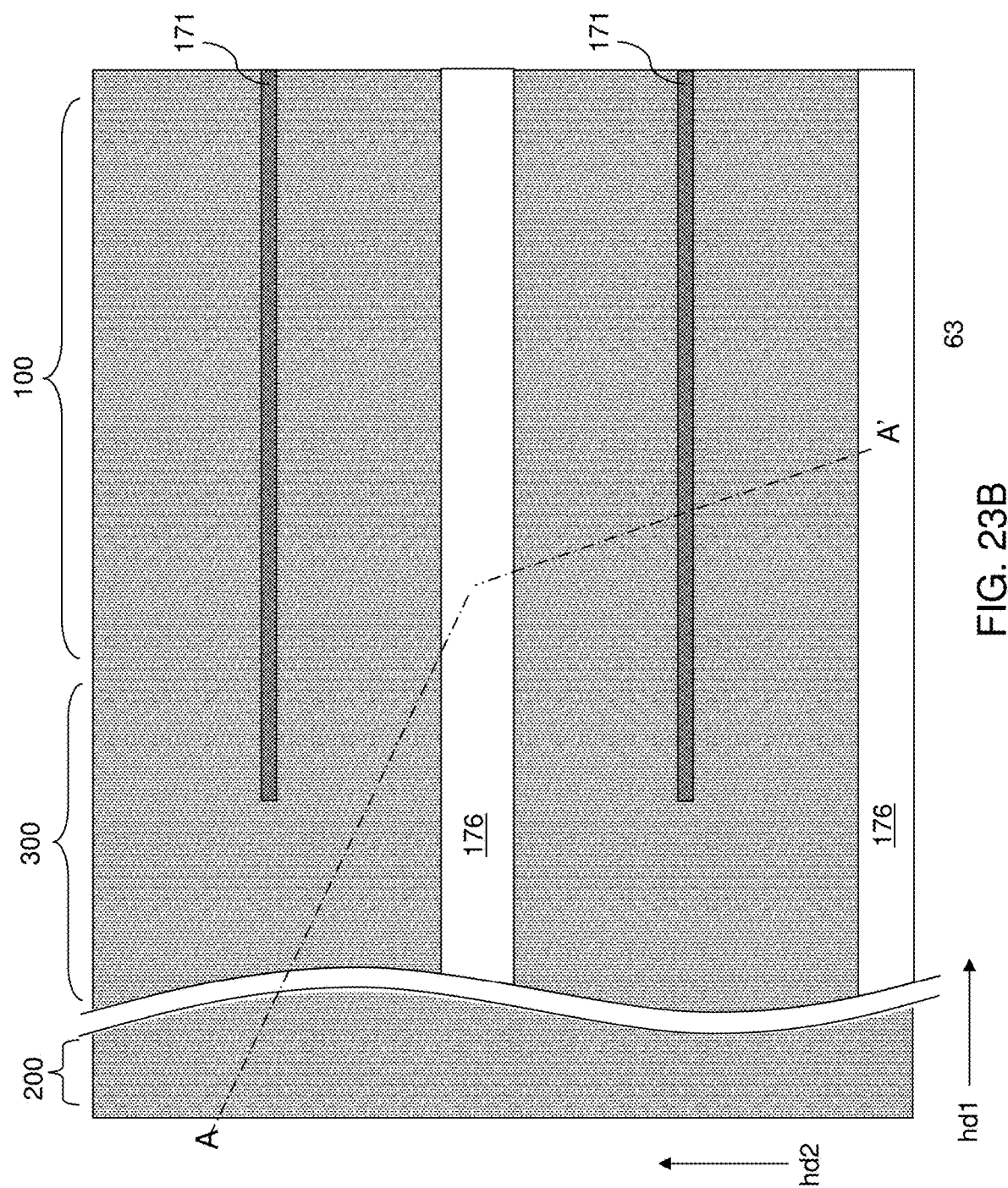
FIG. 23B is a top-down view of the second exemplary structure of FIG. 22A.

Referring to FIGS. 23A and 23B, drain-select-level sacrificial rail structures 171 can be formed through the first layer stack of the first insulating layers 32 and the first sacrificial material layers 42. The pattern of the drain-select-level sacrificial rail structures 171 can be the same as the pattern of the drain-select-level isolation structures 72 described above. The drain-select-level sacrificial rail structures 171 can be formed by forming trenches extending through the first layer stack (32, 42), and by filling the trenches with a sacrificial material. In one embodiment, the drain-select-level sacrificial rail structures 171 can include the same material as the first sacrificial material layers. In one embodiment, the drain-select-level sacrificial rail structures 171 may include silicon nitride. The drain-select-level sacrificial rail structures 171 can vertically extend through the at least one first insulating layer 32 and the at least one sacrificial material layer 42. The depth of the trench filled with the drain-select-level sacrificial rail structures 171 is precisely controlled because the trench is formed through all of the first sacrificial material layers 42 that will be replaced by drain side select gate electrodes and before formation of any second sacrificial material layers which will be separately replaced with word lines.

In one embodiment, each of the drain-select-level sacrificial rail structures 171 has a respective trapezoidal vertical cross-sectional profile within a vertical plane that is perpendicular to the first horizontal direction hd1. In one embodiment, each of the drain-select-level sacrificial rail structures 171 has a lesser width within an horizontal plane including an interface with the substrate semiconductor layer 9 than within a horizontal plane including a topmost surface of the first layer stack (32, 42).

Figure 24:
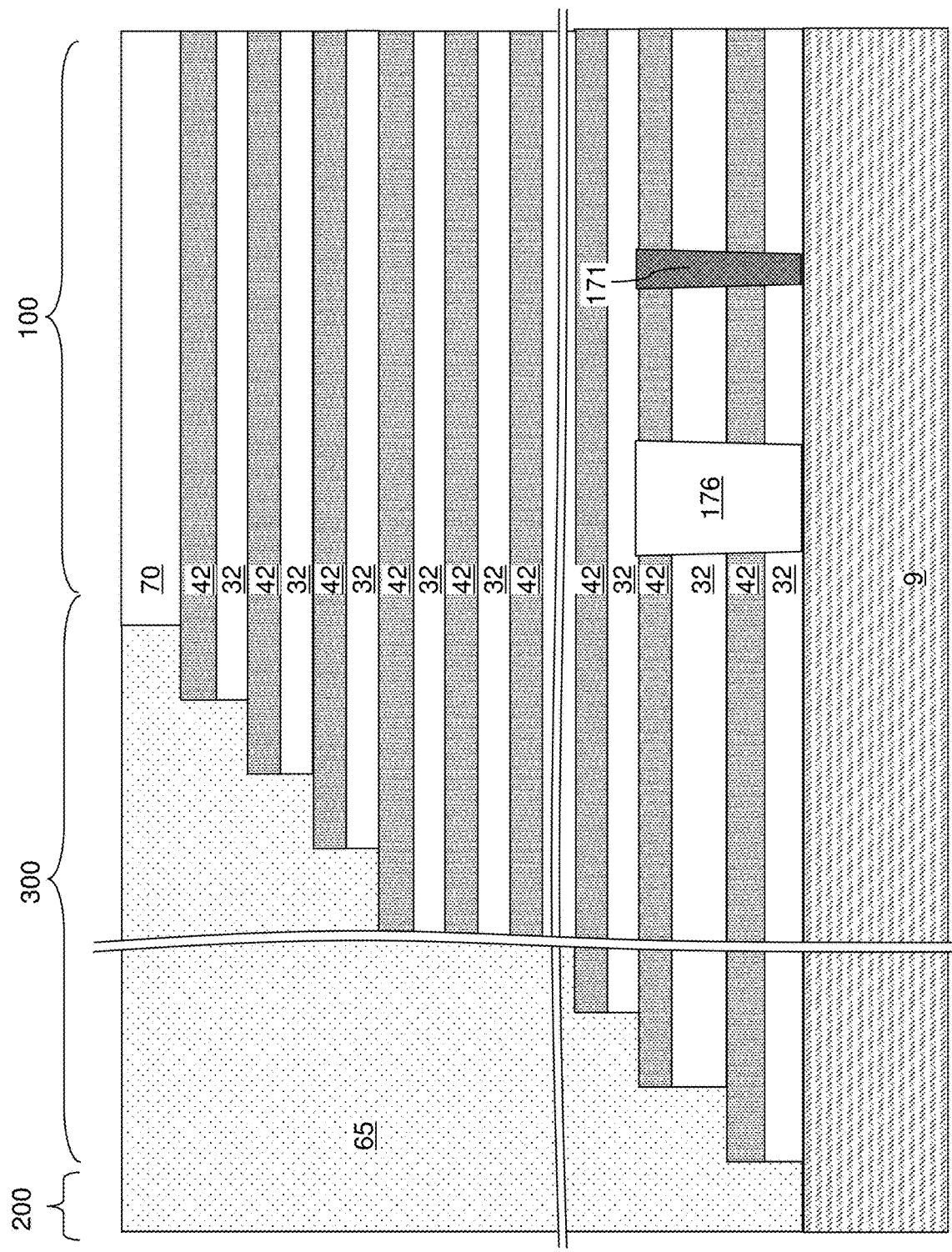
FIG. 24 is a schematic vertical cross-sectional view of the second exemplary structure after formation of a second layer stack of second insulating layers and second sacrificial material layers, stepped surfaces, and a stepped dielectric material portion according to the second embodiment of the present disclosure.

Referring to FIG. 24, a second layer stack of second insulating layers 32 and second sacrificial material layers 42 can be formed over the first layer stack (32, 42). The total number of the first insulating layers 32 and the second insulating layers 32 may be in the same range as the total number of the insulating layers 32 in the first exemplary structure. The total number of the first sacrificial material layers 42 and the second sacrificial material layers 42 can be the same as the total number of the sacrificial material layers 42 in the first exemplary structure. Subsequently, an insulating cap layer 70 can be formed over the second layer stack (32, 42).

Figure 2:
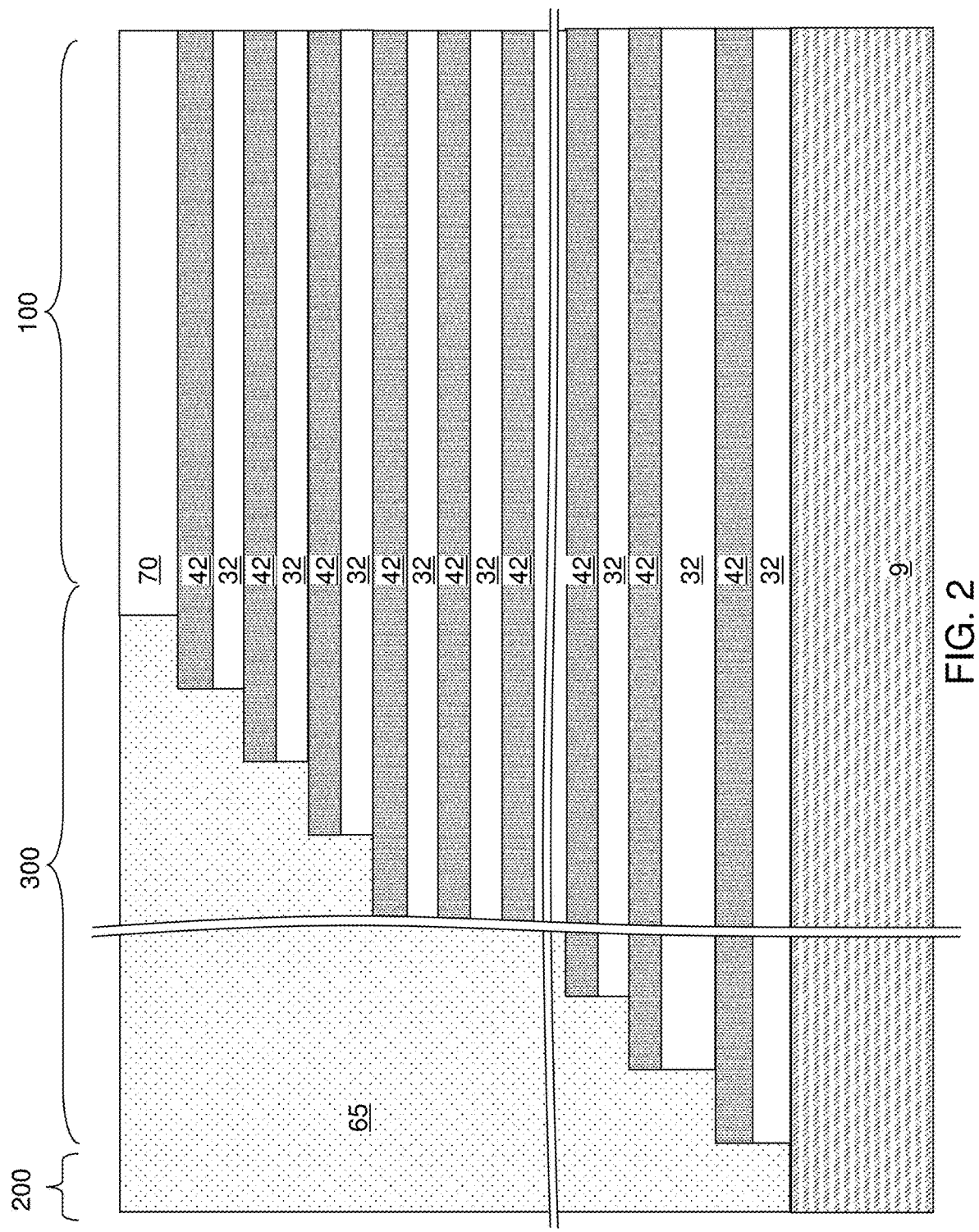
FIG. 2 is a schematic vertical cross-sectional view of the first exemplary structure after formation of stepped surfaces and a stepped dielectric material portion according to the first embodiment of the present disclosure.

Subsequently, the processing steps of FIG. 2 can be performed to form stepped surfaces and a stepped dielectric material portion 65.

Figure 25A:
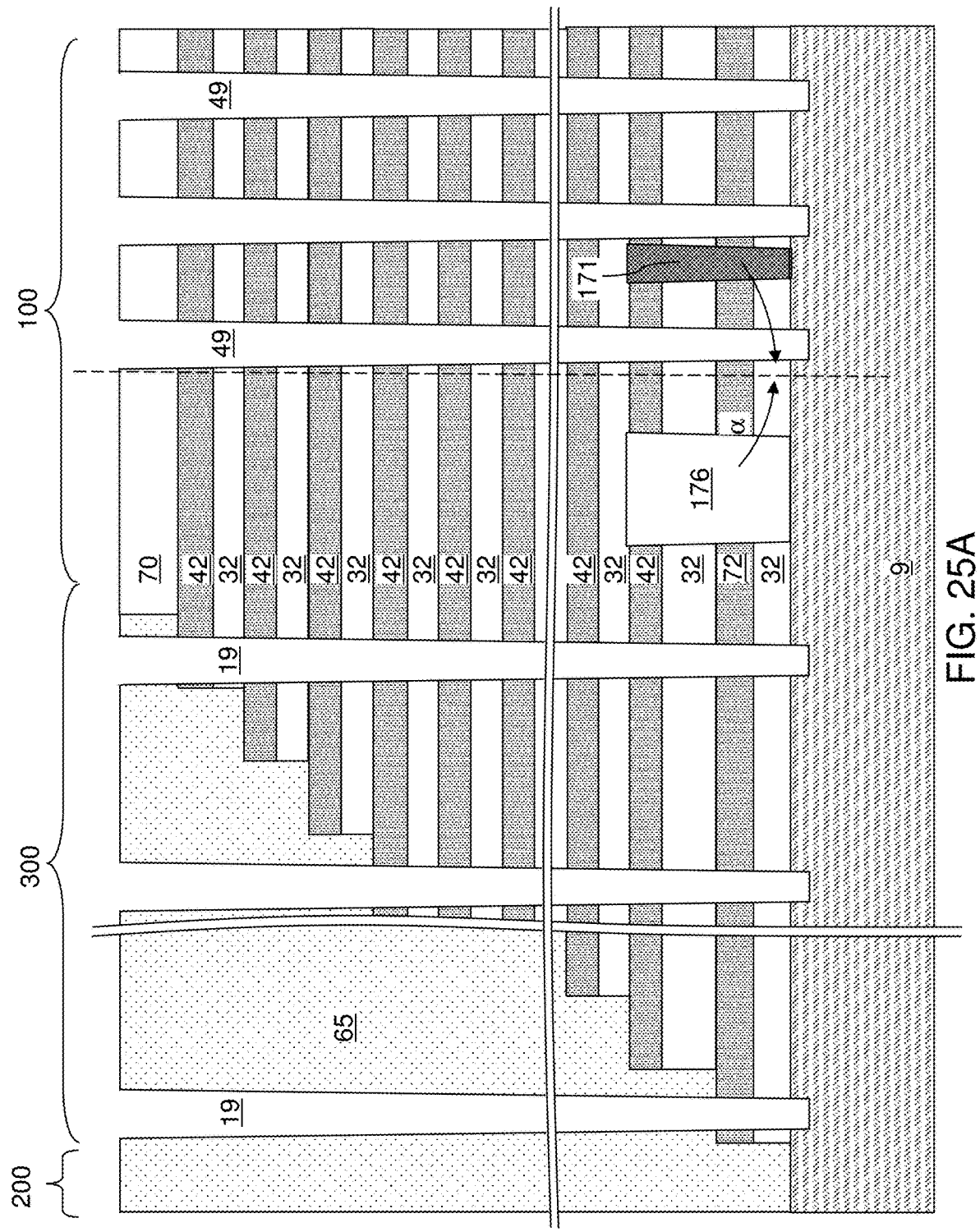
FIG. 25A is a schematic vertical cross-sectional view of the second exemplary structure after formation of memory openings and support openings according to the second embodiment of the present disclosure.
Figure 25B:
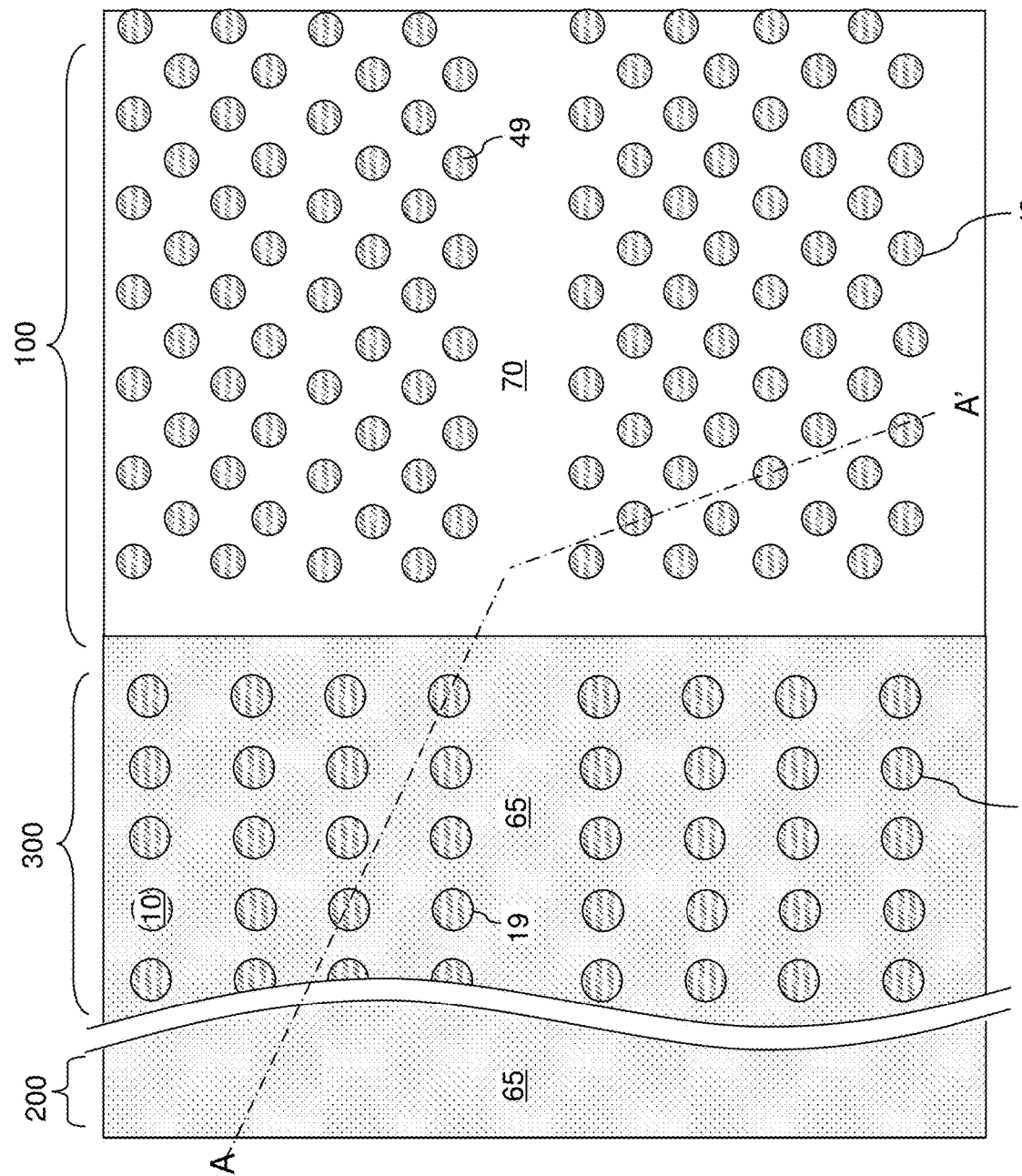
FIG. 25B is a top-down view of the second exemplary structure of FIG. 25A. The vertical plane A-A' is the plane of the cross-section for FIG. 25A.

Referring to FIGS. 25A and 25B, the processing steps of FIGS. 3A and 3B can be performed to form memory openings 49 and support openings 19. The pattern of the memory openings 49 and the support openings 19 can be the same as in the first exemplary structure. According to an aspect of the present disclosure, the memory openings 49 can be formed as rows of memory openings 49 that are arranged along the first horizontal direction hd1. Each of the drain-select-level sacrificial rail structures 171 can be formed between a respective neighboring pair of rows of memory openings 49. The memory openings 49 and the drain-select-level sacrificial rail structures 171 can be arranged such that the memory openings 49 do not cut into the drain-select-level sacrificial rail structures 171. Each of the memory openings 49 can have a greater lateral dimension along the first horizontal direction hd1 and along the second horizontal direction hd2 (e.g., a greater diameter for cylindrical memory openings 49) at an interface with the substrate semiconductor layer 9 than within a horizontal plane including a top surface of the insulating cap layer 70.

Figure 26A:
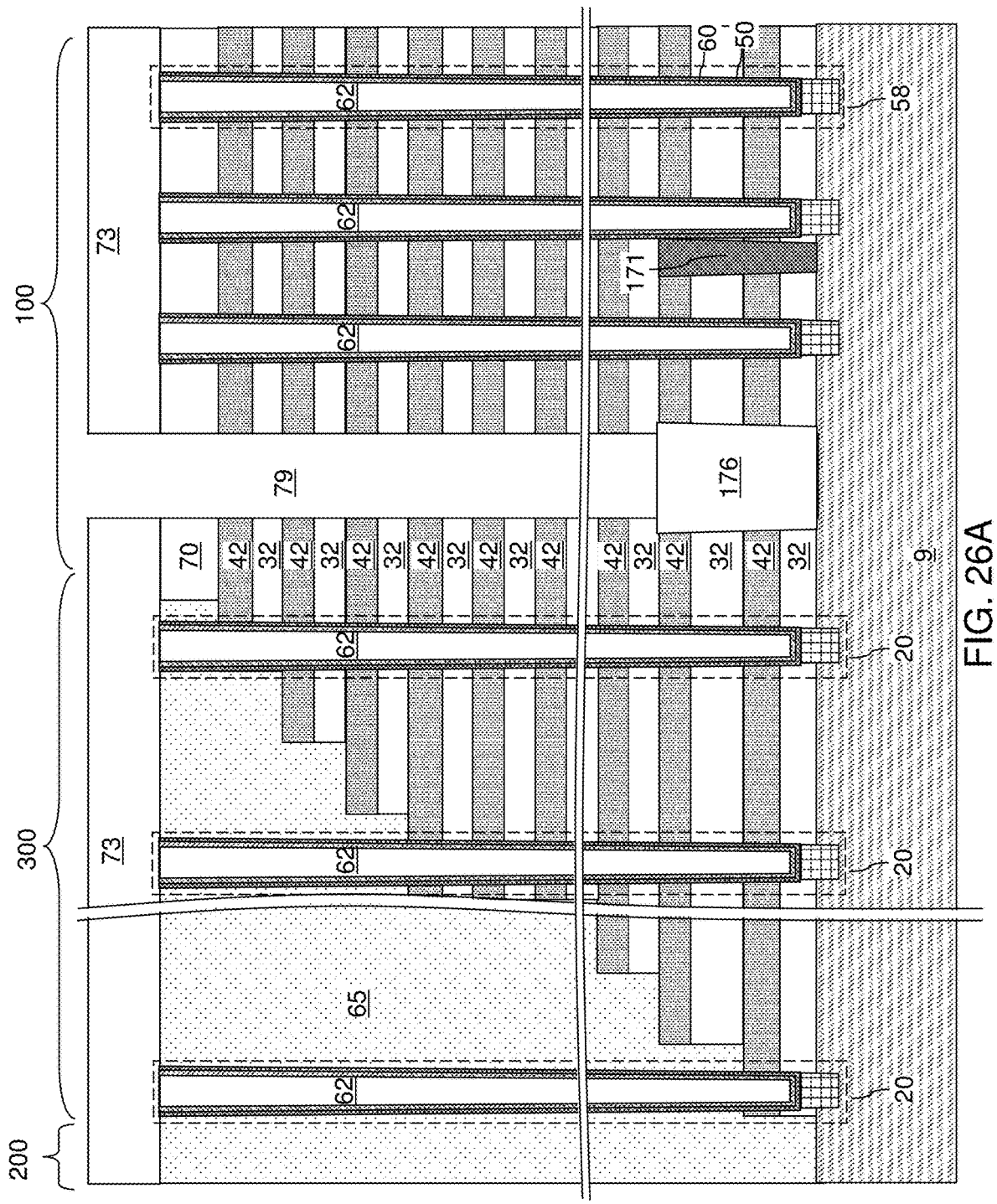
FIG. 26A is a schematic vertical cross-sectional view of the second exemplary structure after formation of memory opening fill structures, support pillar structures, a drain-side dielectric layer, and backside trenches according to the second embodiment of the present disclosure.
Figure 26B:
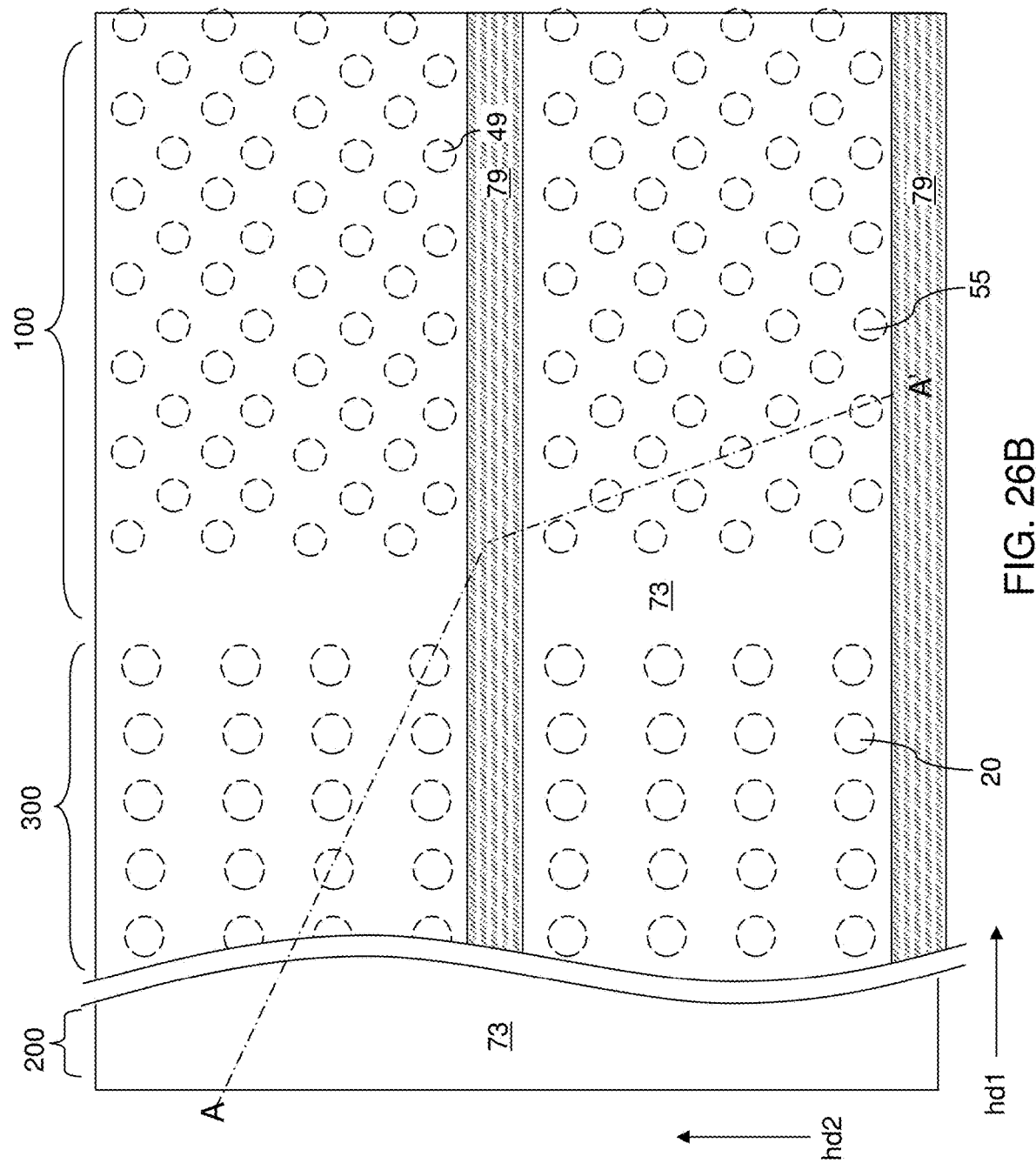
FIG. 26B is a top-down view of the second exemplary structure of FIG. 26A. The vertical plane A-A' is the plane of the cross-section for FIG. 26A.

Referring to FIGS. 26A and 26B, the processing steps of FIGS. 4A-4C, 5, 6A, and 6B can be performed to form memory opening fill structures 58, support pillar structures 20, a sacrificial capping dielectric layer 73, and backside trenches 79. The duration and the chemistry of the anisotropic etch process that forms the backside trenches 79 can be selected such that the bottom surface of each backside trench 79 is formed at a top surface of a respective one of the backside dielectric rails 176. A surface of a respective one of the backside dielectric rails 176 is physically exposed at a bottom of each of the backside trenches 79.

In one embodiment, the memory openings 49 vertically extend through the alternating stack (32, 42) between neighboring pairs of the backside trenches 79 and between neighboring pairs of the backside dielectric rails 176. The memory opening fill structures 58 can be located in the memory openings 49. Each of the memory opening fill structures 58 comprises a vertical semiconductor channel 60 and a vertical stack of memory elements, which can be portions of the charge storage layers 54 located at levels of the second sacrificial material layers 42. In one embodiment, each of the memory opening fill structures 58 comprises a memory film 50 including a layer stack that comprises a tunneling dielectric layer 56 and a charge storage layer 54 and an optional blocking dielectric layer 52. In one embodiment, each of the vertical stacks of memory elements comprises portions of a respective one of the charge storage layers 54 that are located at levels of the second sacrificial material layers 42.

Figure 27:
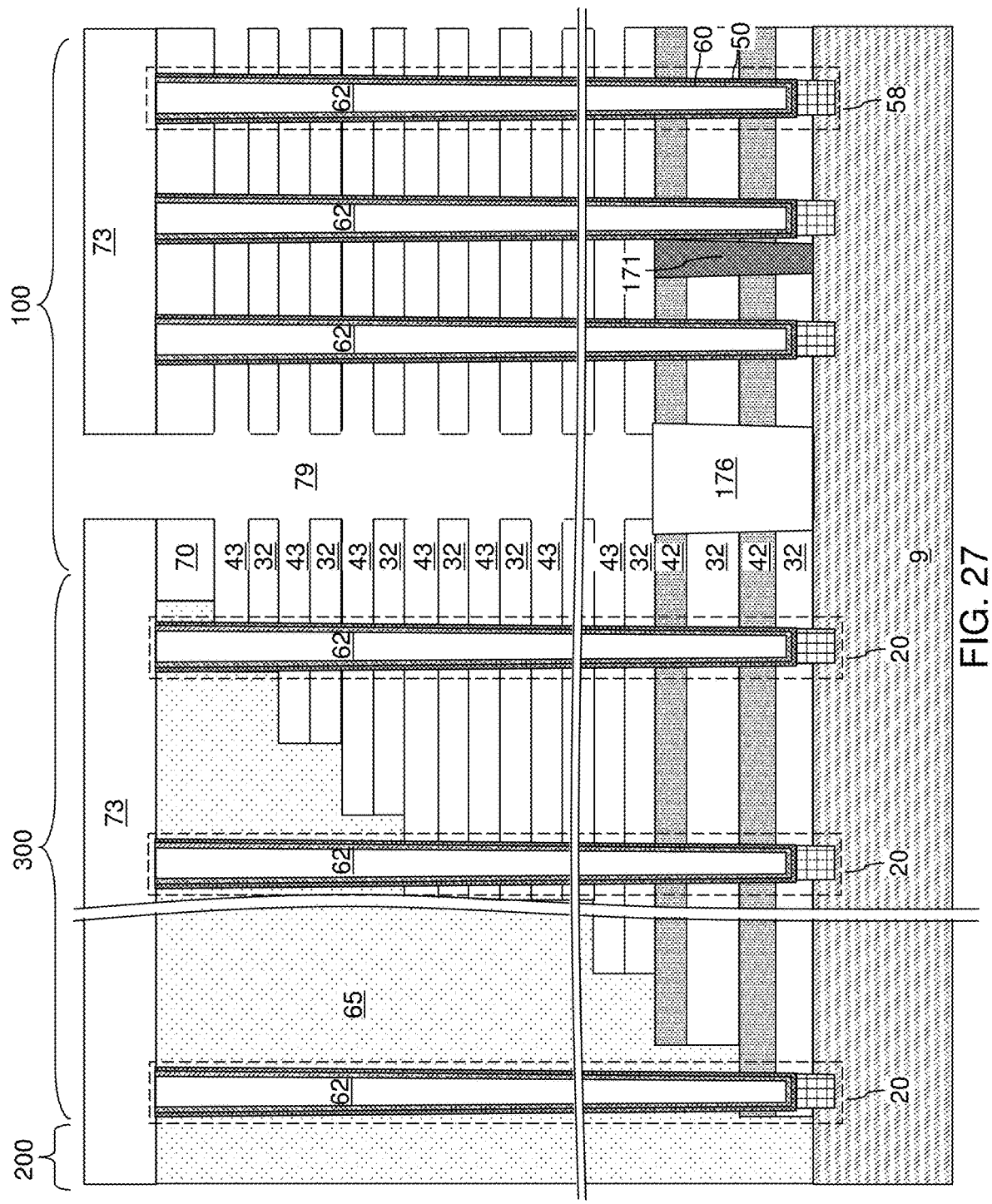
FIG. 27 is a schematic vertical cross-sectional view of the second exemplary structure after formation of backside recesses according to the second embodiment of the present disclosure.

Referring to FIG. 27, the processing steps of FIG. 7 can be performed to remove the second sacrificial material layers 42 selective to the second insulating layers, the insulating cap layer 70, and the backside dielectric rails 176. An isotropic etchant is provided into the backside trenches 79 during the isotropic etch process.

Figure 28:
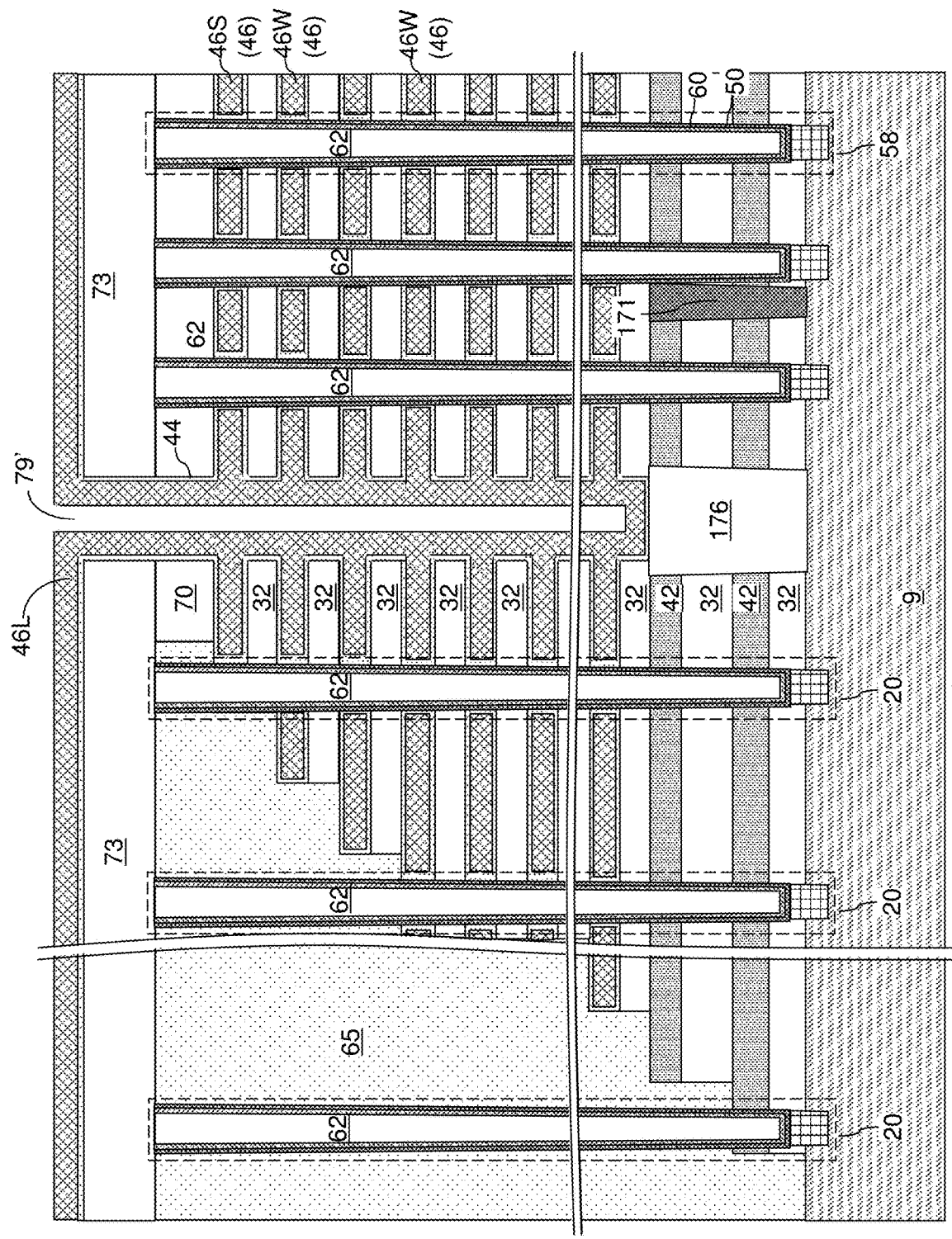
FIG. 28 is a schematic vertical cross-sectional view of the second exemplary structure after formation of electrically conductive layers according to the second embodiment of the present disclosure.

Referring to FIG. 28, the processing steps of FIG. 8 can be performed to form electrically conductive layers 46, which include word lines 46W and source side select gate electrodes. The electrically conductive layers 46 comprise portions of the at least one conductive material that are deposited in the backside recesses 43. The second sacrificial material layers 42 are replaced with the electrically conductive layers 46.

Figure 29A:
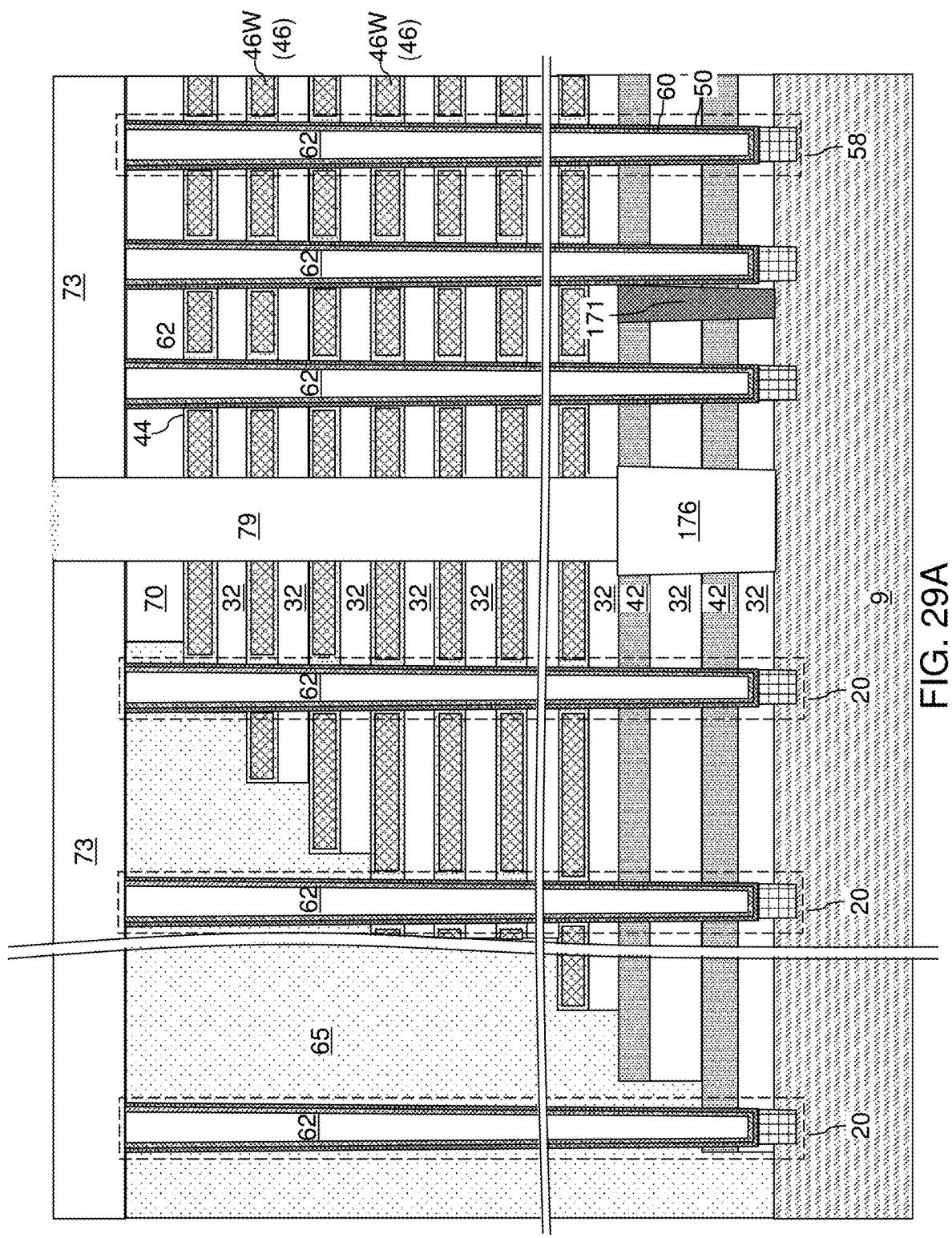
FIG. 29A is a schematic vertical cross-sectional view of the second exemplary structure after removal of a continuous metallic material layer according to the second embodiment of the present disclosure.
Figure 29B:
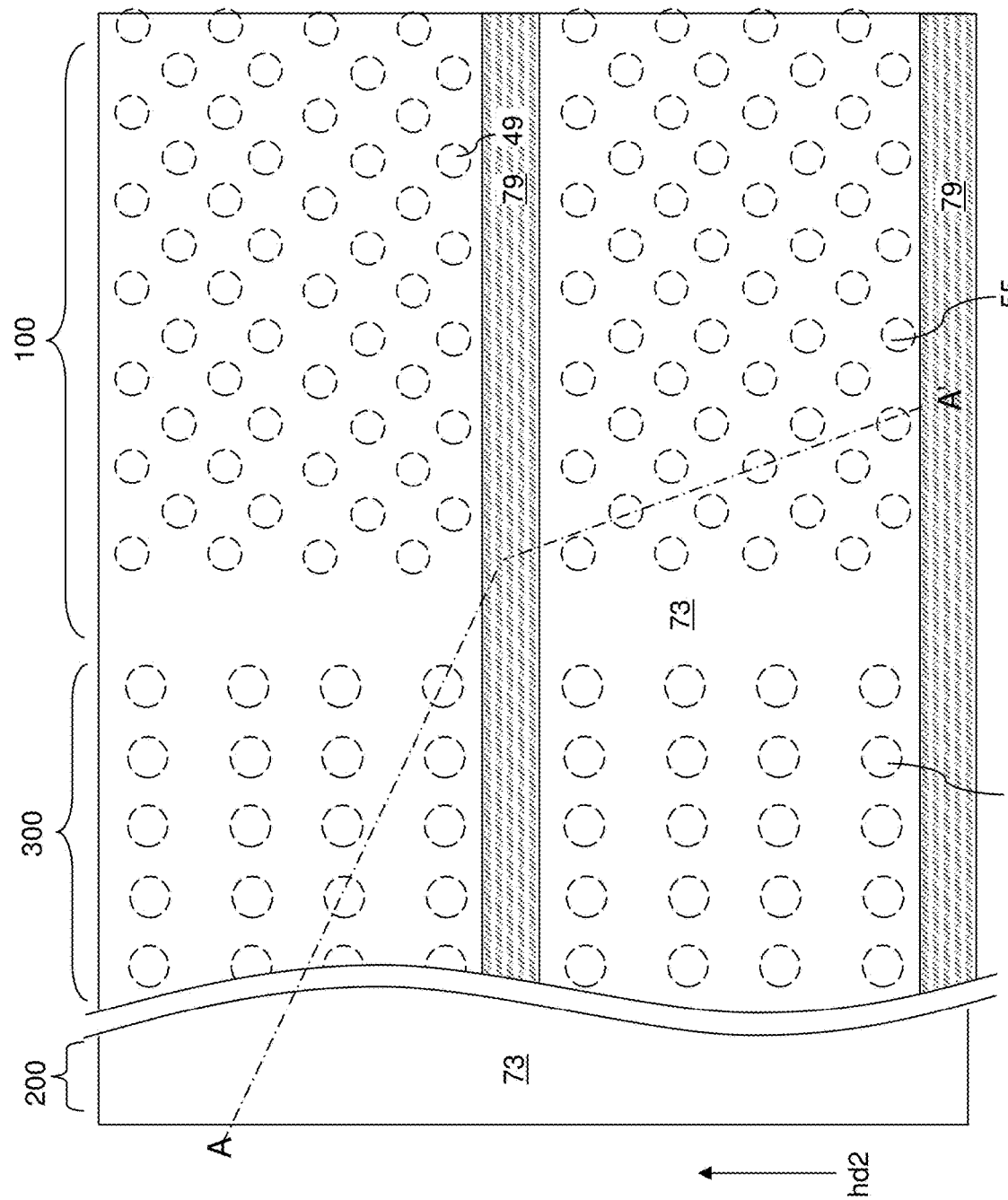
FIG. 29B is a top-down view of the second exemplary structure of FIG. 29A.

Referring to FIGS. 29A and 29B, the processing steps of FIGS. 9A and 9B can be performed to remove the continuous metallic material layer 46L.

Figure 30:
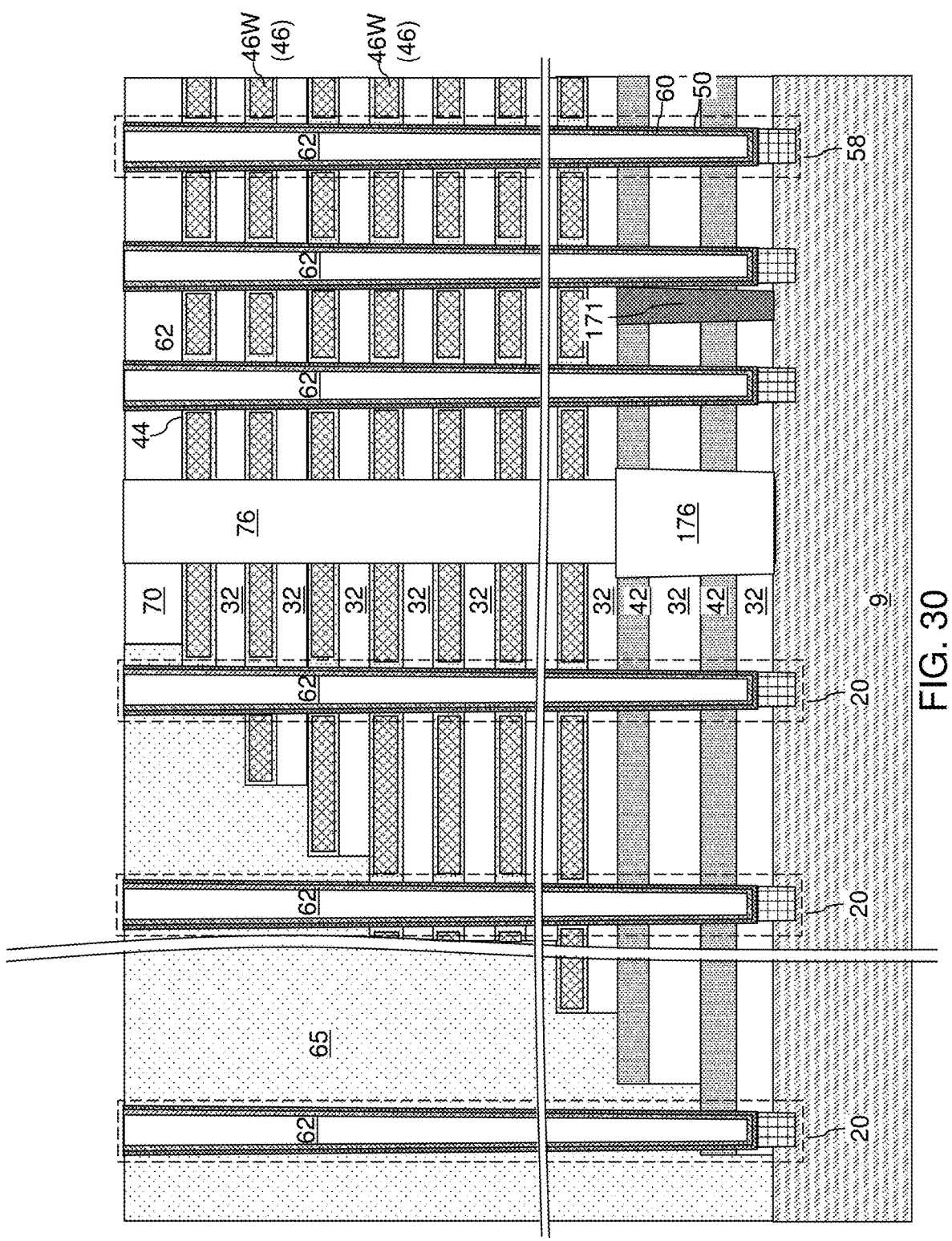
FIG. 30 is a schematic vertical cross-sectional view of the second exemplary structure after formation of backside trench fill structures according to the second embodiment of the present disclosure.

Referring to FIG. 30, the processing steps of FIG. 10 can be performed to form backside trench fill structures 76.

Figure 31A:
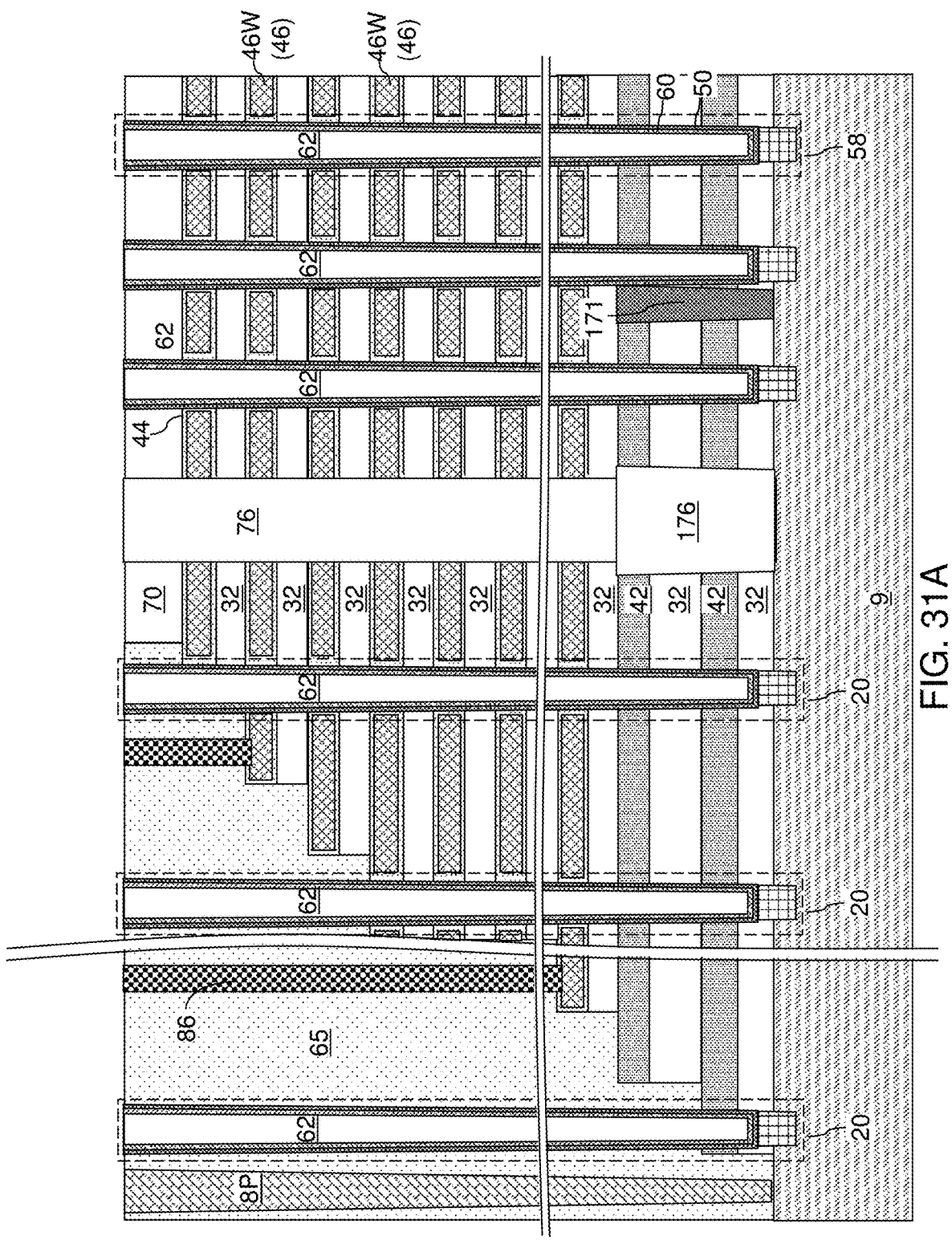
FIG. 31A is a schematic vertical cross-sectional view of the second exemplary structure after formation of layer contact via structures according to the second embodiment of the present disclosure.
Figure 31B:
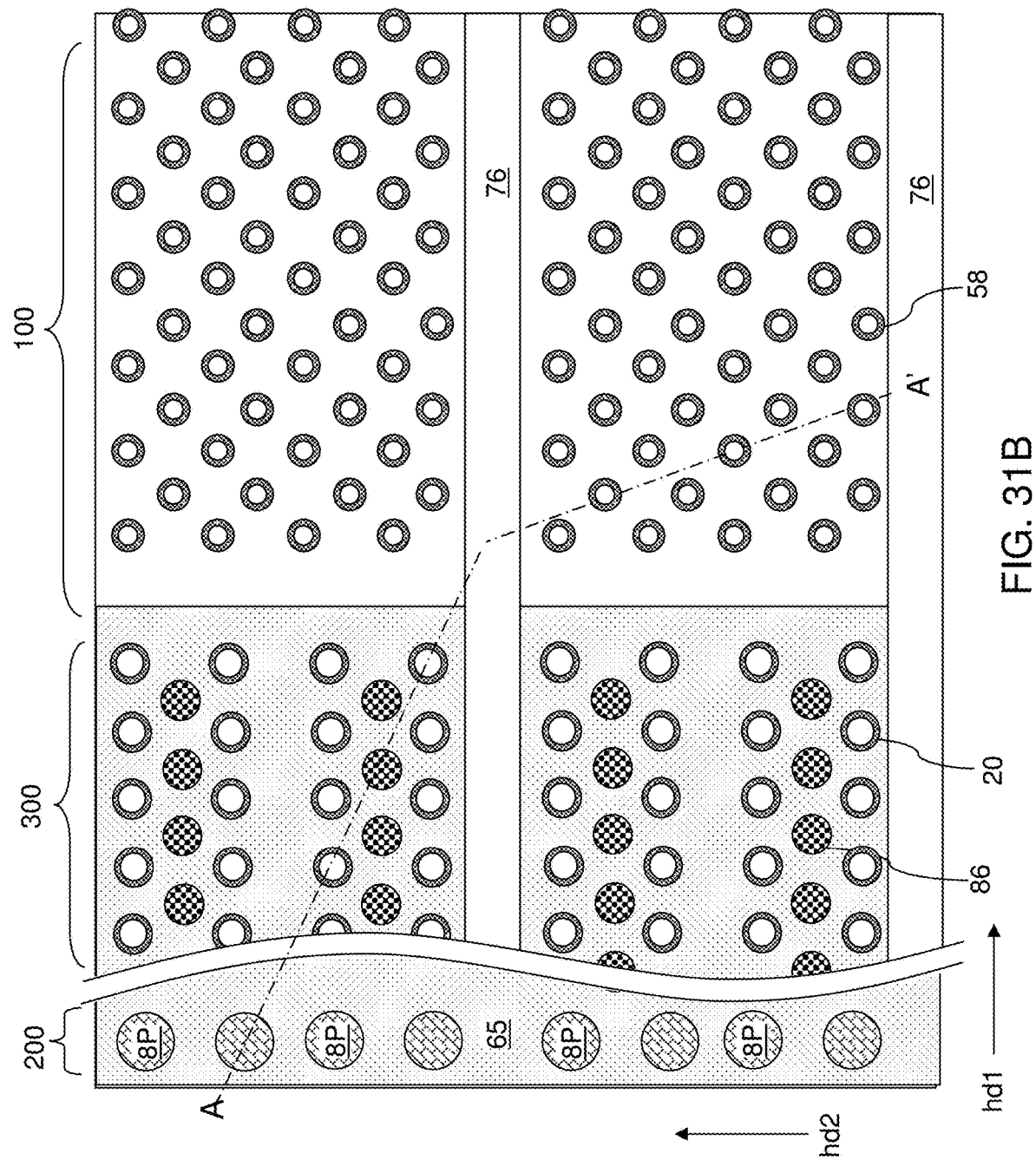
FIG. 31B is a top-down view of the second exemplary structure of FIG. 31A.

Referring to FIGS. 31A and 31B, the processing steps of FIGS. 11A and 11B can be performed to form layer contact via structures 86 and through-memory-level connection via structures 8P.

Figure 32:
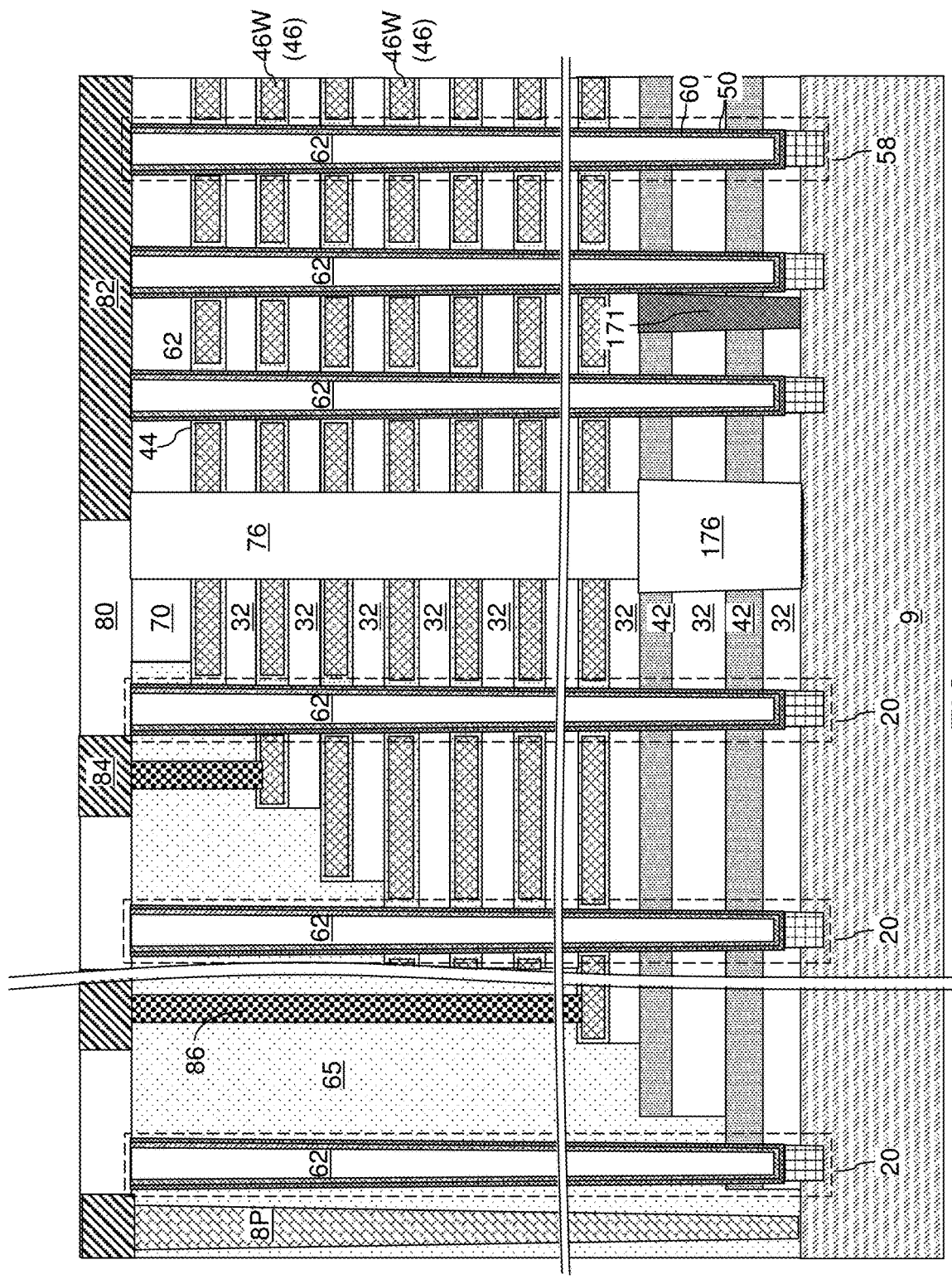
FIG. 32 is a schematic vertical cross-sectional view of the second exemplary structure after formation of a source layer, source-level interconnect structures, and a source-side dielectric layer according to the second embodiment of the present disclosure.

Referring to FIG. 32, the processing steps of FIG. 12 can be performed to form a source-side dielectric layer 80, at least one source layer 82, and source-level metal interconnect structures 84. Each source layer 82 can be formed on first end surfaces of vertical semiconductor channels 60 over an alternating stack of the second insulating layers 32 and the electrically conductive layers 46.

Figure 33:
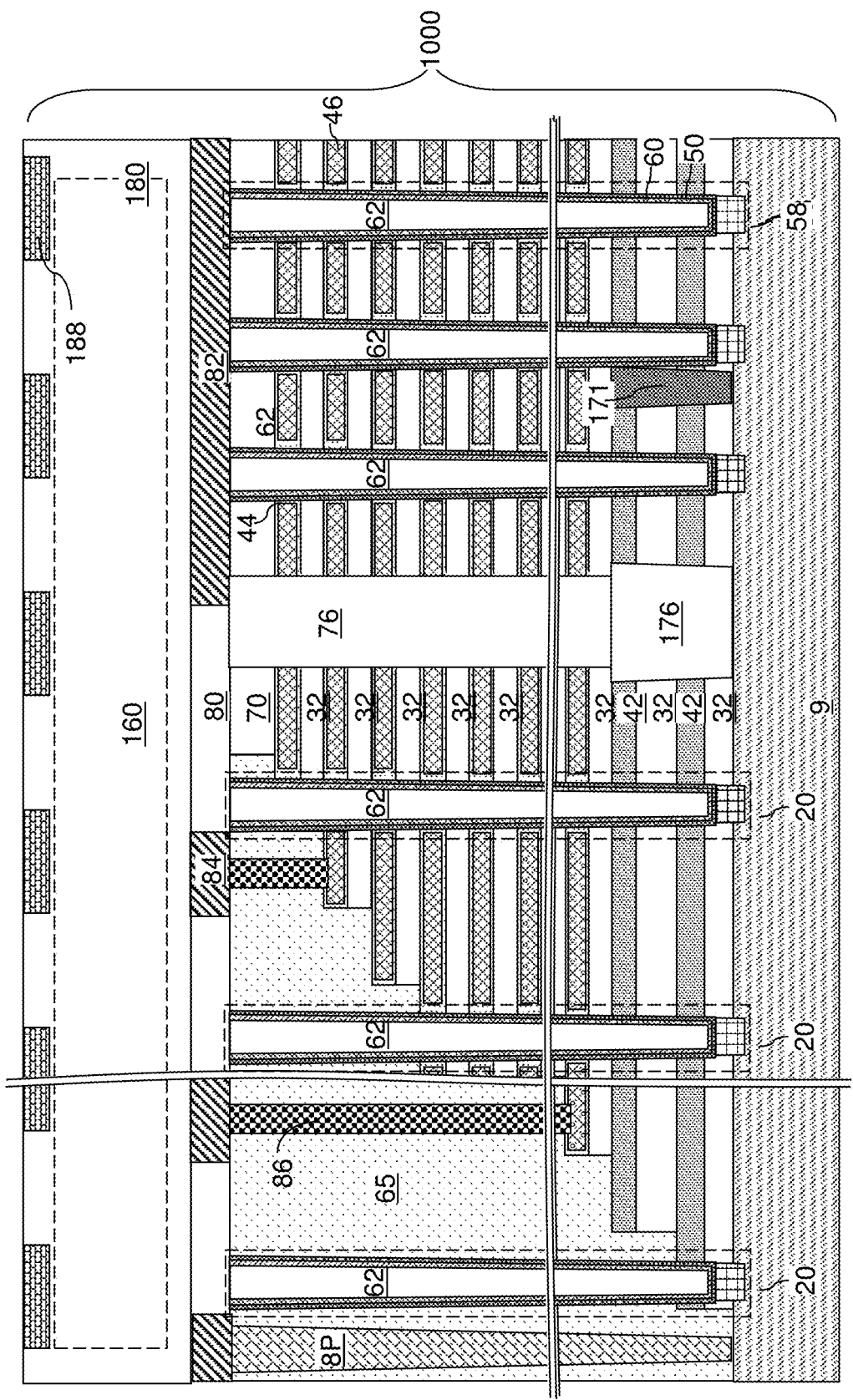
FIG. 33 is a schematic vertical cross-sectional view of the second exemplary structure after formation of memory-side metal interconnect structures and memory-side bonding pads embedded in memory-side dielectric material layers according to the second embodiment of the present disclosure.

Referring to FIG. 33, the processing steps of FIG. 13 can be performed to form memory-side metal interconnect structures 180 and memory-side bonding pads 188 embedded in memory-side dielectric material layers 160. This forms the memory die 1000.

Figure 34:
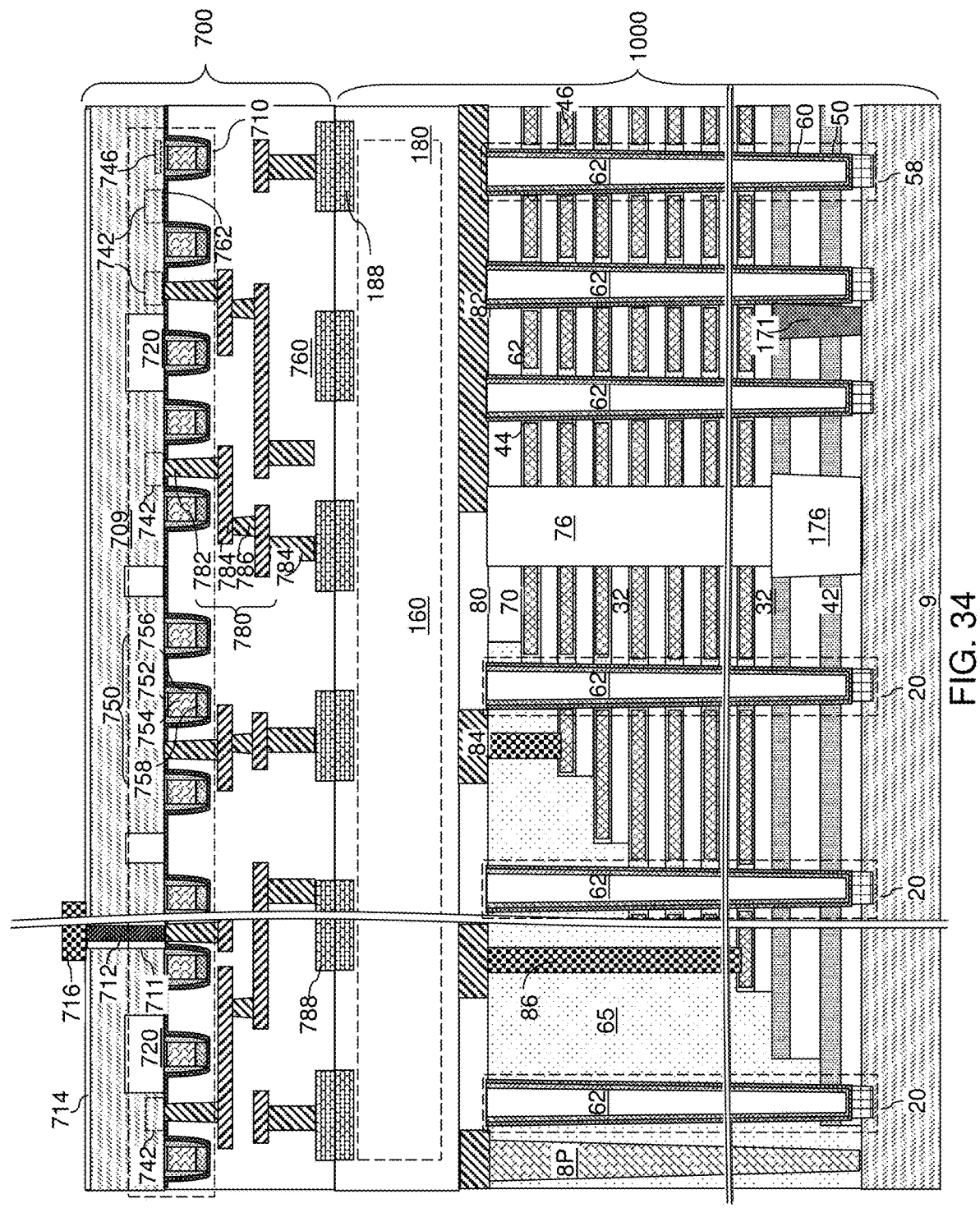
FIG. 34 is a schematic vertical cross-sectional view of the second exemplary structure after attaching a logic die to a memory die according to the second embodiment of the present disclosure.

Referring to FIG. 34, the processing steps of FIG. 14 can be performed to provide a logic die 700, and to form a bonded assembly of the memory die 1000 and the logic die 700. The logic die 700 comprises a peripheral circuit configured to drive the memory devices of the memory die 1000. The logic die 700 is bonded over the source-side dielectric layer 80 side of the memory die1 1000.

Figure 35:
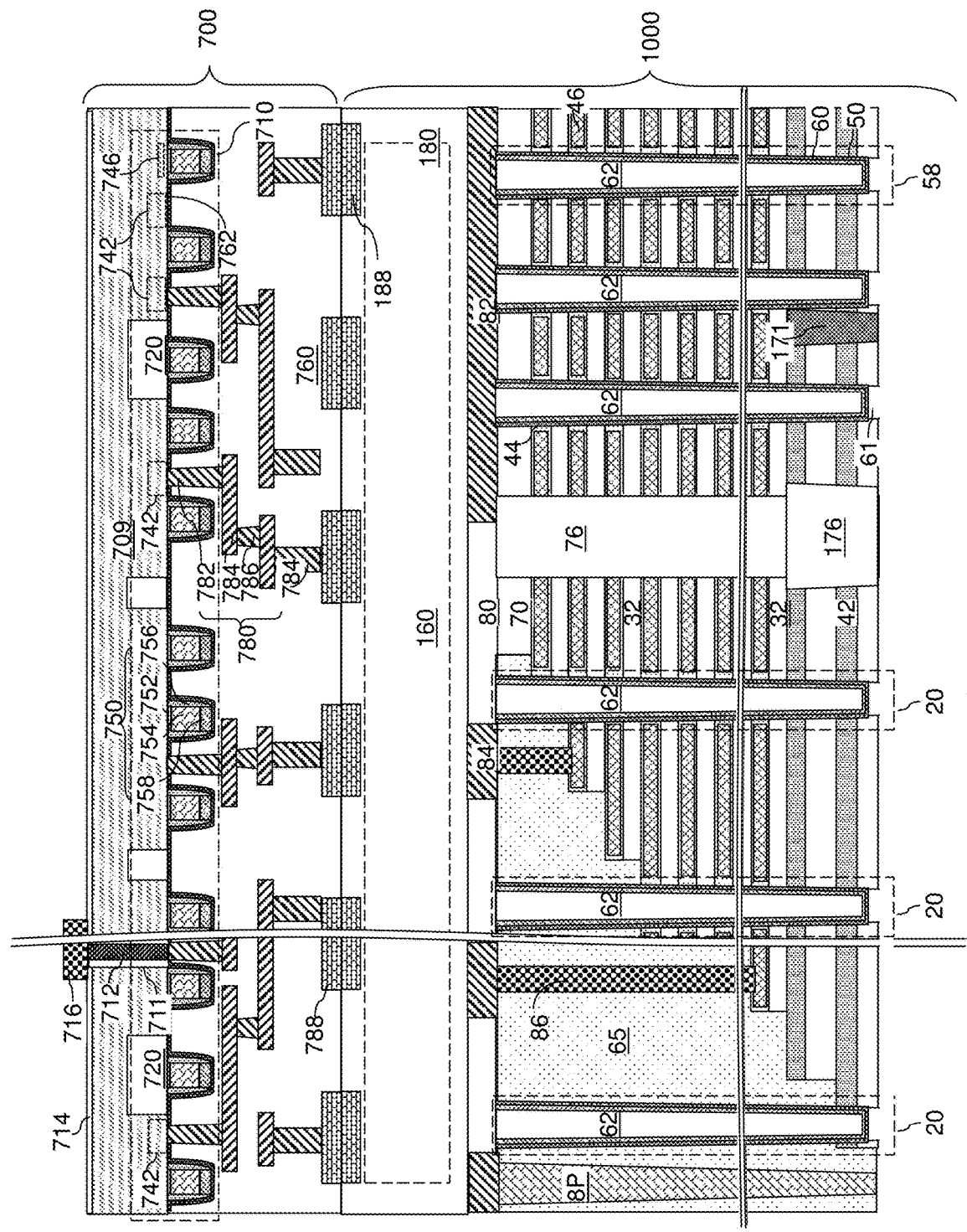
FIG. 35 is a schematic vertical cross-sectional view of the second exemplary structure after removal of a substrate according to the second embodiment of the present disclosure.

Referring to FIG. 35, the processing steps of FIG. 15 can be performed to remove the substrate including the substrate semiconductor layer 9 and the sacrificial pillar structures 11. In one embodiment, the sacrificial pillar structures 11 can be removed selective to the memory films 50. The second end surfaces of the vertical semiconductor channels 60 are physically exposed. The second end surfaces are vertically recessed toward the electrically conductive layers 46.

Figure 36:
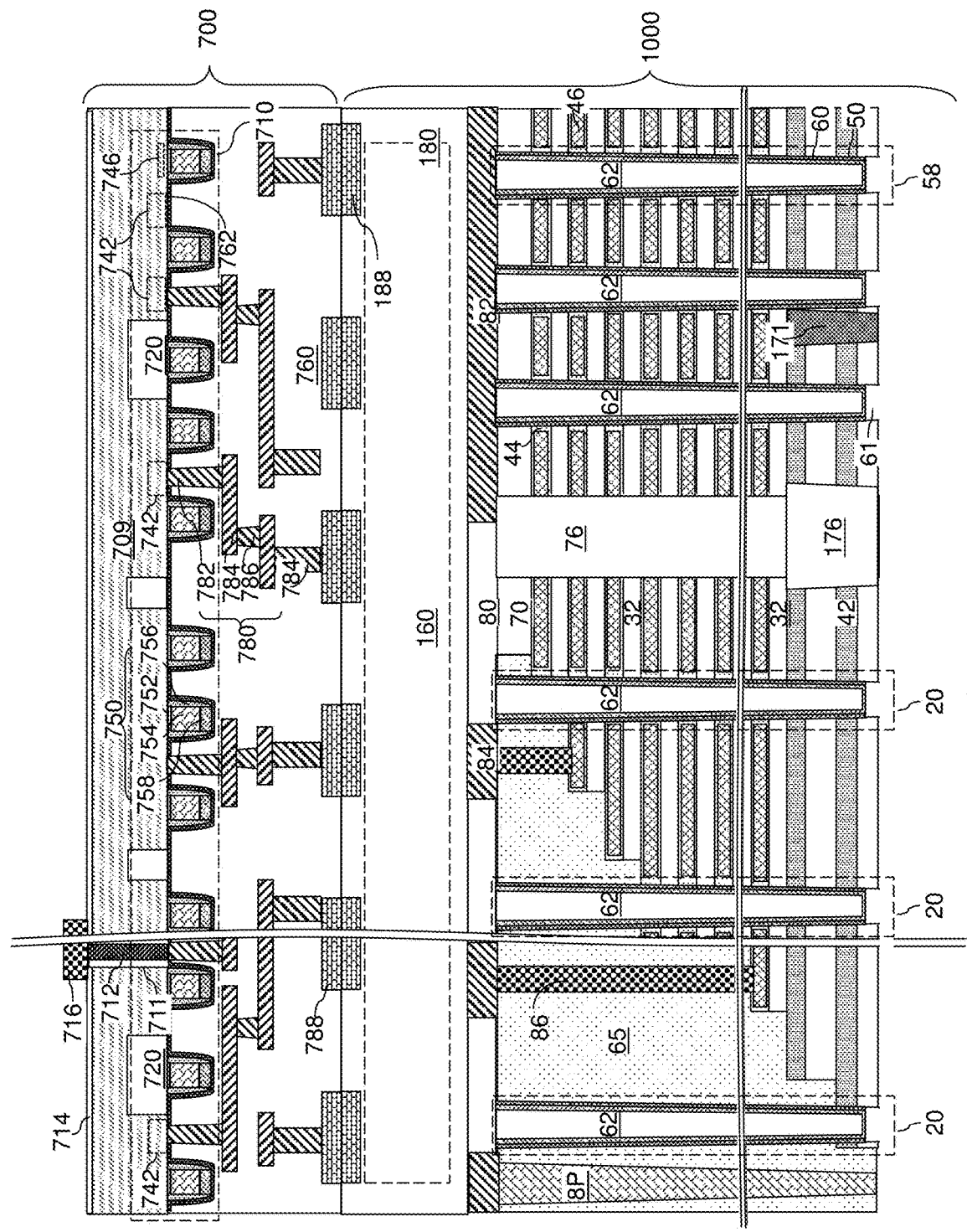
FIG. 36 is a schematic vertical cross-sectional view of the second exemplary structure after removal of sacrificial pillar structures according to the second embodiment of the present disclosure.

Referring to FIG. 36, the processing steps of FIG. 16 can be performed to remove physically exposed surface portions of the memory films 50. Planar surfaces of the vertical semiconductor channels 60 can be physically exposed.

Figure 37:
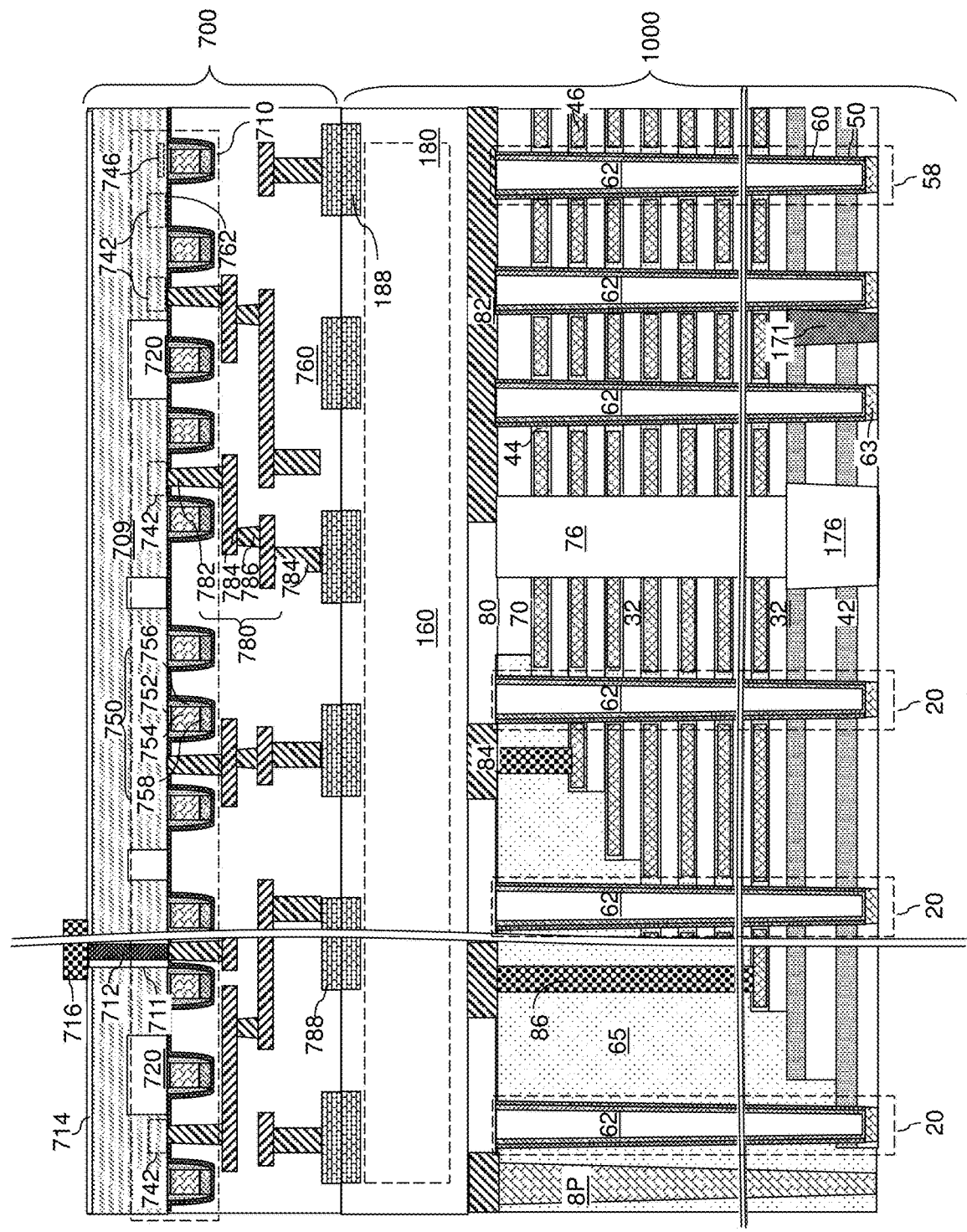
FIG. 37 is a schematic vertical cross-sectional view of the second exemplary structure after formation of drain regions according to the second embodiment of the present disclosure.

Referring to FIG. 37, the processing steps of FIG. 17 can be performed to form the drain regions 63. The drain regions 63 are formed on the second end surfaces of the vertical semiconductor channels 60. Each of the memory opening fill structures 58 comprises a drain region 63 contacting a respective one of the vertical semiconductor channels 60.

Figure 38:
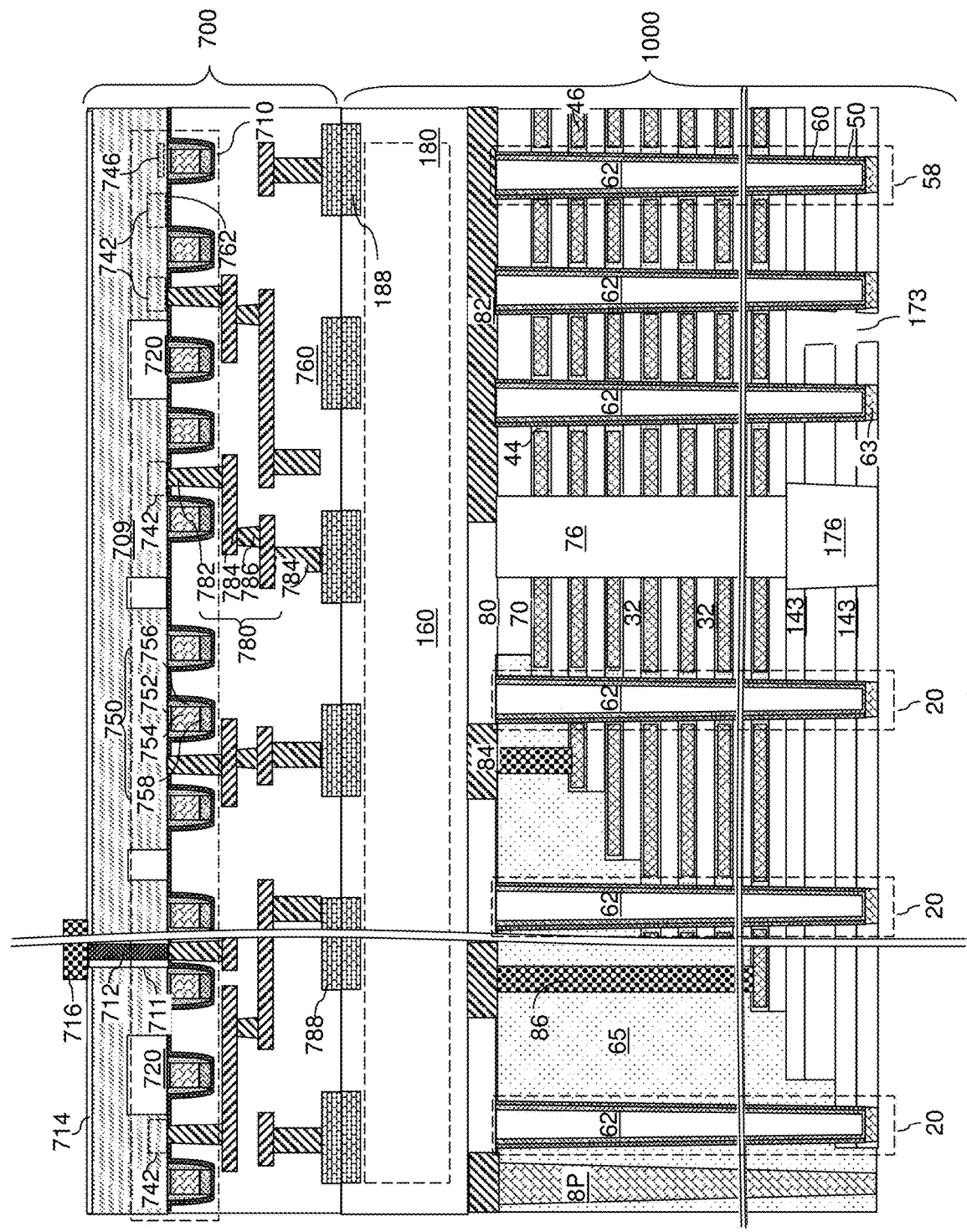
FIG. 38 is a schematic vertical cross-sectional view of the second exemplary structure after formation of drain-select-level isolation trenches and drain-select-level backside recesses according to the second embodiment of the present disclosure.

Referring to FIG. 38, an isotropic etch process can be performed to remove the materials of the drain-select-level sacrificial rail structures 171 and the first sacrificial material layers 42 selective to the first insulating layers 32 and the second insulating layers 32. In one embodiment, the first sacrificial material layers 42 and the drain-select-level sacrificial rail structures 171 can include silicon nitride, and the isotropic etch process can employ hot phosphoric acid. Drain-select-level isolation trenches 173 can be formed in volumes from which the drain-select-level sacrificial rail structures 171 are removed. Drain-select-level backside recesses 143 are formed in volumes from which the first sacrificial material layers 42.

Figure 39:
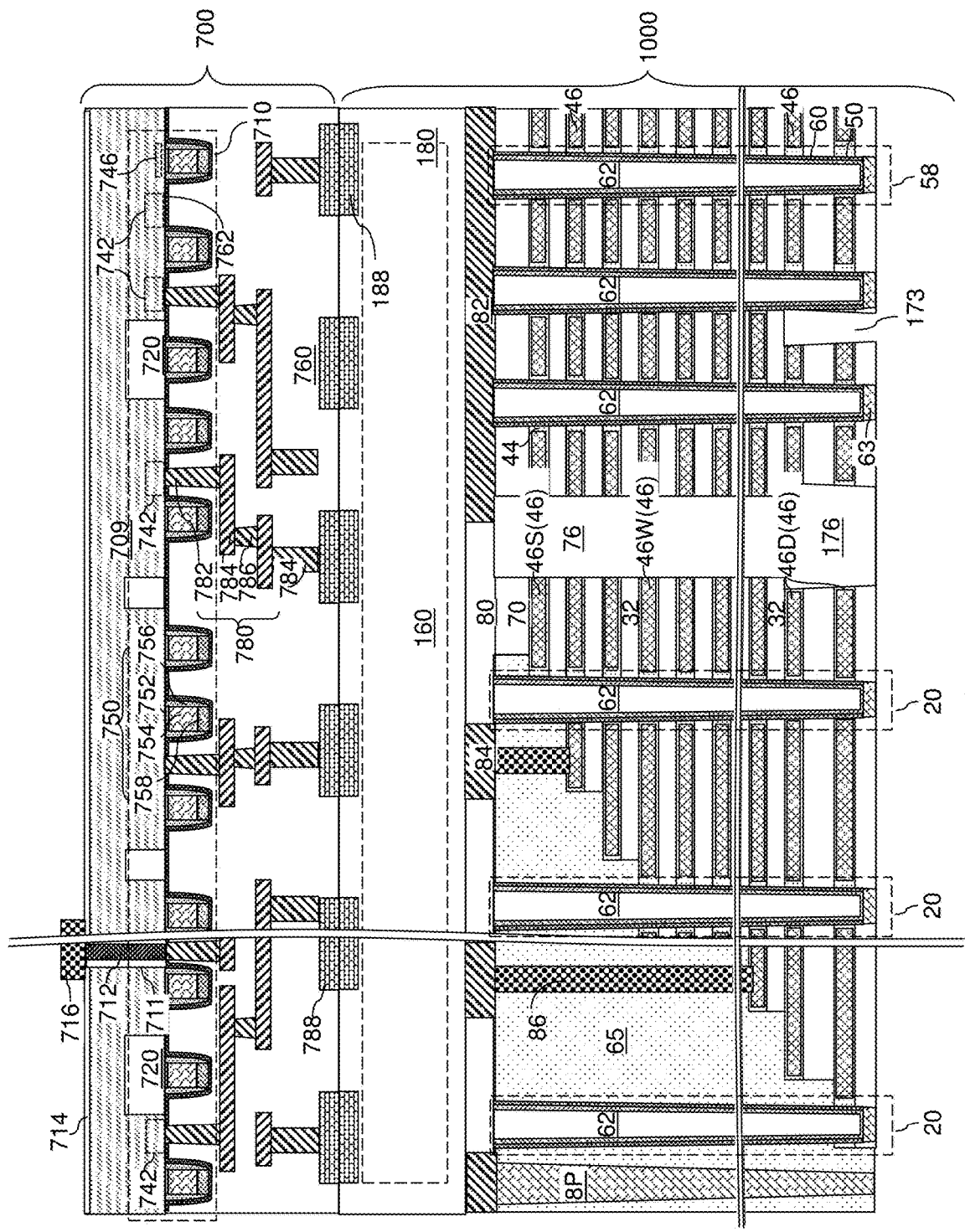
FIG. 39 is a schematic vertical cross-sectional view of the second exemplary structure after formation of drain side select gate electrodes according to the second embodiment of the present disclosure.

Referring to FIG. 39, at least one conductive material can be deposited in remaining volumes of the drain-select-level backside recesses 143. For example, the at least one conductive material may include a combination of a metallic barrier layer and a metallic fill material that are deposited by conformal deposition processes such as chemical vapor deposition processes. An anisotropic etch process can be performed to remove portions of the at least one conductive material from outside the drain-select-level backside recesses 143. Remaining portions of the at least one conductive material that fill the drain-select-level backside recesses 143 comprise drain side select gate electrodes 46D, which are a subset of electrically conductive layers 46.

Figure 40:
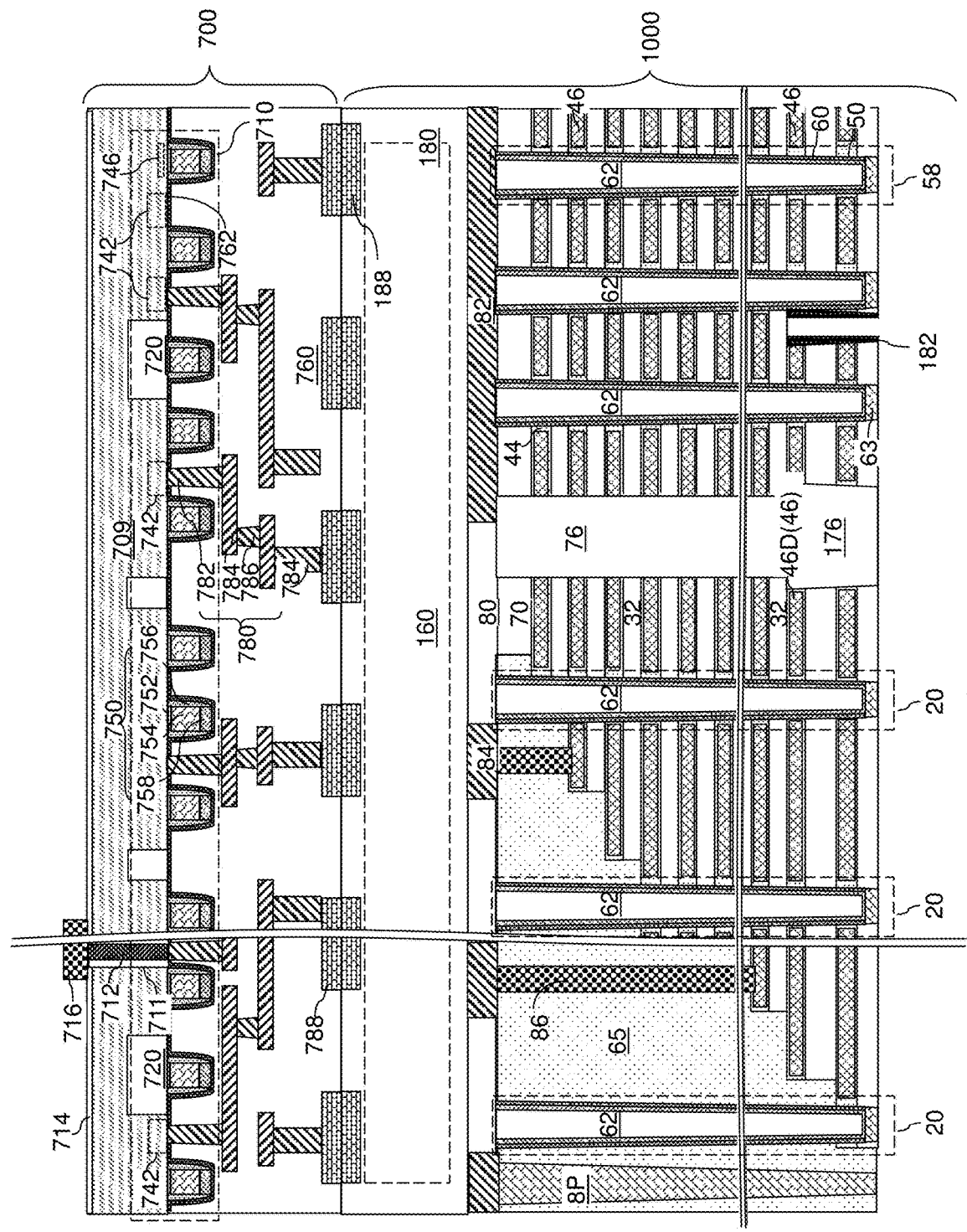
FIG. 40 is a schematic vertical cross-sectional view of the second exemplary structure after formation of drain-select-level conductive strips according to the second embodiment of the present disclosure.

Referring to FIG. 40, a metallic material such as TiN, TaN, or WN can be conformally deposited and can be subsequently anisotropically etched. Remaining portions of the metallic material located at a periphery of each drain-select-level isolation trenches 173 comprise drain-select-level conductive strips 182. Generally, at least one first sacrificial material layer 42 can be formed at the processing steps of FIG. 21, and at least one drain side select gate electrode 46D can be formed at the processing steps of FIG. 39. In one embodiment, at least two first sacrificial material layer 42 can be formed at the processing steps of FIG. 21, and at least two drain side select gate electrodes 46D can be formed at the processing steps of FIG. 39. In one embodiment, the drain-select-level conductive strips 182 can be formed on sidewalls of multiple drain side select gate electrodes 46D that are vertically spaced apart by the at least one first insulating layer 32. In one embodiment, the at least one drain side select gate electrode 46D comprises a plurality of drain side select gate electrodes 46D that are vertically spaced apart by a subset of the insulating layers 32.

Figure 41:
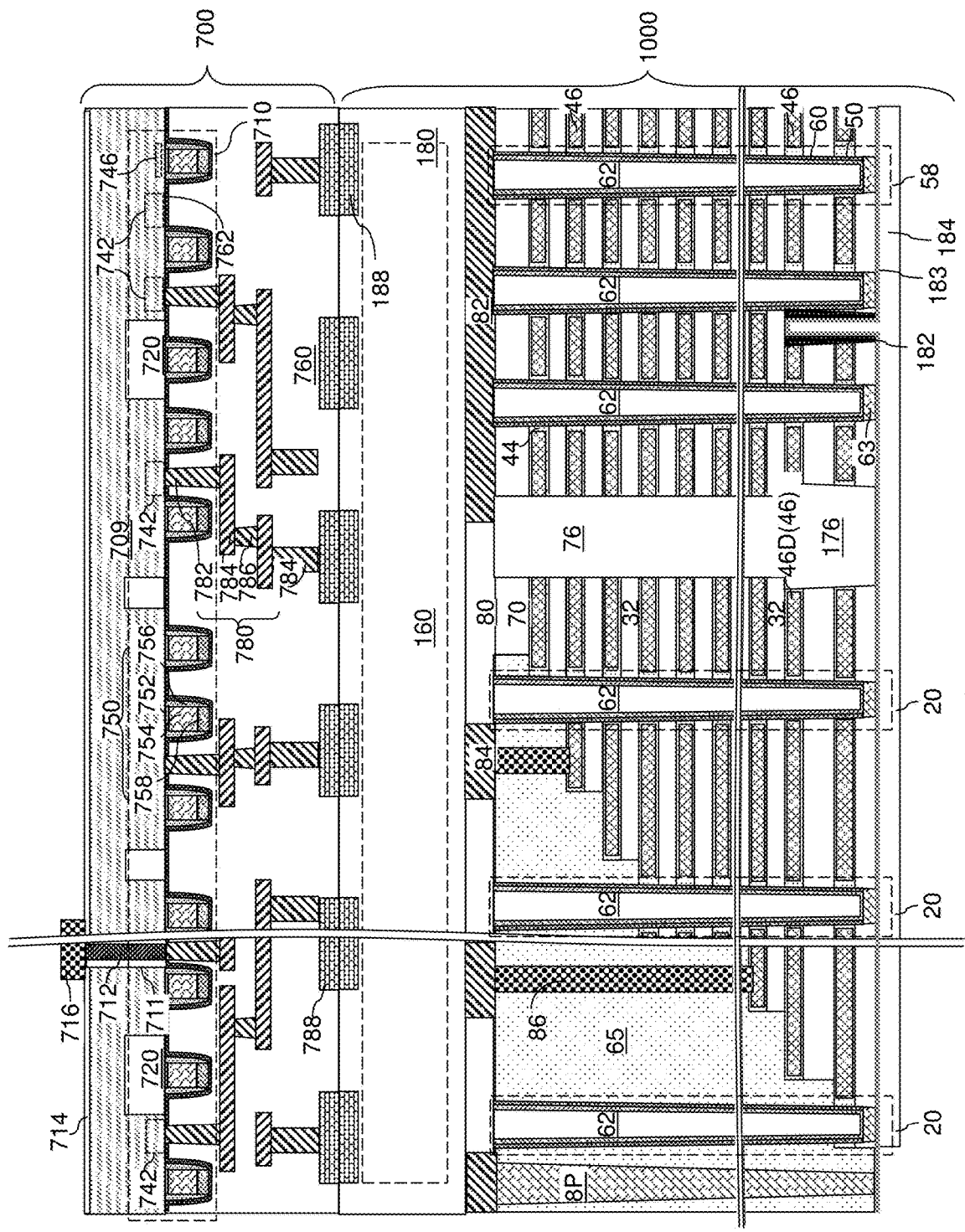
FIG. 41 is a schematic vertical cross-sectional view of the second exemplary structure after deposition of a dielectric fill material layer according to the second embodiment of the present disclosure.

Referring to FIG. 41, an optional dielectric liner 183 can be deposited by a conformal deposition process. In one embodiment, the dielectric liner 183 includes a dielectric metal oxide material, such as an aluminum oxide material. A dielectric fill material layer 184 including a dielectric material such as silicon oxide can be deposited over the dielectric liner 183.

Figure 42A:
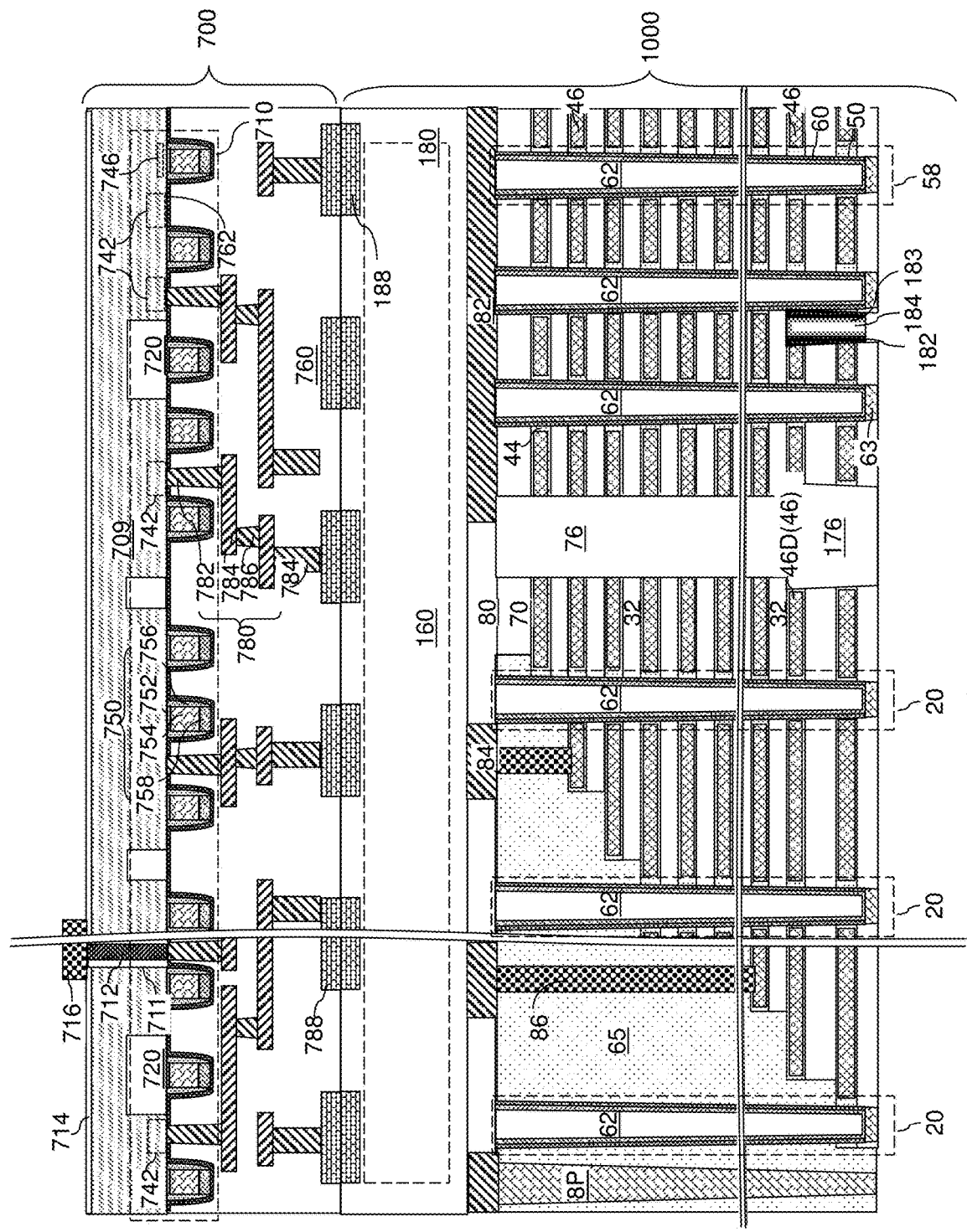
FIG. 42A is a schematic vertical cross-sectional view of the second exemplary structure after formation of drain-select-level isolation structures according to the second embodiment of the present disclosure.
Figure 42B:
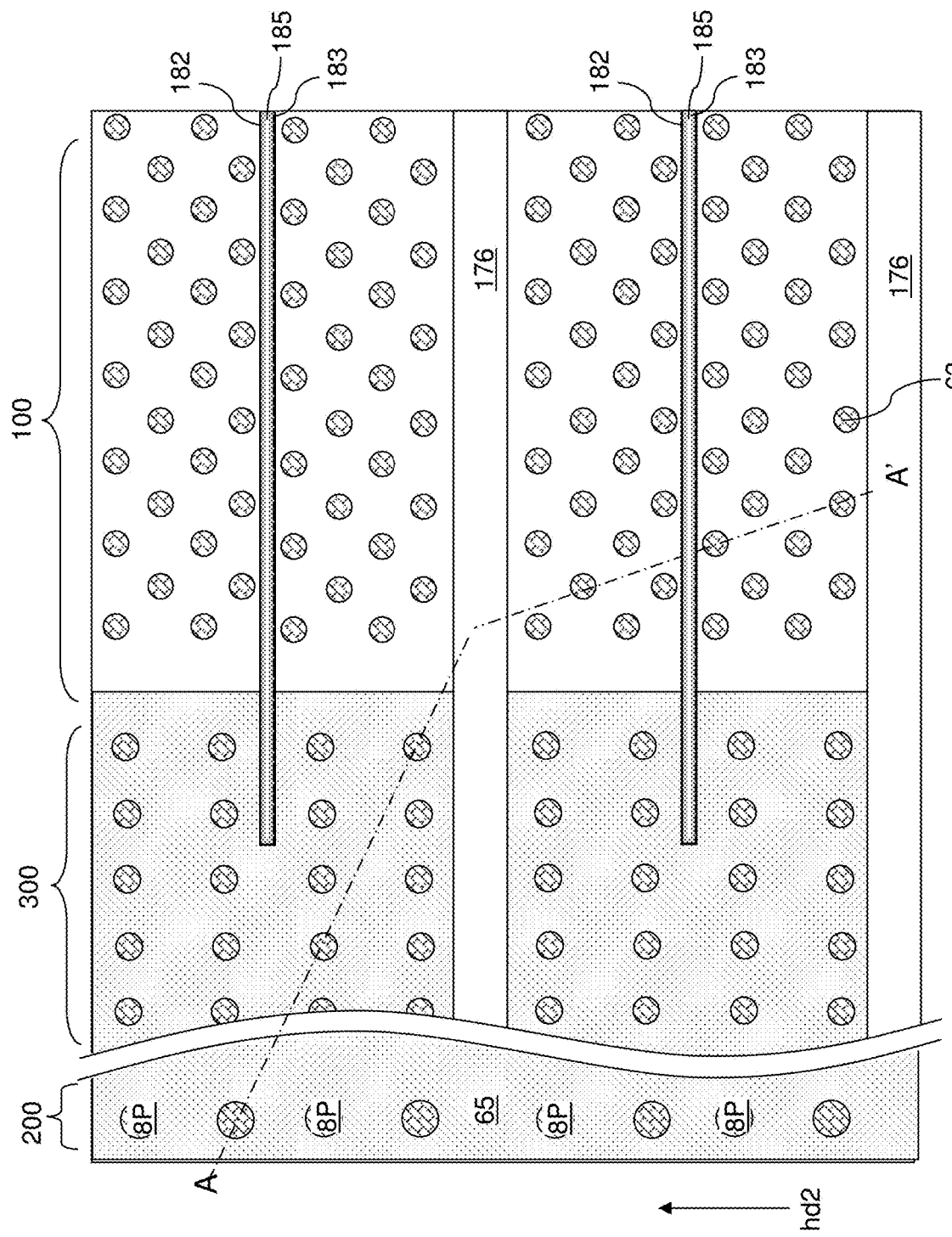
FIG. 42B is a top-down view of the second exemplary structure of FIG. 42A.

Referring to FIGS. 42A and 42B, horizontally extending portions of the dielectric fill material layer 184 and the dielectric liner 183 can be removed by a planarization process, which may employ a recess etch process and/or a chemical mechanical planarization process. Each remaining contiguous portions of the dielectric fill material layer 184 and the dielectric liner 183 that remain in a drain-select-level isolation trench 173 comprises a drain-select-level isolation structure (183, 184). Generally, the drain-select-level isolation structures (183, 184) vertically extend through the at least one drain side select gate electrode 46D, and are located between a respective pair of the backside dielectric rails 176. The drain-select-level conductive strips 182 contact a respective one of the drain-select-level isolation structures (183, 184), and electrically connect multiple drain side select gate electrodes 46D that are vertically spaced apart.

Figure 42C:
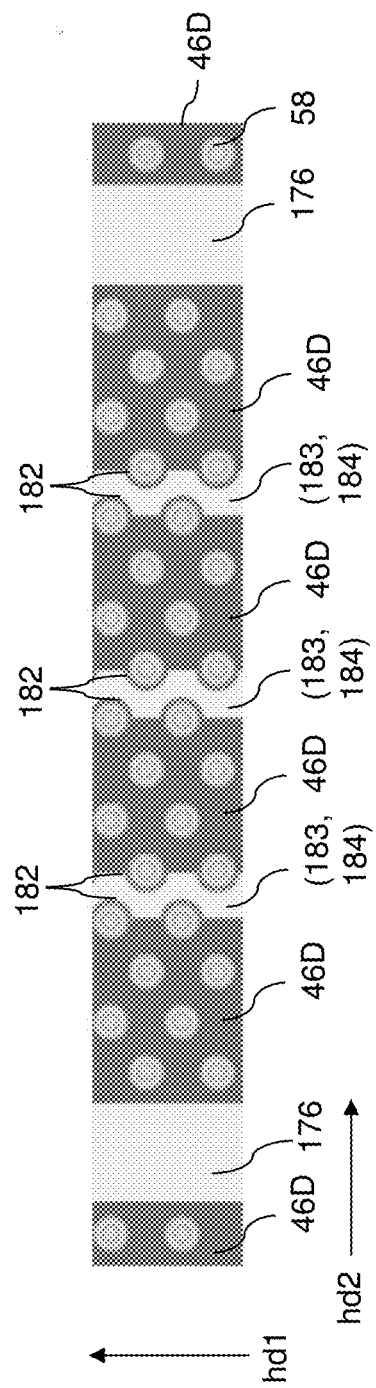
FIG. 42C is a schematic vertical cross-sectional view of an alternative configuration of the second exemplary structure across drain side select gate electrodes after formation of drain-select-level isolation structures according to an alternative configuration of the second embodiment of the present disclosure.

FIG. 42C is a schematic vertical cross-sectional view of an alternative configuration of the second exemplary structure across drain side select gate electrodes 46D after formation of drain-select-level isolation structures (183, 184) according to an alternative configuration of the second embodiment of the present disclosure.

As shown in FIGS. 42B and 42C, the drain-select-level isolation structure (183, 184) is formed on pitch with the rows of memory opening fill structures 58. Likewise, the drain side select gate electrodes 46D are formed on pitch with the word lines 46W and the memory opening fill structures 58. Therefore, dummy opening memory opening fill structures located below the drain-select-level isolation structures (183, 184) are not required. Likewise, extra space between rows of the memory opening fill structures 58 is not needed to accommodate the drain-select-level isolation structure (183, 184), since the drain-select-level isolation structure (183, 184) is located between the narrower, farther spaced apart lower portions of the memory openings 49 and the memory opening fill structures 58. This increases the number of active NAND strings and increases the active device density without unduly complicating the manufacturing process.

In the configuration of FIGS. 42A and 42B, there are two drain side select gate electrodes 46D and one drain-select-level isolation structure (183, 184) between each pair of neighboring backside dielectric rails 176 in each device level. In the alternative configuration of FIG. 42C, there are four drain side select gate electrodes 46D and three drain-select-level isolation structures (183, 184) between each pair of neighboring backside dielectric rails 176 in each device level. Thus, any suitable number of drain side select gate electrodes 46D and drain-select-level isolation structures (183, 184) may be formed between each pair of neighboring backside dielectric rails 176 in each device level.

Figure 43A:
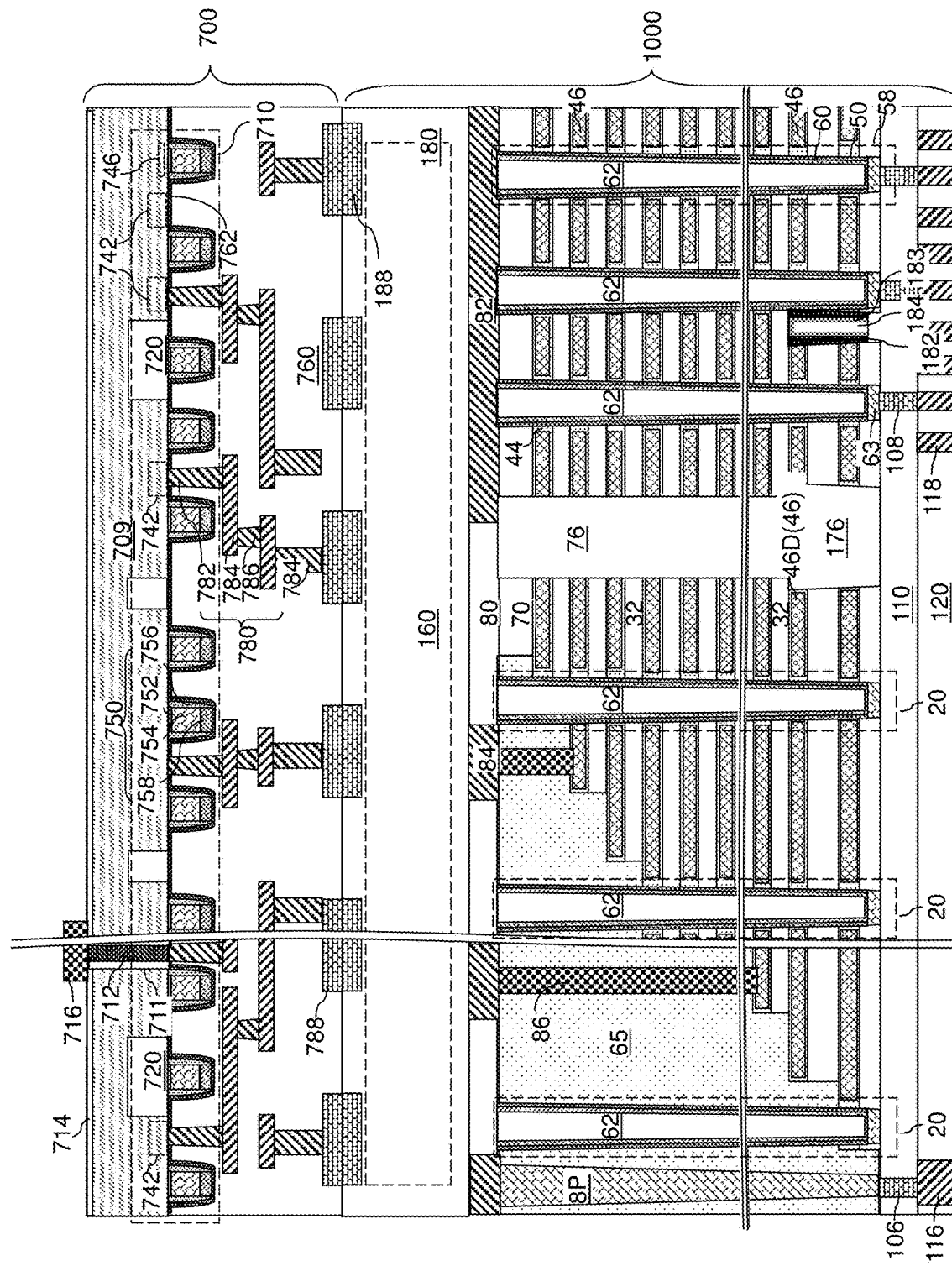
FIG. 43A is a schematic vertical cross-sectional view of the second exemplary structure after formation of bit-lines and backside metal interconnect structures according to the second embodiment of the present disclosure.
Figure 43B:
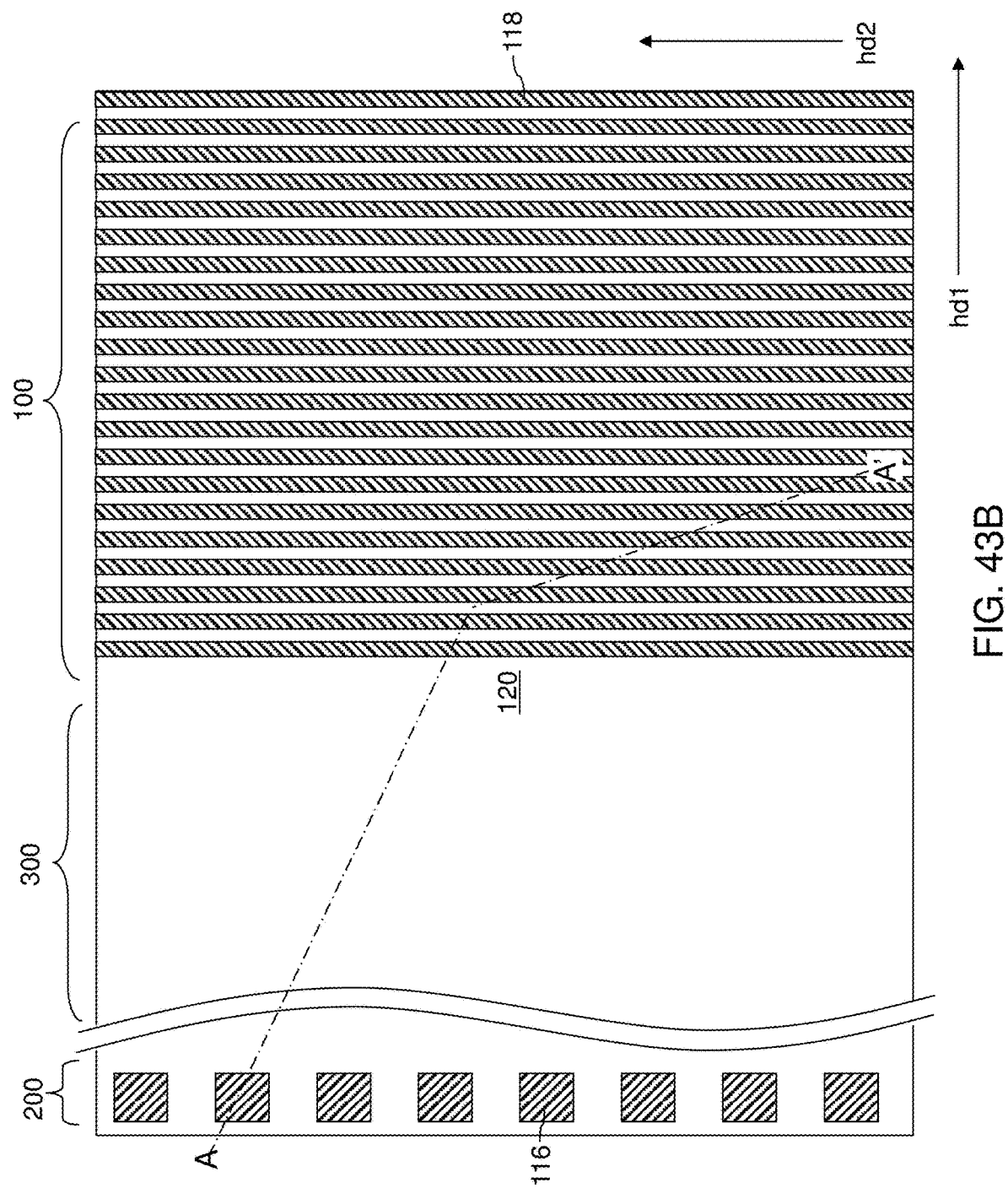
FIG. 43B is a bottom-up view of the second exemplary structure of FIG. 43A.

Referring to FIGS. 43A and 43B, the processing steps of FIGS. 20A and 20B can be performed to form a drain-side dielectric layer 110, drain contact via structures 108, backside interconnection via structures 106, a bit-line-level dielectric layer 120, bit lines 118, and drain contact via structures 108. The bit lines 118 are embedded in the bit-line-level dielectric layer 120, laterally extend along the second horizontal direction hd2, and are electrically connected to a respective subset of the drain contact via structures 108.

According to the second embodiment of the present disclosure, a three-dimensional memory device comprising a memory die 1000 is provided. The memory die 1000 comprises: an alternating stack of insulating layers 32 and electrically conductive layers 46 located between a drain-side dielectric layer 110 and a source-side dielectric layer 80, wherein the electrically conductive layers 46 comprise at least one drain side select gate electrode 46D, at least one source side select gate electrode 46S, and word lines 46W located between the at least one drain side select gate electrode and the at least one source side select gate electrode; backside trench fill structures 76 vertically extending through the word lines 46W, laterally extending along a first horizontal direction hd1, and laterally spaced apart along a second horizontal direction hd2; backside dielectric rails 176 vertically extending through the at least one drain side select gate electrode 46D and contacting, and overlying or underlying, a respective one of the backside trench fill structures 76; memory openings 49 vertically extending through the alternating stack (32, 46) between neighboring pairs of the backside trench fill structures 76 and between neighboring pairs of the backside dielectric rails 176; and memory opening fill structures located in the memory openings, wherein each of the memory opening fill structures 58 comprises a vertical semiconductor channel 60 and a vertical stack of memory elements located at levels of the word-line-level electrically conductive layers 46W.

In one embodiment, each of the memory openings 49 has a greater lateral dimension (e.g., diameter) at an interface with the source-side dielectric layer 80 than at an interface with the drain-side dielectric layer 110. In one embodiment, each of the backside dielectric rails 176 has a respective trapezoidal vertical cross-sectional profile within a vertical plane that is perpendicular to the first horizontal direction hd1, and has a greater width than the respective one of the backside trench fill structures 76. In one embodiment, each of the backside dielectric rails 176 has a lesser width within an horizontal plane including an interface with the drain-side dielectric layer 110 than within a horizontal plane including an interface with the respective one of the backside trench fill structures 76.

In one embodiment, the memory die 1000 comprises drain-select-level isolation structures (813, 184) vertically extending through the at least one drain side select gate electrode 46D, located between a respective pair of the backside dielectric rails 176, and contacting the drain-side dielectric layer 110. In one embodiment, the at least one drain side select gate electrode 46D comprises a plurality of drain side select gate electrodes 46D that are vertically spaced apart by a subset of the insulating layers 32; and the memory die 1000 comprises drain-select-level conductive strips 182 contacting a respective one of the drain-select-level isolation structures (183, 184) and electrically connecting multiple drain side select gate electrodes 46D that are vertically spaced apart.

In one embodiment, each of the memory opening fill structures 58 comprises a drain region 63 contacting a respective one of the vertical semiconductor channels 60. In one embodiment, the memory die 1000 comprises drain contact via structures 108 embedded in the drain-side dielectric layer 110 and contacting a respective one of the drain regions 63. In one embodiment, the memory die 1000 comprises bit lines 118 embedded in a bit-line-level dielectric layer 120, laterally extending along the second horizontal direction hd2, and electrically connected to a respective subset of the drain contact via structures 108.

In one embodiment, the memory die 1000 comprises a source layer 82 contacting end surfaces of the vertical semiconductor channels 60 and embedded in the source-side dielectric layer 80. In one embodiment, the memory die 1000 comprises memory-side dielectric material layers 160 embedding memory-side metal interconnect structures 180 and located on the source-side dielectric layer 80. In one embodiment, the three-dimensional memory device can comprise a logic die 700 including a peripheral circuit bonded to a source-side dielectric layer side of the memory die 1000.

In one embodiment, each of the memory opening fill structures 58 comprises a memory film including a layer stack that comprises a tunneling dielectric layer 56 and a charge storage layer 54; and each of the vertical stacks of memory elements comprises portions of a respective one of the charge storage layers 54 that are located at levels of the word-line-level electrically conductive layers 46W.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising a memory die, wherein the memory die comprises:

an alternating stack of insulating layers and electrically conductive layers located between a drain-side dielectric layer and a source-side dielectric layer, wherein the electrically conductive layers comprise at least one drain side select gate electrode, at least one source side select gate electrode, and word lines located between the at least one drain side select gate electrode and the at least one source side select gate electrode;

backside trench fill structures vertically extending through the word lines, laterally extending along a first horizontal direction, and laterally spaced apart along a second horizontal direction;

backside dielectric rails vertically extending through the at least one drain side select gate electrode and contacting, and overlying or underlying, a respective one of the backside trench fill structures;

memory openings vertically extending through the alternating stack between neighboring pairs of the backside trench fill structures and between neighboring pairs of the backside dielectric rails; and memory opening fill structures located in the memory openings, wherein each of the memory opening fill structures comprises a vertical semiconductor channel and a vertical stack of memory elements located at the word lines of the electrically conductive layers, wherein each of the backside dielectric rails has a respective trapezoidal vertical cross-sectional profile within a vertical plane that is perpendicular to the first horizontal direction, and has a greater width than the respective one of the backside trench fill structures.

2. The three-dimensional memory device of claim 1, wherein each of the memory openings has a greater lateral dimension at an interface with the source-side dielectric layer than at an interface with the drain-side dielectric layer.

3. The three-dimensional memory device of claim 1, wherein each of the backside dielectric rails has a lesser width within a horizontal plane including an interface with the drain-side dielectric layer than within a horizontal plane including an interface with the respective one of the backside trench fill structures.

4. The three-dimensional memory device of claim 1, wherein the memory die further comprises drain-select-level isolation structures vertically extending through the at least one drain side select gate electrode, located between a respective pair of the backside dielectric rails, and contacting the drain-side dielectric layer.

5. The three-dimensional memory device of claim 4, wherein:

the at least one drain side select gate electrode comprises a plurality of drain side select gate electrodes that are vertically spaced apart by a subset of the insulating layers; and the memory die further comprises drain-select-level conductive strips contacting a respective one of the drain-select-level isolation structures and electrically connecting multiple drain side select gate electrodes that are vertically spaced apart.

6. The three-dimensional memory device of claim 1, wherein each of the memory opening fill structures further comprises a drain region contacting a respective one of the vertical semiconductor channels.

7. The three-dimensional memory device of claim 6, wherein the memory die further comprises drain contact via structures embedded in the drain-side dielectric layer and contacting a respective one of the drain regions.

8. The three-dimensional memory device of claim 7, wherein the memory die further comprises bit lines embedded in a bit-line-level dielectric layer, laterally extending along the second horizontal direction, and electrically connected to a respective subset of the drain contact via structures.

9. The three-dimensional memory device of claim 1, wherein the memory die further comprises a source layer contacting end surfaces of the vertical semiconductor channels and embedded in the source-side dielectric layer.

10. The three-dimensional memory device of claim 9, wherein the memory die further comprises memory-side dielectric material layers embedding memory-side metal interconnect structures and located on the source-side dielectric layer.

11. The three-dimensional memory device of claim 1, further comprising a logic die including a peripheral circuit and bonded to a source-side dielectric layer side of the memory die.

12. The three-dimensional memory device of claim 1, wherein:
    each of the memory opening fill structures comprises a memory film including a layer stack that comprises a tunneling dielectric layer and a charge storage layer; and
    each of the vertical stacks of memory elements comprises portions of a respective one of charge storage layers that are located at levels of the word-line-level electrically conductive layers.

13. A method of forming a semiconductor structure, comprising:
    forming a first layer stack including at least one first insulating layer and at least one first sacrificial material layer over a substrate;
    forming backside dielectric rails vertically extending through the at least one first insulating layer and the at least one first sacrificial material layer;
    forming a second layer stack including second insulating layers and second sacrificial material layers over the first layer stack;
    forming memory openings through the second layer stack and the first layer stack;
    forming memory opening fill structures in the memory openings, wherein each of the memory opening fill structures comprises a memory film and a vertical semiconductor channel;
    replacing the second sacrificial material layers with word lines and at least one source side select gate electrode;
    removing the substrate selective to the first layer stack;
    replacing the at least one first sacrificial material layer with at least one drain side select gate electrode;
    forming a source layer on first end surfaces of the vertical semiconductor channels over an alternating stack of the second insulating layers and the word lines of the electrically conductive layers;
    forming at least one memory-side dielectric material layer embedding memory-side metal interconnect structures and memory-side bonding pads over the source layer to provide a memory die; and
    bonding a logic die comprising a peripheral circuit to a memory-side dielectric material layer side of the memory die, wherein the step of removing substrate occurs after bonding the logic die to the memory die.

14. A method of forming a semiconductor structure, comprising:
    forming a first layer stack including at least one first insulating layer and at least one first sacrificial material layer over a substrate;
    forming backside dielectric rails vertically extending through the at least one first insulating layer and the at least one first sacrificial material layer;
    forming a second layer stack including second insulating layers and second sacrificial material layers over the first layer stack;
    forming memory openings through the second layer stack and the first layer stack;
    forming memory opening fill structures in the memory openings, wherein each of the memory opening fill structures comprises a memory film and a vertical semiconductor channel;
    replacing the second sacrificial material layers with word lines and at least one source side select gate electrode;
    removing the substrate selective to the first layer stack;
    replacing the at least one first sacrificial material layer with at least one drain side select gate electrode;
    forming backside trenches through the second layer stack, wherein a surface of a respective one of the backside dielectric rails is physically exposed at a bottom of each of the backside trenches;
    forming backside recesses by removing the second sacrificial material layers selective to the second insulating layers by providing an isotropic etchant into the backside trenches; and
    depositing at least one conductive material in the backside recesses to form the word lines and the at least one source side select gate electrode.

15. A method of forming a semiconductor structure, comprising:
    forming a first layer stack including at least one first insulating layer and at least one first sacrificial material layer over a substrate;
    forming backside dielectric rails vertically extending through the at least one first insulating layer and the at least one first sacrificial material layer;
    forming a second layer stack including second insulating layers and second sacrificial material layers over the first layer stack;
    forming memory openings through the second layer stack and the first layer stack;
    forming memory opening fill structures in the memory openings, wherein each of the memory opening fill structures comprises a memory film and a vertical semiconductor channel;
    replacing the second sacrificial material layers with word lines and at least one source side select gate electrode;
    removing the substrate selective to the first layer stack;
    replacing the at least one first sacrificial material layer with at least one drain side select gate electrode;
    forming drain-select-level sacrificial rail structures through the first layer stack, wherein the second layer stack is formed on the drain-select-level sacrificial rail structures;
    forming drain-select-level isolation trenches by removing the drain-select-level sacrificial rail structures selective to the at least one first insulating layer; and
    forming drain-select-level isolation structures and drain-select-level conductive strips in the drain-select-level isolation trenches.

* * * * *